(12) United States Patent
Wang et al.

(10) Patent No.: US 7,897,413 B2
(45) Date of Patent: Mar. 1, 2011

(54) METHODS OF MAKING A FERROELECTRIC MEMORY DEVICE HAVING IMPROVED INTERFACIAL CHARACTERISTICS

(75) Inventors: Wensheng Wang, Kawasaki (JP); Yoshimasa Horii, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 125 days.

(21) Appl. No.: 11/938,956

(22) Filed: Nov. 13, 2007

(65) Prior Publication Data

US 2008/0261332 A1 Oct. 23, 2008

(30) Foreign Application Priority Data

Nov. 14, 2006 (JP) .................................. 2006-308160

(51) Int. Cl.
*H01L 21/00* (2006.01)
*H01L 21/8242* (2006.01)
*H01L 21/02* (2006.01)
*H01L 27/108* (2006.01)
*H01L 29/94* (2006.01)

(52) U.S. Cl. ............. 438/3; 438/253; 438/256; 257/295; 257/306

(58) Field of Classification Search ....... 438/3; 257/295
See application file for complete search history.

(56) References Cited

U.S. PATENT DOCUMENTS

| | | | |
|---|---|---|---|
| 6,146,906 A | 11/2000 | Inoue et al. | |
| 6,203,608 B1 | 3/2001 | Sun et al. | |
| 6,531,726 B1 | 3/2003 | Takamatsu | |
| 6,855,974 B2 * | 2/2005 | Matsuura et al. | 257/295 |
| 6,887,716 B2 | 5/2005 | Fox et al. | |
| 7,078,242 B2 | 7/2006 | Matsuura et al. | |
| 2005/0136556 A1 * | 6/2005 | Matsuura et al. | 438/3 |
| 2005/0233476 A1 * | 10/2005 | Tatsunari | 438/3 |
| 2005/0244988 A1 * | 11/2005 | Wang et al. | 438/3 |
| 2006/0043445 A1 * | 3/2006 | Wang | 257/295 |
| 2006/0073613 A1 * | 4/2006 | Aggarwal et al. | 438/3 |
| 2006/0183250 A1 * | 8/2006 | Choi et al. | 438/3 |

FOREIGN PATENT DOCUMENTS

| | | |
|---|---|---|
| JP | 11-292626 A | 10/1999 |
| JP | 2000-91270 A | 3/2000 |
| JP | 2001-127262 A | 5/2001 |
| JP | 2002-246564 A | 8/2002 |
| JP | 2005-183842 A | 7/2005 |
| JP | 2006-73648 A | 3/2006 |

OTHER PUBLICATIONS

Takashi Nakamura et al; "Preparation of Pb(Zr,Ti)O3 thin films on electrodes including IrO2," Appl. Phys. Lett. 65; Sep. 19, 1994; pp. 1522-1524.

* cited by examiner

*Primary Examiner* — N Drew Richards
*Assistant Examiner* — Michael Jung
(74) *Attorney, Agent, or Firm* — Westerman, Hattori, Daniels & Adrian, LLP

(57) ABSTRACT

The present invention provides a method for manufacturing a semiconductor device, including the steps of: forming a ferroelectric film on a first conductive film by a sol-gel method; forming a first conductive metal oxide film on the ferroelectric film; carrying out a first annealing on the first conductive metal oxide film; forming a second conductive metal oxide film on the first conductive metal oxide film, so that the first and second conductive films serve as a second conductive film; and forming a capacitor by patterning the first conductive film, the ferroelectric film and the second conductive film. In the step of forming the first conductive metal oxide film, ferroelectric characteristics are adjusted with a flow rate ratio of oxygen by utilizing the fact that the ferroelectric characteristics of the ferroelectric film improve as the flow rate ratio of oxygen in a sputtering gas increases.

18 Claims, 38 Drawing Sheets

50nm

100nm

METHODS OF MAKING A FERROELECTRIC MEMORY DEVICE HAVING IMPROVED INTERFACIAL CHARACTERISTICS

CROSS-REFERENCE TO RELATED APPLICATIONS

This application is based on and claims priority of Japanese Patent Application No. 2006-308160 filed on Nov. 14, 2006, the entire contents of which are incorporated herein by reference.

TECHNICAL FIELD

The present invention relates to a method for manufacturing a semiconductor device.

BACKGROUND

Recently, nonvolatile memories capable of storing a large volume of data at a high speed have been developed along with the development of digital technologies.

A flash memory and a ferroelectric memory are well-known as such nonvolatile memories.

Among these nonvolatile memories, the flash memory includes a floating gate embedded in a gate insulating film of an insulated-gate field-effect transistor (IGFET), and stores information by accumulating electric charges indicating recording information, in the floating gate. However, there is a drawback that a relatively high voltage needs to be provided to such a flash memory since it is necessary to flow a tunnel current to the gate insulating film of the flash memory at the time of writing and erasing the information.

In contrast, the ferroelectric memory, which is also referred to as a ferroelectric random access memory (FeRAM), stores information by utilizing the hysteresis characteristic of a ferroelectric film provided to a ferroelectric capacitor. The ferroelectric film causes polarization in response to a voltage applied between upper and lower electrodes of the capacitor, and spontaneous polarization remains even after the voltage is removed. When the polarity of the applied voltage is reversed, the polarity of the spontaneous polarization is also reversed. By causing directions of the polarity to correspond respectively to "1" and "0," the information is written in the ferroelectric film. Advantages of the FeRAM are that the voltage required for writing in the FeRAM is lower than that required for writing in the flash memory, and that it is possible to write information in the FeRAM at a higher speed than that of the flash memory. A system on chip (SOC), on which a FeRAM and a logic circuit are mixedly mounted, has been examined to be used for an IC card and the like by utilizing the above advantages.

A capacitor dielectric film provided to the ferroelectric capacitor is formed of, for example, a PZT (Lead Zirconate Titanate: $PbZrTiO_3$) film. There are various kinds of methods for forming the capacitor dielectric film.

For example, in Japanese Patent Application Laid-open Publication No. Hei 11-292626, the PZT film is formed by a sol-gel method using a solution in which an organometallic compound is dissolved in an organic solvent such as butanol. The sol-gel method has an advantage that costs for forming a film is lower than those in a case of a sputtering method, a MOCVD method or the like. Hence, the sol-gel method has been widely studied and developed.

On the other hand, as described in APPL. Phys. Lett. 65, P. 1522 (1994), iridium oxide films are often formed as the upper and lower electrodes of the ferroelectric capacitor. According to APPL. Phys. Lett. 65, P. 1522 (1994), in the case where the PZT films are used as the capacitor dielectric films, fatigue of the ferroelectric capacitor can be suppressed, and thus preferable capacitance characteristics can be secured, by forming the upper and lower electrodes of iridium oxide.

However, it is known that huge crystals formed of abnormally-grown iridium oxide are easily generated on a surface of an iridium oxide film. The huge crystals deteriorate electric characteristics of the ferroelectric capacitor, and this may finally cause a decrease in yield of semiconductor devices.

To solve such a problem, in Japanese Patent Application Laid-open Publication No. 2001-127262, a two-step sputtering method is used to suppress generation of the aforementioned huge crystals. Two-step sputtering method includes the first step of forming a film with low sputtering power, and the second step of growing the film with high sputtering power, and these two steps are sequentially carried out. (paragraph 0025).

In Japanese Patent Application Laid-open Publication No. 2000-91270 (JP No. 2000-91270 A), a laminated film which is configured by forming an iridium oxide film and an iridium film in this order, is used as an upper electrode. According to JP No. 2000-91270 A, the iridium oxide film of the lower layer prevents deterioration of capacitance characteristics, and the iridium film of the upper layer reduces resistance of the upper electrode (paragraph 0027).

In Japanese Patent Application Laid-open Publication No. 2002-246564, a PZT film formed by a sputtering method is crystallized by performing the first annealing for the PZT film (paragraph 0035). Then, after an upper electrode made of iridium oxide is formed on the PZT film, the second annealing is carried out on the upper electrode (paragraph 0038).

In Japanese Patent Application Laid-open Publication No. 2005-183842, a laminated film formed of first and second conductive metal oxide films, both of which are formed of iridium oxide, is used as an upper electrode (paragraph 0035 to 0037).

Similarly, in Japanese Patent Application Laid-open Publication No. 2006-73648, a two-layered iridium oxide film is formed as an upper electrode (paragraph 0033).

SUMMARY

According to one aspect of the present invention, there is provided a method for manufacturing a semiconductor device, having the steps of forming a first interlayer insulating film over a semiconductor substrate; forming a first conductive film on the first interlayer insulating film; forming a ferroelectric film on the first conductive film by a film-forming method which includes film forming step using any one of a sol-gel method, a metalorganic decomposition method and a CSD method; forming a first conductive metal oxide film on the ferroelectric film by a sputtering method using a sputtering gas containing oxygen, the flow rate ratio of the oxygen is set to be equal to or greater than 20% and smaller than 50%, where the first conductive metal oxide film being crystallized while being formed; carrying out a first annealing on the first conductive metal oxide film in an atmosphere containing an oxidizing gas; forming a second conductive metal oxide film on the first conductive metal oxide film, so that the second conductive metal oxide film and the first conductive metal oxide film are used, in combination, as a second conductive film; and forming a capacitor including a lower electrode, a capacitor dielectric film and an upper electrode by patterning the first conductive film, the ferroelectric film and the second conductive film.

DETAILED DESCRIPTION OF THE EMBODIMENTS

(1) First Embodiment

Figure 1A:
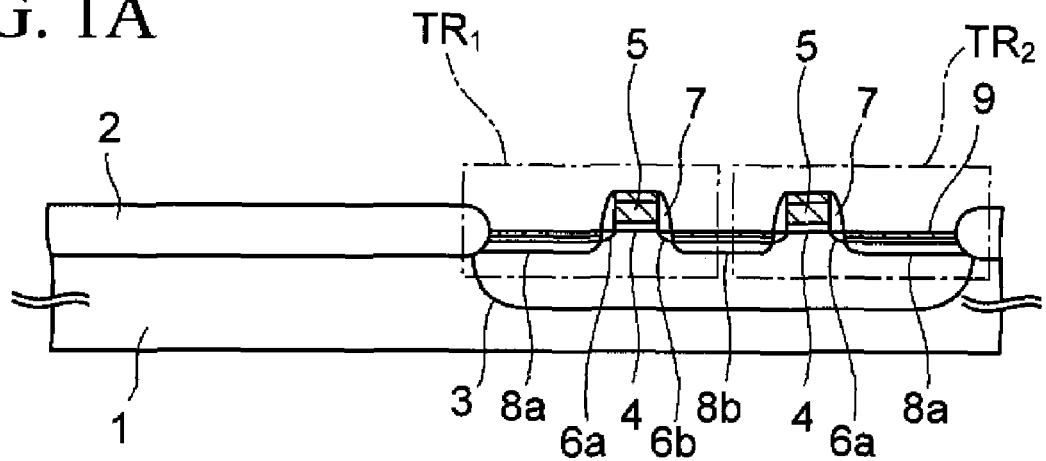
FIGS. 1A to 1O are cross-sectional views showing processes of manufacturing a semiconductor device according to a first embodiment of the present invention.

FIGS. 1A to 1O are cross-sectional views showing processes of manufacturing a semiconductor device according to a first embodiment of the present invention.

Firstly, steps for obtaining a cross-sectional structure shown in FIG. 1A will be described.

A device isolation insulating film 2 is formed by thermally oxidizing a surface of an n-type or a p-type silicon (semiconductor) substrate 1, and an active region of a transistor is defined by the device isolation insulating film 2. Such a device isolation structure is referred to as local oxidation of silicon (LOCOS). However, instead of this structure, shallow trench isolation (STI) may be used.

Next, after introducing p-type impurities, such as boron, into the active region of the silicon substrate 1 to form a p-well 3, a thermal oxidation film to be a gate insulating film 4 is formed with a thickness of approximately 6 to 7 nm by thermally oxidizing the surface of the active region.

Next, an amorphous silicon film with a thickness of approximately 50 nm and a tungsten silicide film with a thickness of approximately 150 nm are sequentially formed on an entire upper surface of the silicon substrate 1. Instead of the amorphous silicon film, a polysilicon film may be formed. After that, these films are patterned by photolithography to form a gate electrode 5 on the silicon substrate 1.

Two of the gate electrodes 5 are formed parallel to each other on the p-well 3, and each of the two gate electrodes 5 forms a part of a word line.

Next, phosphorus as n-type impurities is introduced into a portion of the silicon substrate 1 beside the gate electrodes 5 by ion implantation using the gate electrodes 5 as a mask. Thereby, first and second source/drain extensions 6a and 6b are formed.

After that, an insulating film is formed on the entire upper surface of the silicon substrate 1, and the insulating film is etched back to be left as insulating sidewalls 7 beside the gate electrodes 5. As for the insulating film, for example, a silicon oxide film is formed by a chemical vapor deposition (CVD) method.

Subsequently, by carrying out again the ion implantation to introduce n-type impurities, such as arsenic, into the silicon substrate 1 while using the insulating sidewalls 7 and the gate electrodes 5 as a mask, first and second source/drain regions (first and second impurity diffusion regions) 8a and 8b are formed on the silicon substrate 1 at the sides of the gate electrodes 5.

Furthermore, a refractory metal film, such as a cobalt film, is formed by a sputtering method on the entire upper surface of the silicon substrate 1. Then, the refractory metal film is heated, and thereby caused to react with silicon. Accordingly, a refractory metal silicide layer 9, such as a cobalt silicide layer, is formed in the first and second source/drain regions 8a and 8b on the silicon substrate 1. Thereby, each of the first and second source/drain regions 8a and 8b is caused to have low resistance.

Thereafter, the refractory metal layer left unreacted on the device isolation insulating film 2 and the like is removed by wet etching.

With the steps described so far, first and second MOS transistors $TR_1$, and $TR_2$ formed of the gate insulating films 4, the gate electrodes 5, the first and second source/drain regions 8a and 8b, and the like, are formed in the active region of the silicon substrate.

Figure 1B:
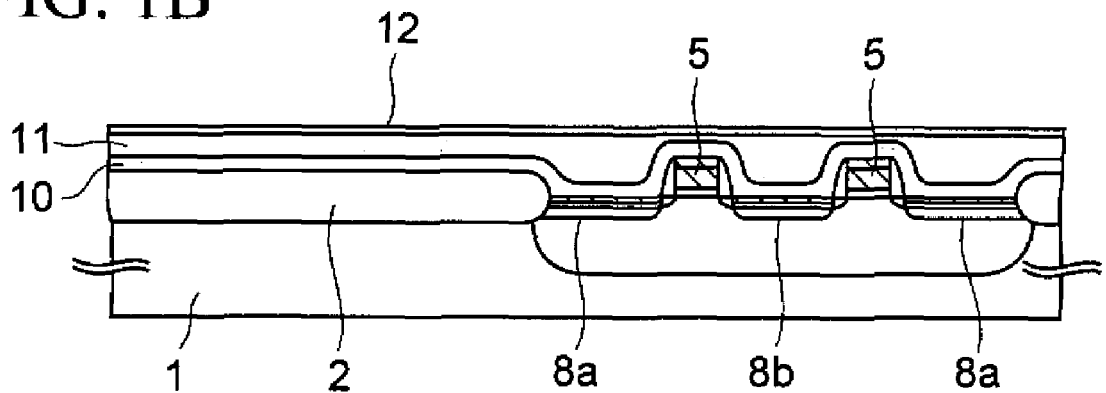

Next, as shown in FIG. 1B, a silicon oxynitride (SiON) film is formed with a thickness of approximately 200 nm on the entire upper surface of the silicon substrate 1 by a plasma CVD method. The silicon oxynitride film is used as a cover insulating film 10.

Furthermore, a silicon oxide ($SiO_2$) film is formed as a first interlayer insulating film 11 with a thickness of approximately 600 nm on the cover insulating film 10, by the plasma CVD method using a TEOS (tetra ethoxy silane) gas. When the first interlayer insulating film 11 is formed, hydrogen degradation in the gate insulating films 4 is prevented by the cover insulating film 10.

Thereafter, approximately 20 nm of the first interlayer insulating film 11 is polished by using a chemical mechanical polishing (CMP) method to planarize the upper surface of the first interlayer insulating film 11.

Subsequently, annealing with a substrate temperature of 650° C. is carried out on the first interlayer insulating film 11 for 30 minutes so as to degas the first interlayer insulating film 11.

Moreover, by use of the sputtering method, an alumina ($Al_2O_3$) film is formed with a thickness of about 20 nm on the first interlayer insulating film 11 as a lower electrode adhesion film 12. In place of the alumina film, a titanium film or a titanium oxide film may be formed as the lower electrode adhesion film 12. Of these two films, the titanium film can be formed by setting a substrate temperature to be 150° C.

Figure 1C:
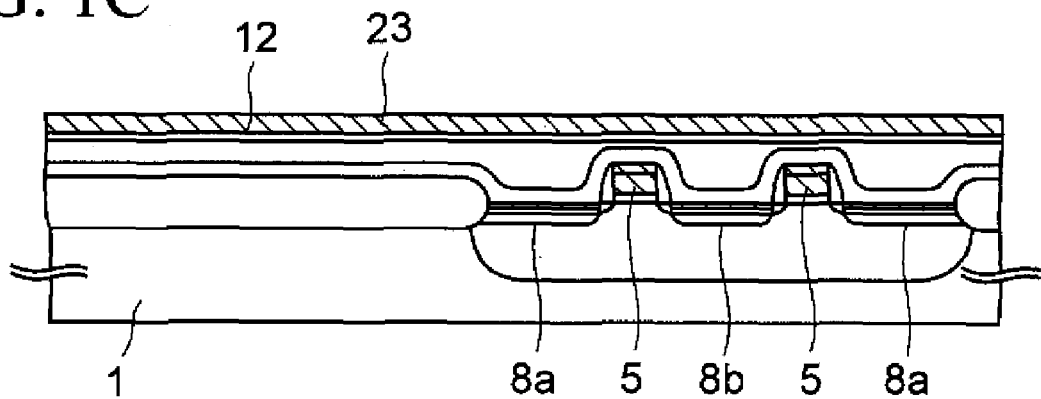

Next, as shown in FIG. 1C, a platinum film is formed by the sputtering method as a first conductive film 23 on the lower electrode adhesion film 12. The first conductive film 23 will be patterned later to be a capacitor lower electrode. The first conductive film 23 is formed at a film-forming temperature of 100° C. or 350° C. to have a thickness of approximately 150 nm.

In the case where a titanium film with a thickness of approximately 20 nm is formed as the lower electrode adhesion film 12, the thickness of the first conductive film 23 formed of platinum is set at approximately 180 nm.

Since the lower electrode adhesion film 12 is formed before the first conductive film 23 is formed, adhesion between the first conductive film 23 and the first interlayer insulating film 11 increases.

Figure 1D:
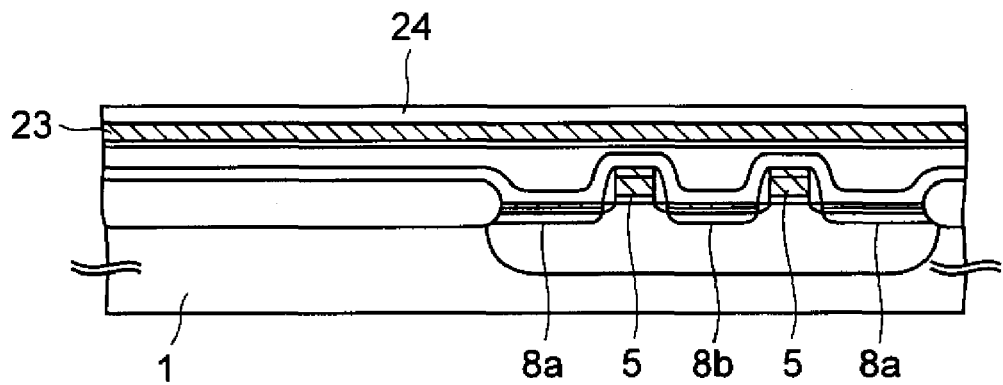

Next, as shown in FIG. 1D, by using the sol-gel method, a PLZT film formed by doping La into the PZT film is formed on the first conductive film 23 as a ferroelectric film 24.

The sol-gel method is carried out as follows.

Firstly, a PLZT-coating film is formed by applying a PLZT solution (ferroelectric solution) onto a first ferroelectric film 24$b$ for 30 seconds by a spin coating method with a rotational frequency of 5000 rpm in an atmosphere with humidity of 40%.

The type of PLZT solution is not particularly limited. However, the present embodiment employs a solution obtained by dissolving each of precursors of Pb, La, Zr, and Ti in a butanol solvent, with a concentration of 10 weight %. Such a solution is commercially available from material manufacturers. For example, a solution made by Mitsubishi Materials Corporation, of which composition ratio after film-forming is adjusted to be Pb:La:Zr:Ti=110:2:40:60, may be used.

Next, annealing with a substrate temperature of 200 to 450° C., for example, 240° C., is carried out for approximately 5 minutes on the PLZT-coating film in an oxygen atmosphere in atmospheric pressure.

With this process, the butanol solvent in the PLZT-coating film is evaporated, so that the volume of the PLZT-coating film shrinks. Thereby, concentration of gel including molecules forming a ferroelectric substance increases, and this makes it easier to crystallize the PLZT-coating film later. The annealing carried out for evaporating a solvent in this manner is also referred to as bake.

Then, the ferroelectric film 24 made of PLZT is formed with a thickness of 120 nm by repeating formation of such a PLZT-coating film and bake predetermined times, for example, 4 times.

Incidentally, the ferroelectric film 24 formed by the sol-gel method is not limited to a PLZT film.

The ferroelectric film 24 may be formed of a ferroelectric material having an $ABO_3$-type perovskite structure (A represents any one of Bi, Pb, Ba, Sr, Ca, Na, K, and rare-earth elements, and B represents any one of Ti, Zr, Nb, Ta, W, Mn, Fe, Co, and Cr).

In the case where the PZT film is formed as the ferroelectric film 24, it is preferable that any one of lanthanum, calcium, strontium, and niobium with concentration of 1 to 5 mol % be added to the PZT. The ferroelectric film 24, into which these elements are doped, may be applied to a capacitor described later. Thereby, effects, such as an improvement of fatigue resistance characteristics and of imprint characteristics of the capacitor, reduction of a leak current, and reduction of an operating voltage, can be obtained.

Furthermore, as a single unit of crystals, Bi layer structure compounds such as $(Bi_{1-x}R_x)Ti_3O_{12}$ (R represents a rare-earth element with $0<X<1$), $SrBi_2Ta_2O_9$ (SBT) and $SrBi_4Ti_4O_{15}$ have also an $ABO_3$-type perovskite structure. For this reason, the Bi layer structure compounds can be adopted as a material for the ferroelectric film 24.

Note that in order to improve crystallinity of the ferroelectric film 24, it is preferable that the first conductive film 23 be formed of a material having a lattice constant close to that of PLZT forming the ferroelectric film 24. Such a material includes palladium, $SrRuO_3$ and $LaSrCoO_3$ having the same perovskite structure as that of the PLZT, in addition to the above-described platinum. On the other hand, ruthenium, iridium, and oxides thereof have a lattice constant far from that of the PLZT. Therefore, the first conductive film 23 formed of any one of these materials may possibly deteriorate crystallinity of the ferroelectric film 24 due to lattice mismatch.

Here, costs for film forming by the sol-gel method are lower than that of the sputtering method. Hence, the sputtering method is not employed in the present embodiment, and the ferroelectric film 24 is formed by the sol-gel method as described above so as to reduce the costs for manufacturing a semiconductor device as much as possible.

However, the ferroelectric film 24 formed by the sol-gel method is not crystallized at the time of film formation, and ferroelectric characteristics thereof is poor.

Figure 1E:
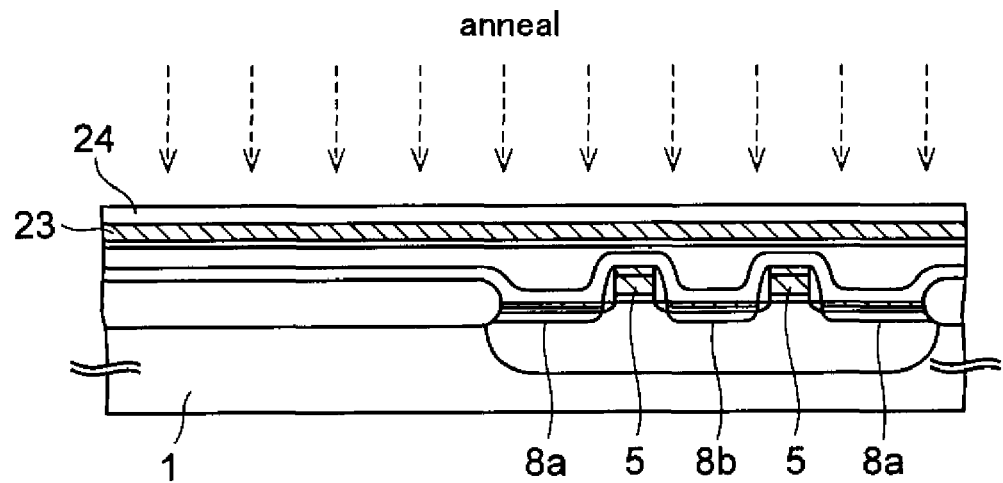

To deal with this problem, in the next step, as shown in FIG. 1E, atmospheric-pressure RTA (Rapid Thermal Anneal) is carried out on the ferroelectric film 24 in an atmosphere containing an oxidizing gas. Thereby, the ferroelectric film 24 is crystallized in a (111) direction in which an amount of polarization charges becomes the largest. Such annealing is referred to as crystallization annealing.

The atmosphere used for the crystallization annealing is not particularly limited as long as it is an atmosphere containing an oxidizing gas. In the present embodiment, the crystallization annealing is carried out in an atmosphere containing 100% of oxygen. In place of the oxygen gas, an ozone gas or a nitrogen dioxide gas may be used as an oxidizing gas. In addition, these gases may be diluted with an inert gas such as an argon gas.

A speed of raising the temperature used for the crystallization annealing is also not limited. However, in the present embodiment, the speed of raising the temperature is set at 40 to 150° C. per minute. In order to improve the crystallinity of the ferroelectric film 24, it is preferable that the speed of raising the temperature be made as fast as possible, for example, 125° C. per minute.

When a maximum substrate temperature is too high in this crystallization annealing, crystallization develops from the upper surface of the ferroelectric film 24. Therefore, an interface, in which PZT crystal grains are discontinuous, is formed in a vicinity of the upper surface of the ferroelectric film 24. The layer above this interface is referred to as a surface layer. Unevenness due to the crystal grains is formed on the upper surface of the surface layer. Such unevenness is one of factors for not being able to uniformly apply a voltage to the ferroelectric film 24.

Accordingly, in order to suppress formation of the surface layer, it is preferable that the lower limit of the maximum substrate temperature used for the above-described crystallization annealing be set at the crystallization temperature of the ferroelectric film 24, and that the upper limit thereof be set at 60° C. higher than the crystallization temperature. In the present embodiment, the maximum substrate temperature is set at 500 to 560° C., for example 550° C.

By setting the upper limit of the maximum substrate temperature to be a relatively low temperature in this manner, crystallization develops from the lower surface of the ferroelectric film 24. Hence, the crystal grains of the ferroelectric film 24 take over crystallinity of the first conductive film 23. Accordingly, the above-described surface layer is not easily formed, and the unevenness of the ferroelectric film 24 is suppressed.

Note that this crystallization annealing makes it possible to obtain an advantage that interdiffusion of platinum and oxygen is suppressed in the vicinity of the interface between the first conductive film 23 and the ferroelectric film 24, since the platinum film constituting the first conductive film 23 is made dense by the crystallization annealing.

Instead of the atmospheric-pressure RTA, this crystallization annealing may be carried out by reduced-pressure RTA. The ferroelectric film 24 is more easily crystallized with the reduced-pressure RTA than with the atmospheric-pressure RTA. Thus, each of the upper and lower limits of the maximum substrate temperature can be made lowered by about 10° C. with the reduced-pressure RTA than with the atmospheric-pressure RTA. As a result, even when the lower limit of the maximum substrate temperature of the crystallization annealing is set to a temperature being 10° C. lower than the crystallization temperature of the ferroelectric film 24 and the upper limit thereof is set to a temperature being 50° C. higher than the crystallization temperature, the generation of the surface layer in the ferroelectric film 24 can be suppressed.

Figure 1F:
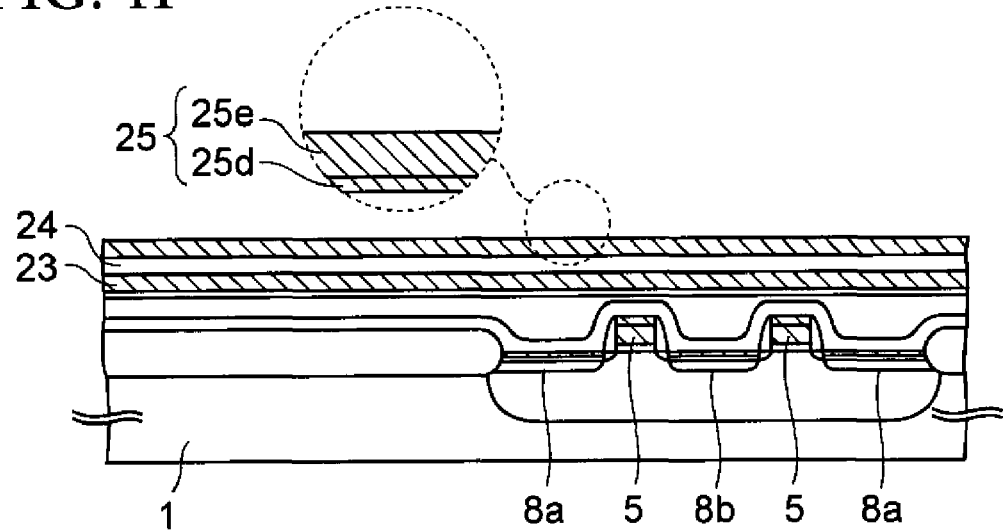

Next, steps for obtaining a cross-sectional structure shown in FIG. 1F will be described.

Firstly, by a sputtering method which uses the mixed gas of oxygen and argon as a sputtering gas, and which utilizes an iridium target, an iridium oxide film which is already crystallized on the above-described ferroelectric film 24 at the time of forming thereof, is formed with a thickness of approximately 25 nm. This iridium oxide film is used as a first conductive metal oxide film 25d.

In order to form an iridium oxide film which is surely crystallized at the time of film forming, it is necessary to set a substrate temperature to be 300° C. or more. When the iridium oxide film is formed at a temperature lower than 300° C., crystallization does not sufficiently develop at the time of film forming, so that an iridium oxide film may possibly be in amorphous state.

On the other hand, when the substrate temperature is higher than 400° C., oxygen in the iridium oxide film becomes insufficient. The iridium oxide film with insufficient oxygen generates hydrogen by reducing outside moisture, and the hydrogen deteriorates the ferroelectric film 24. Accordingly, from a viewpoint of surely preventing the deterioration of the ferroelectric film 24, it is preferable that the first conductive metal oxide film 25d formed of iridium oxide be formed at the substrate temperature of 400° C. or less.

In the present embodiment, a flow rate of argon is set at 140 sccm, and a flow rate of oxygen is set at 60 sccm. Furthermore, sputtering power is set at 1 to 2 kW.

Thereafter, under conditions that a substrate temperature is 725° C. and a processing time is 60 seconds, RTA is carried out on the first conductive metal oxide film 25d in the mixed atmosphere of an oxygen gas and an argon gas. The gas flow rate in this RTA is not particularly limited. In the present embodiment, the flow rate of oxygen is set at 20 sccm, and the flow rate of argon is set at 2000 sccm. Note that, when a flow rate ratio of oxygen exceeds 20%, the first conductive metal oxide film 25d formed of iridium oxide is reduced by oxygen to cause a rough surface. For this reason, it is preferable that this annealing be carried out with the oxygen flow rate ratio of 20% or less.

With such RTA, the ferroelectric film 24 is completely crystallized, and damages received in the ferroelectric film 24 at the time of forming the first conductive metal oxide film 25d by the sputtering method are recovered. Furthermore, the oxygen loss in the ferroelectric film 24 is also compensated by this RTA, and ferroelectric characteristics of the ferroelectric film 24 improve.

In particular, by carrying out annealing in a state where the entire surface of the ferroelectric film 24 is covered with the first conductive metal oxide film 25d in this manner, lead atoms essential for maintaining the ferroelectric characteristics of the ferroelectric film 24 does not easily escape from the ferroelectric film 24 to the annealing atmosphere. Thus, this annealing is more effective as compared with the case where annealing is carried out after patterning the capacitor.

Moreover, this annealing also provides an advantage in that a voltage can be uniformly applied from an upper electrode to be described later, to the ferroelectric film 24, since the interface between the first conductive metal oxide film 25d and the ferroelectric film 24 is made flat.

Note that the annealing atmosphere at this time is not particularly limited as long as it is an atmosphere containing an oxidizing gas. The examples of the oxidizing gas include an ozone gas and a nitrogen dioxide gas in addition to the above-described oxygen gas.

After that, by the sputtering method, an iridium oxide film is formed with a thickness of approximately 200 nm as a second conductive metal oxide film 25e on the first conductive metal oxide film 25d. In this sputtering method, an iridium target is used, and the mixed gas of oxygen and argon is used as a sputtering gas.

Unlike the first conductive metal oxide film 25d, an iridium oxide film constituting the second conductive metal oxide film 25e needs not be crystallized at the time of film formation. In the present embodiment, a substrate temperature at the time of forming the second conductive metal oxide film 25e is set to be room temperature (20° C.) so as to form an iridium oxide film in an amorphous state.

Incidentally, in the above-described sputtering of iridium oxide, iridium atoms flying from the iridium target is oxidized in the sputtering atmosphere, and thereby, iridium oxide is deposited on the substrate. Therefore, the deposited iridium oxide includes iridium atoms which are not sufficiently oxidized in the atmosphere, and the iridium oxide film can be formed in a state where the amount of oxygen in the film as a hole is less than that of stoichiometry composition ($IrO_2$).

However, when the amount of oxygen is insufficient in the second conductive metal oxide film 25e, catalysis of the second conductive metal oxide film 25e increases. Accordingly, outside moisture comes in contact with the second conductive metal oxide film 25e to generate hydrogen. Since there is a problem that hydrogen reduces the ferroelectric film 24 to deteriorate the ferroelectric characteristics thereof, it is required to suppress generation of hydrogen as low as possible in process of manufacturing a FeRAM.

Accordingly, from a viewpoint of preventing the generation of hydrogen, it is preferable that an oxidation number of the second conductive metal oxide film 25e be larger than that of the first conductive metal oxide film 25d.

In the present embodiment, by setting the flow rate ratio of oxygen at the time of forming the second conductive metal oxide film 25e to be larger than that at the time of forming the first conductive metal oxide film 25d, the composition of iridium oxide is brought close to stoichiometry composition ($IrO_2$) so that the catalysis of the second conductive metal oxide film 25e is suppressed.

With the above steps, a second conductive film 25 formed of the first and second conductive metal oxide films 25d and 25e is formed on the ferroelectric film 24.

Note that the material constituting the first and second conductive metal oxide films 25d and 25e is not limited to iridium oxide. The first and second conductive metal oxide films 25d and 25e may be formed of an oxide of any one of iridium, ruthenium, rhodium, rhenium, and osmium. Furthermore, the second conductive film 25 may be formed by stacking these oxides.

Figure 1G:
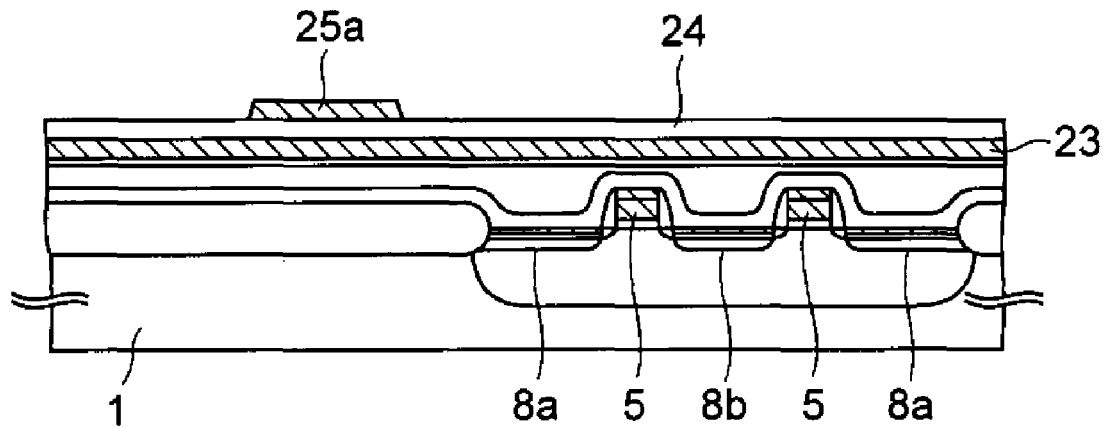

Next, as shown in FIG. 1G, after the back surface of the silicon substrate 1 is cleaned, the second conductive film 25 is patterned into an upper electrode 25a by photolithography and etching. Then, to recover damages received in the ferroelectric film 24 due to this patterning, recovery annealing is carried out on the ferroelectric film 24 in a vertical furnace. This recovery annealing is carried out in an atmosphere containing oxygen, and conditions thereof are, for example, a substrate temperature of 650° C., and a processing time of 60 minutes.

Figure 1H:
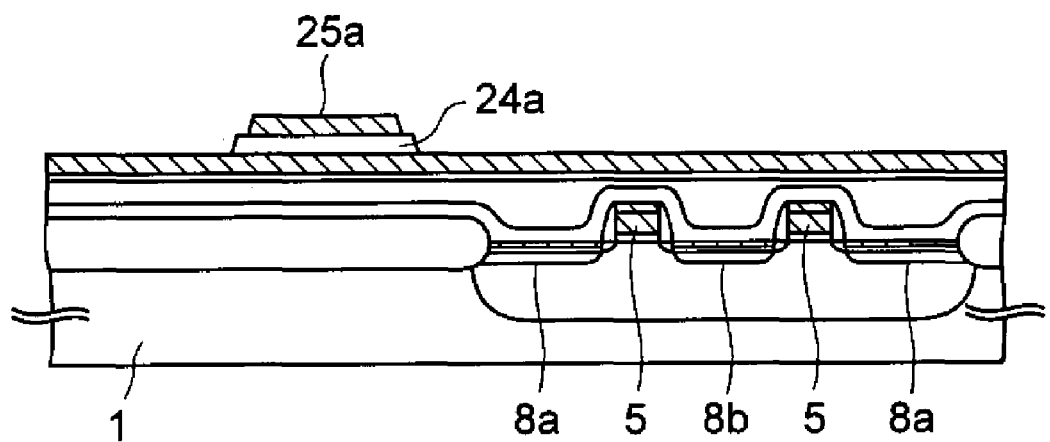

Subsequently, as shown in FIG. 1H, the ferroelectric film 24 is patterned by photolithography and etching to form a capacitor dielectric film 24a formed of a ferroelectric material such as PLZT. Damages received in the capacitor dielectric film 24a due to this patterning are recovered by recovery annealing. As in the case described above, this recovery annealing is carried out by using the vertical furnace in an atmosphere containing oxygen, and adopted conditions thereof are a substrate temperature of 350° C. and a processing time of 60 minutes.

Figure 1I:
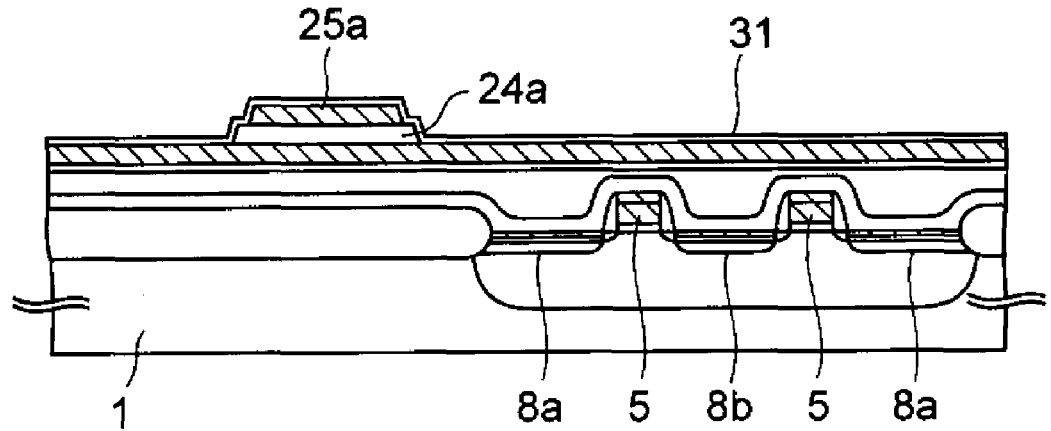

Next, as shown in FIG. 1I, a first alumina film 31 for protecting the capacitor dielectric film 24a from reductants such as hydrogen and moisture is formed with a thickness of approximately 50 nm on the entire upper surface of the silicon substrate 1 by the sputtering method.

Here, since the recovery annealing described in FIG. 1H is carried out in advance, the first alumina film 31 is less likely to be peeled off.

Then, to recover damages received in the capacitor dielectric film 24a at the time of forming the first alumina film 31, recovery annealing is carried out in the atmosphere containing oxygen with a substrate temperature of 550° C. for approximately 60 minutes. This recovery annealing is carried out by using, for example, a vertical furnace.

Figure 1J:
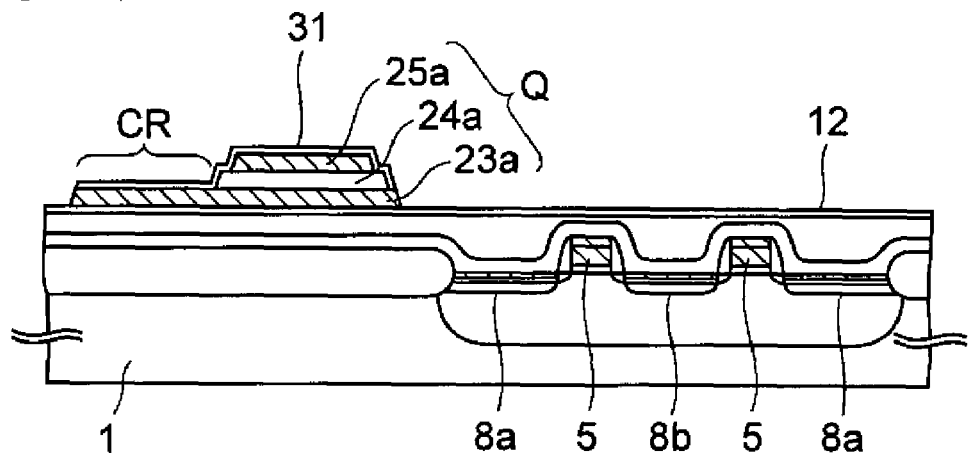

Thereafter, as shown in FIG. 1J, the first conductive film 23 and the first alumina film 31 are patterned by photolithography and etching, and thereby the first conductive film 23 below the capacitor dielectric film 24a is set to be a lower electrode 23a. By this etching, the first alumina film 31 is left so as to cover the lower electrode 23a.

The lower electrode 23a has a contact region CR protruding from the capacitor dielectric film 24a. In this contact region CR, a metal wiring to be described later, and the lower electrode 23a are electrically connected to each other.

After that, to recover damages received in the capacitor dielectric film 24a during the manufacturing process, the recovery annealing is carried out to the capacitor dielectric film 24a in the atmosphere containing oxygen in the vertical furnace under conditions with a substrate temperature of 550° C. and a processing time of 60 minutes.

With the steps described above, a capacitor Q formed by stacking the lower electrode 23a, the capacitor dielectric film 24a, and the upper electrode 25a in this order, is formed in a cell region of the silicon substrate 1.

Figure 1K:
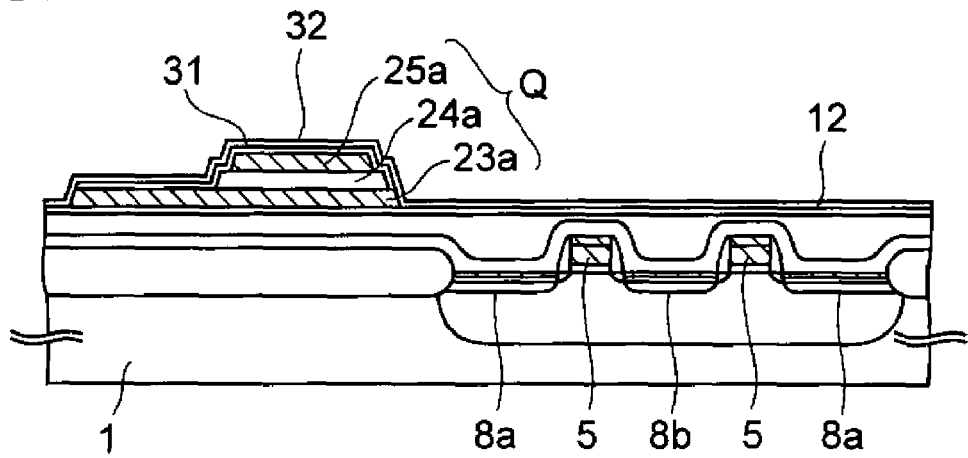

Next, as shown in FIG. 1K, a second alumina film 32 for protecting the capacitor dielectric film 24a is formed with a thickness of approximately 20 nm on the entire upper surface of the silicon substrate 1 by the sputtering method. This second alumina film 32, together with the first alumina film 31 thereunder, prevents reductants, such as hydrogen and moisture, from coming in contact with the capacitor dielectric film 24a, and has a function of suppressing deterioration of ferroelectric characteristics of the capacitor dielectric film 24a due to reduction thereof.

Thereafter, the recovery annealing is carried out on the capacitor dielectric film 24a in the vertical furnace with the atmosphere containing oxygen, under conditions with a substrate temperature of 550° C. and a processing time of 60 minutes.

This recovery annealing also provides an advantage that a leak current of the capacitor Q is reduced.

Figure 1L:
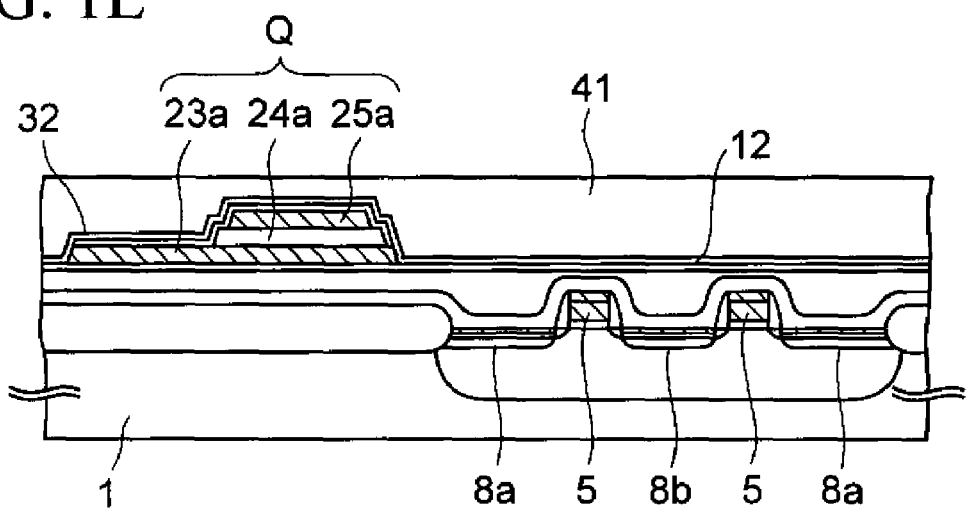

Moreover, as shown in FIG. 1L, a silicon oxide film is formed with a thickness of approximately 1500 nm on the above-described second alumina film 32 by a high-density plasma CVD (HDPCVD) method using a silane ($SiH_4$) gas, and the silicon oxide film is set to be a second interlayer insulating film 41. Thereafter, an upper surface of the second interlayer insulating film 41 is polished and planarized by the CMP method.

Thereafter, the second interlayer insulating film 41 is dehydrated by performing $N_2O$ plasma processing on the second interlayer insulating film 41, and the upper surface of the second interlayer insulating film 41 is slightly nitrided, and thereby moisture is prevented from being absorbed into the second interlayer insulating film 41.

Figure 1M:
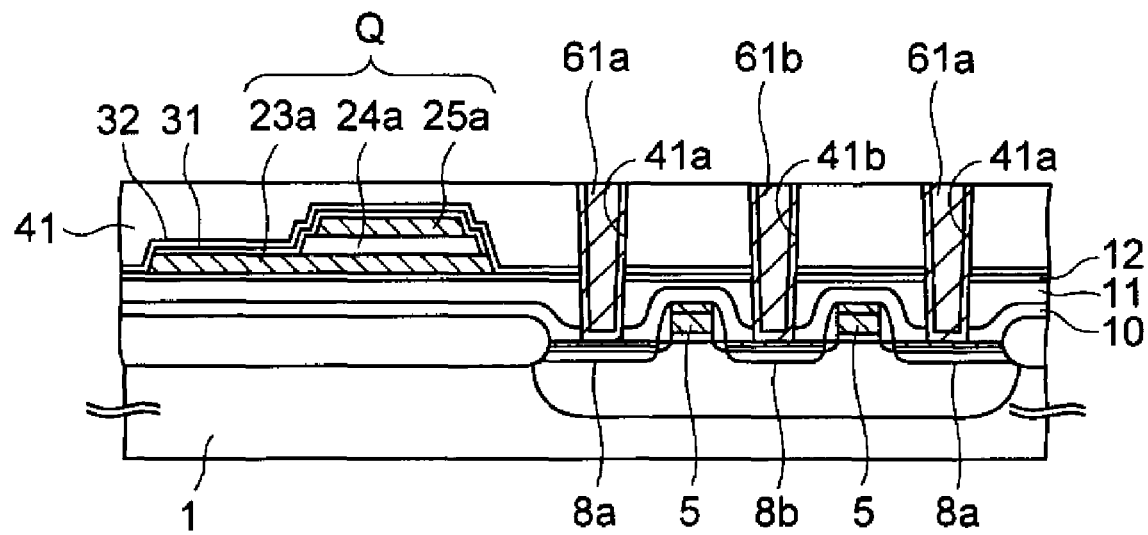

Next, steps for obtaining a cross-sectional structure shown in FIG. 1M will be described.

Firstly, insulating films 10 to 12, 31, 32, and 41 are patterned by photolithography and dry etching to form first and second contact holes 41a and 41b in these films on the first and second source/drain regions 8a and 8b.

Thereafter, on each of inner surfaces of the first and second contact holes 41a and 41b and the upper surface of the second interlayer insulating film 41, a titanium film and a titanium nitride film are formed respectively with thicknesses of 20 nm and 50 nm, by the sputtering method, and these films are set to be a glue film (an adhesion film). Subsequently, a tungsten film is formed on the glue film by a CVD method using a tungsten hexafluoride gas, and the first and second contact holes 41a and 41b are completely embedded with this tungsten film.

After that, the excessive glue film and tungsten film on the second interlayer insulating film 41 are polished and removed by the CMP method, and these films are left only inside the first and second contact holes 41a and 41b as first and second conductive plugs 61a and 61b. The first and second conductive plugs 61a and 61b are electrically connected to the first and second source/drain regions 8a and 8b, respectively.

Here, the first and second conductive plugs 61a and 61b are mainly formed of tungsten which is oxidized very easily. Therefore, contact defect may possibly occur due to the first and second conductive plugs 61a and 61b being easily oxidized in the atmosphere containing oxygen.

Figure 1N:
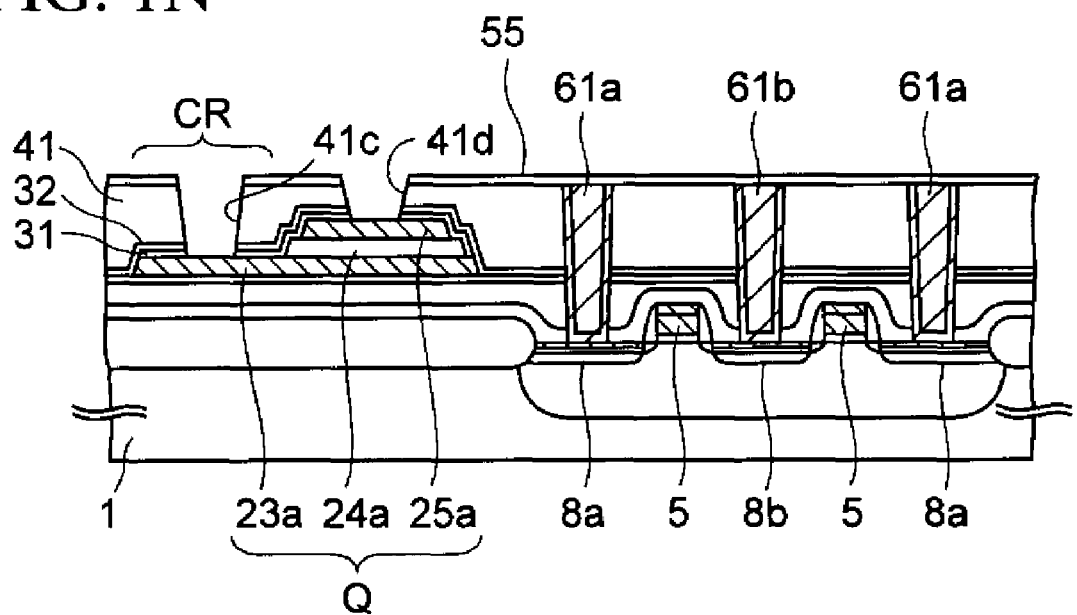
Figure 10:
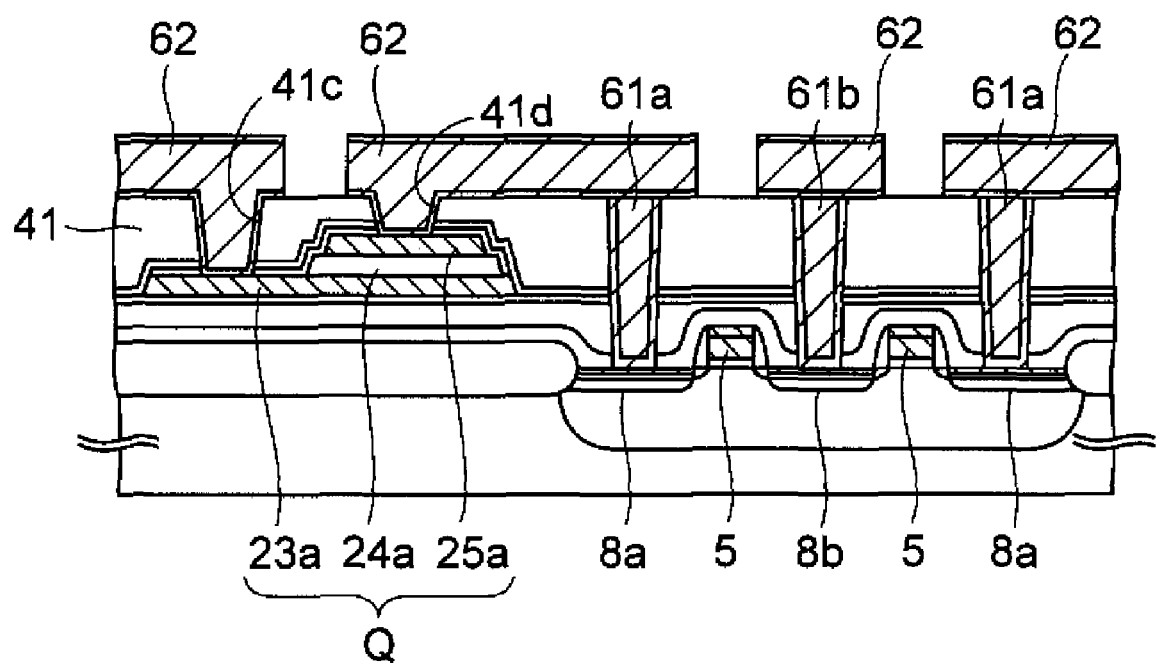
FIGS. 10A to 10Q are cross-sectional views showing processes of manufacturing a semiconductor device according to a fifth embodiment of the present invention.

To deal with this problem, in the next step, as shown in FIG. 1N, a silicon oxynitride film is formed by the CVD method with a thickness of approximately 100 nm as an antioxidant insulating film 55 on the entire upper surface of the silicon substrate 1. The antioxidant insulating film 55 protects the first and second conductive plugs 61a and 61b from being oxidized.

After that, patterning is carried out on layers from the antioxidant insulating film 55 down to the first alumina film 31 are patterned by photolithography and etching. Thereby, a third hole 41c is formed in these insulating films in the contact region CR of the lower electrode 23a, and a fourth hole 41d is formed on the upper electrode 25a.

Thereafter, to recover damages received in the capacitor dielectric film 24a in the course of the above steps, the silicon substrate 1 is put in the vertical furnace with the atmosphere containing oxygen, and the recovery annealing is carried out on the capacitor dielectric film 24a under conditions with a substrate temperature of 500° C. and a processing time of 60 minutes.

Next, steps for obtaining a cross-sectional structure shown in FIG. 1O will be described.

Firstly, a metal laminated film is formed by the sputtering method on each of the upper surfaces of the second interlayer insulating film 41 and the first and second conductive plugs 61a and 61b. In the present embodiment, as the metal laminated film, a titanium nitride film with a thickness of approximately 150 nm, a copper-containing aluminum film with a thickness of approximately 550 nm, a titanium film with a thickness of approximately 5 nm, and a titanium nitride film with a thickness of approximately 150 nm are formed in this order. This metal laminated film is also formed in the third and fourth holes 41c and 41d in the capacitor Q.

Then, the metal laminated film is patterned by photolithography and etching to form a metal wiring 62 electrically connected to the capacitor Q and to the conductive plugs 61a and 61b.

After that, annealing is carried out to dehydrate the second interlayer insulating film 41 under conditions with a substrate temperature of 350° C., a flow rate of $N_2$ at 20 liter per minute, and a processing time of 30 minutes, by using the vertical furnace with a nitrogen atmosphere.

With the above steps, a basic structure of the semiconductor device according to the present embodiment is completed.

In the embodiment described above, as shown in FIG. 1F, the second conductive film 25 to be the upper electrode 25a has the first and second conductive metal oxide films 25d and 25e, both of which are formed of iridium oxide.

Of these two films 25d and 25e, the first conductive metal oxide film 25d is formed by the sputtering method using the sputtering gas containing oxygen, as described above. The oxygen in the sputtering gas has a function of not only oxidizing iridium grains flying from the iridium target but also compensating the oxygen loss in the ferroelectric film 24 formed by the sol-gel method.

In particular, the ferroelectric film 24 formed by the sol-gel method easily loses oxygen in the film as compared with the ferroelectric film formed by the sputtering method. Accordingly, in the case where the ferroelectric film 24b is formed by the sol-gel method as in the present embodiment, the oxygen loss in the ferroelectric film 24 needs to be compensated as much as possible to increase ferroelectric characteristics thereof by optimizing the flow rate ratio of oxygen at the time of forming the first conductive metal oxide film 25d.

Note that the flow rate ratio of oxygen in the present specification is defined as a percentage of a ratio of an oxygen gas in the sputtering gas.

The inventors studied how much flow rate ratio of oxygen is needed to form the first conductive metal oxide film 25d which increases ferroelectric characteristics of the ferroelectric film 24.

Figure 2:
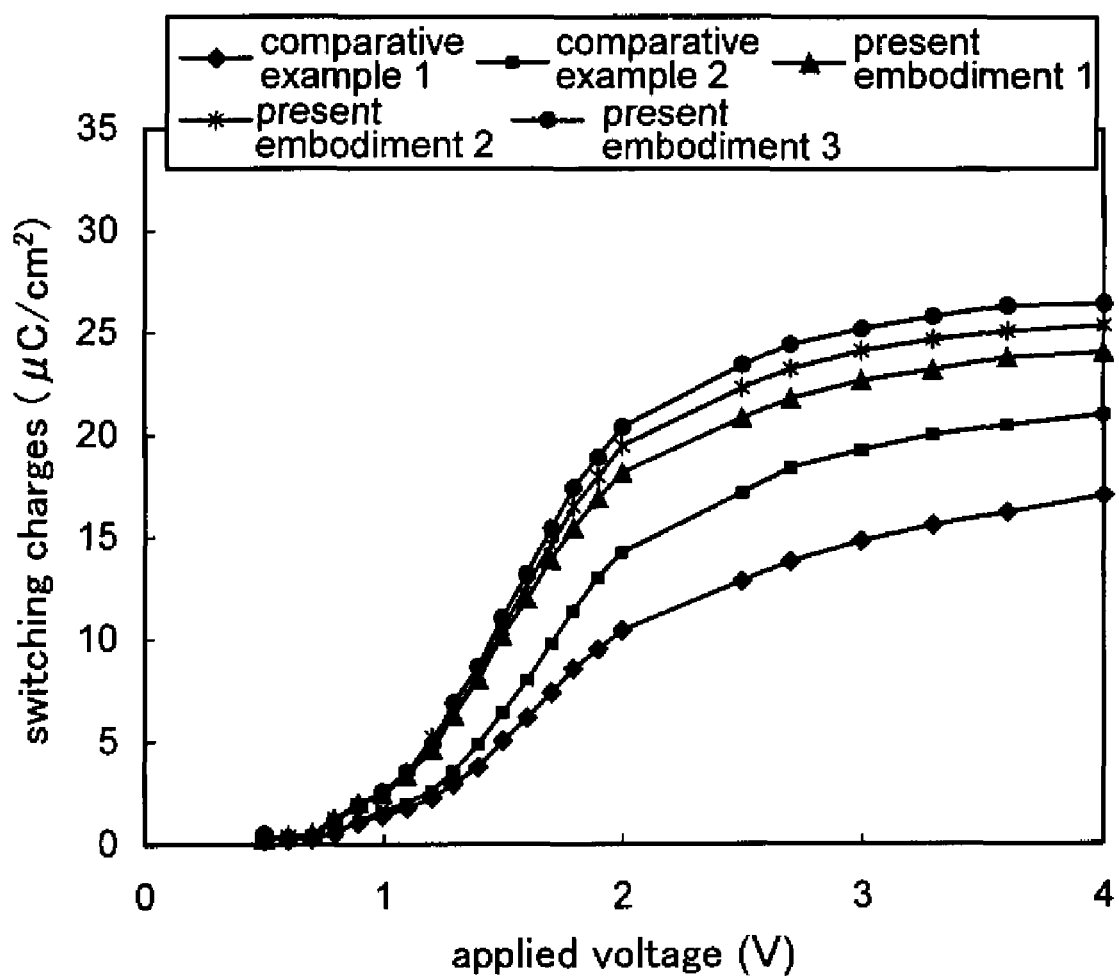
FIG. 2 is a graph obtained by studying a relationship between an applied voltage and the switching charge of a ferroelectric film in a case where a plurality of capacitors are integrally formed on a silicon substrate.

The results of the study are shown in FIG. 2.

In this study, 1428 rectangle ferroelectric capacitors (cell capacitors), each of which had 1.60 μm in length and 1.15 μm in width, were formed on a silicon substrate. Thereafter, layers up to the third layer metal wiring were formed.

In addition, as the ferroelectric characteristics of the ferroelectric film 24, the switching charge was examined. Applied voltages indicated on the horizontal axis in FIG. 2 show voltages applied between the upper and lower electrodes 25a and 23a of the capacitors.

Furthermore, as the ferroelectric film 24 in each sample, a PLZT film with a thickness of 120 nm obtained by crystallizing a four-layered PLZT-coating film is used. A substrate temperature at the time of crystallization annealing on the PLZT-coating film was 550° C., which is the same as that of the present embodiment. Concentration of La in the PLZT film was 2.0 mol %.

Moreover, in the present embodiments 1 to 3 shown in FIG. 2, flow rates of the sputtering gas at the time of forming the first conductive metal oxide film 25d were set as follows.

The present embodiment 1
Flow rate of argon: 150 sccm
Flow rate of oxygen: 50 sccm (flow rate ratio of oxygen: 25%)
The present embodiment 2
Flow rate of argon: 140 sccm
Flow rate of oxygen: 60 sccm (flow rate ratio of oxygen: 30%)
The present embodiment 3
Flow rate of argon: 120 sccm
Flow rate of oxygen: 80 sccm (flow rate ratio of oxygen: 40%)

Incidentally, a substrate temperature at the time of forming the first conductive metal oxide film 25d was 300° C. in any of the present embodiments 1 to 3. Subsequently, RTA is carried out on the first conductive metal oxide film 25d in the mixed atmosphere of argon and oxygen under conditions with a substrate temperature of 725° C. and a processing time of 60 seconds.

In contrast, in comparative example 1, a film formed by stacking a platinum film and an iridium oxide film in this order was formed as an upper electrode.

In comparative example 2, a film formed by stacking two layers of iridium oxide films, both of which were formed at room temperature, was formed as an upper electrode. Since each of the iridium oxide films was formed at room temperature, these films ware made to be in an amorphous state at the time of film forming. RTA was carried out to crystallize the iridium oxide film of the first layer after forming thereof.

As shown in FIG. 2, in the comparative example 1 forming the upper electrode having the platinum film, the capacitor was considerably deteriorated, and the switching charge after all of the steps were completed was considerably low. The reason thereof is considered to be that water contained in the second interlayer insulating film 41 was reduced at platinum film by the heat applied at the time of forming the metal wiring 49a, and the capacitor was deteriorated by the hydrogen.

On the other hand, in the comparative example 2 in which the laminated film of the iridium oxide films was formed as the upper electrode, there was no catalysis by platinum. Hence, the switching charge Qsw become larger than that of the comparative example 1.

However, in the comparative example 2, when RTA for crystallization was carried out on the first layer iridium oxide film, a relatively thick interface layer due to interdiffusion was formed between the iridium oxide film and the PLZT film. Since the interface layer is a paraelectric layer, it does not contribute to ferroelectric characteristics of the capacitor dielectric film. For this reason, in the comparative example 2, part of the voltage applied to the capacitor was applied to the above-described interface layer, and thereby the voltage applied to the PLZT film decreased. As a result, the switching charge Qsw was made smaller than that of the present embodiment.

In contrast, in the present embodiments 1 to 3, the first conductive metal oxide film 25d was formed at a high temperature of 300° C. Thus, the first conductive metal oxide film 25d was already crystallized at the time of film forming. Accordingly, even when RTA was carried out on the first conductive metal oxide film 25d, an interface layer as in the comparative example 2 was not likely to be formed between the PLZT film and the first conductive metal oxide film 25d. Hence, the absorption of voltage by the interface layer was suppressed so that the switching charge Qsw became larger than that of the comparative example 2.

Moreover, in the present embodiments 1 to 3, RTA was carried out on the first conductive metal oxide film 25d in the atmosphere containing oxygen. Accordingly, damages received in the PLZT film at the time of forming the first conductive metal oxide film 25d were recovered, and the oxygen loss in the PLZT film was compensated. Thereby, it was possible to effectively increase the switching charge Qsw.

To effectively compensate oxygen loss, it is preferable that the first conductive metal oxide film 25d be as thin as possible to be, for example, 10 to 50 nm, and that oxygen in the atmosphere of RTA be made to easily pass through the first conductive metal oxide film 25d.

When a substrate temperature in this RTA is lower than 650° C., oxygen does not easily pass through the first conductive metal oxide film 25d, and the oxygen loss in the PLZT film is less likely to be compensated. Therefore, it is preferable that the lower limit of the substrate temperature in this RTA be set at 650° C.

However, when the substrate temperature is too high, the iridium oxide constituting the first conductive metal oxide film 25d is reduced to generate unstable iridium oxide having an oxidation number smaller than 2. Therefore, it is preferable that the upper limit of this RTA be set at 800° C.

When each of the present embodiments 1 to 3 is compared with one another, the switching charge Qsw increases as the flow rate ratio of oxygen in the sputtering gas at the time of forming the first conductive metal oxide film 25d increases.

The reason thereof is considered to be that, with the high flow rate ratio of oxygen, oxygen in the annealing atmosphere is effectively supplied to the PLZT film without being captured by the first conductive metal oxide film 25d at the time of carrying out annealing on the first conductive metal oxide film 25d, since x of the iridium oxide ($IrO_x$) constituting the first conductive metal oxide film 25d is made closer to 2, and thus an iridium oxide film in a stable state is formed.

Such a tendency is not observed in Japanese Patent Application Laid-open Publication No. 2006-73648 (JP No. 2006-73648 A) which discloses a PZT film formed by a sputtering method. For example, FIGS. 14, 15, 18A, and 18B of JP No. 2006-73648 A show a study on the switching charge Qsw of the PZT film in the case where film-forming conditions of the first layer iridium oxide film of the upper electrode were varied.

Among such film-forming conditions, a condition of a substrate temperature of 300° C. causes iridium oxide to be surely crystallized at the time of forming thereof, as in the present embodiment. In each of the drawings in above-described JP No. 2006-73648 A, under the condition with the substrate temperature of 300° C., an increase of the flow rate ratio of oxygen in the sputtering atmosphere from 30% to 60% decreases the switching charge of the PZT film. This tendency is a completely opposite to that of the present embodiments 1 to 3 shown in FIG. 2.

It is considered that the tendency opposite to that of JP No. 2006-73648 A was observed in the present embodiments 1 to 3 because the PLZT films thereof were formed by the sol-gel method.

Accordingly, the present embodiment, in which the capacitor dielectric film 24a is formed by the sol-gel method, makes it possible to adjust the switching charge Qsw with the above-described flow rate ratio of oxygen in the step of forming the first conductive metal oxide film 25d by utilizing the fact that the switching charge of the capacitor dielectric film 24a increases due to the increase in the flow rate ratio of oxygen in the sputtering gas.

To sufficiently increase the switching charge Qsw, it is preferable that the flow rate ratio of oxygen at the time of forming the first conductive metal oxide film 25d be 20% or more.

Note that even in the case where the ferroelectric film 24 is formed with a metalorganic decomposition method or a chemical solution deposition (CSD) method instead of the sol-gel method, oxygen in the ferroelectric film 24 tends to be insufficient. Accordingly, even when the ferroelectric film 24 is formed by these film-forming methods, it is preferable that the switching charge of the ferroelectric film 24 be increased by increasing the flow rate of oxygen at the time of forming the first conductive metal oxide film 25d as in the aforementioned case.

Incidentally, the first conductive metal oxide film 25d, which is formed at a high temperature in order to crystallize thereof at the time of film forming, tends to grow abnormally, and tends to cause crystal disturbance.

Figure 3:
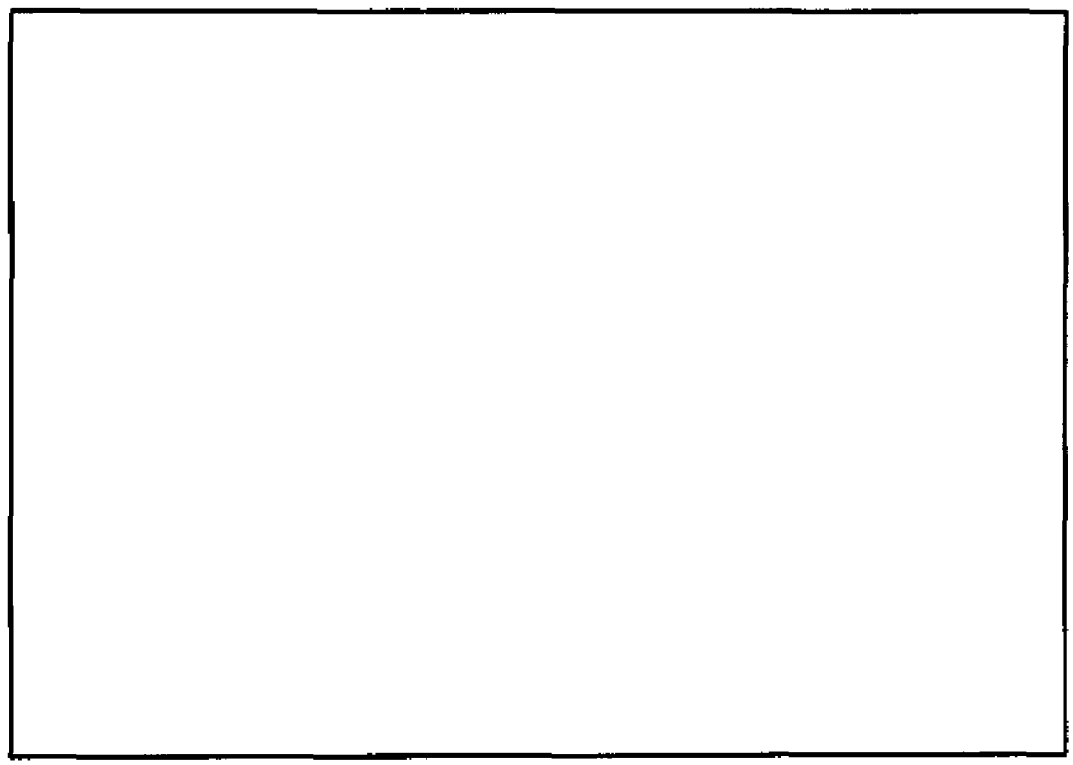
FIG. 3 is a microphotograph of an iridium oxide film with a thickness of 50 nm formed by a sputtering method.

FIG. 3 is a microphotograph of an iridium oxide film with a thickness of 50 nm formed at a film-forming temperature of 300° C. and with flow rates of oxygen and argon of respectively 80 sccm and 120 sccm. With such flow rates, a flow rate ratio of oxygen becomes 40%.

Figure 4:
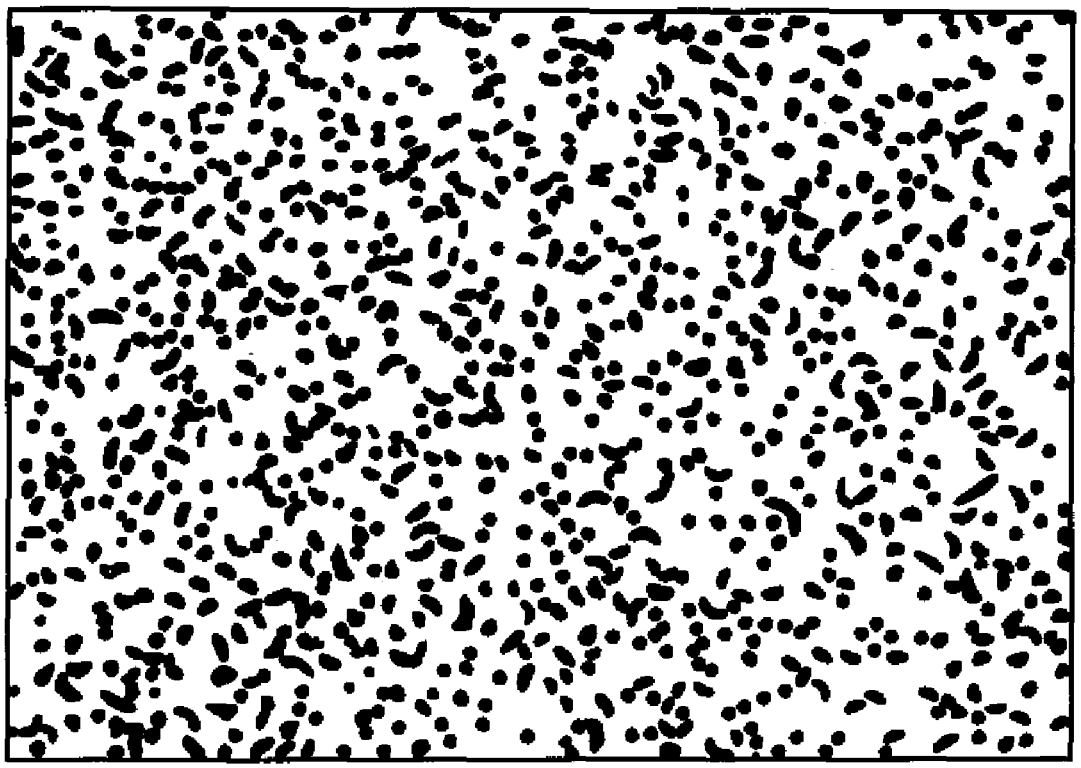
FIG. 4 is a microphotograph of an iridium oxide film with a thickness of 100 nm formed by the sputtering method.

On the other hand, FIG. 4 is a microphotograph of an iridium oxide film with a thickness of 100 nm formed under the same conditions as those of FIG. 3.

Note that magnification of a microscope used to obtain the microphotographs in both FIGS. 3 and 4 was 25 times.

As is clear from the comparison between FIGS. 3 and 4, the surface of the iridium oxide film with a thickness of 50 nm (FIG. 3) is very clean. In contrast, in the case where a thickness of the iridium oxide film is 100 nm (FIG. 4), many black spots are formed on the surface. The black spots represent abnormally-grown iridium oxide grains.

From these results, in view of preventing the first conductive metal oxide film 25d from growing abnormally, it is preferable that the thickness of the first conductive metal oxide film 25d be set at 50 nm or less.

However, when the thickness of the first conductive metal oxide film 25d is less than 10 nm, the first conductive metal oxide film 25d cannot be uniformly formed on the ferroelectric film 24. Consequently, it is preferable that the lower limit of the film thickness of the first conductive metal oxide film 25d be set at 10 nm.

On the other hand, in a study carried out with the flow rate ratio of oxygen further increased to be 50%, the abnormal growth was observed even in the iridium oxide film with a thickness of 40 nm. Note that in this study, both of the flow rates of oxygen and argon were set at 100 sccm. Therefore, the first conductive metal oxide film 25d can be prevented from growing abnormally also by setting the flow rate ratio of oxygen to be less than 50%.

As described above, as shown in FIG. 2, a large of switching charge can be obtained at voltages ranging from a low voltage to a saturation voltage in the present embodiments. In addition, each of the capacitors of the present embodiments shows a steeper gradient than those of the comparative examples in a graph of FIG. 2. Therefore, each of the present embodiments makes it possible to provide a capacitor which operates at a low voltage.

Moreover, with annealing on the first conductive metal oxide film 25d, not only the oxygen loss in the ferroelectric film 24 is compensated, but also the interface between the first conductive metal oxide film 25d and the ferroelectric film 24 is made flat. Thereby, a voltage can be uniformly applied from the upper electrode 25a to the capacitor dielectric film 24a, and fatigue resistance characteristics and imprint characteristics of the capacitor Q can be improved. Thus, it is made possible to provide a next-generation FeRAM which can be operated at a low voltage.

(2) Second Embodiment

Figure 5A:
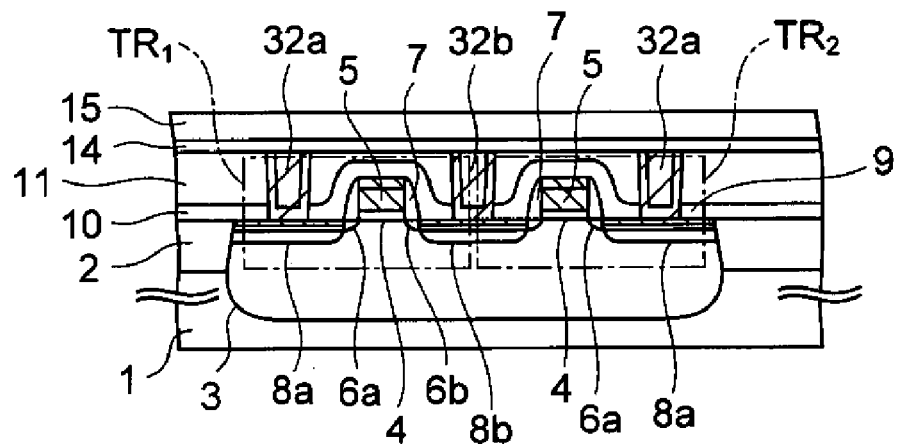
FIGS. 5A to 5X are cross-sectional views showing processes of manufacturing a semiconductor device according to a second embodiment of the present invention.
Figure 5B:
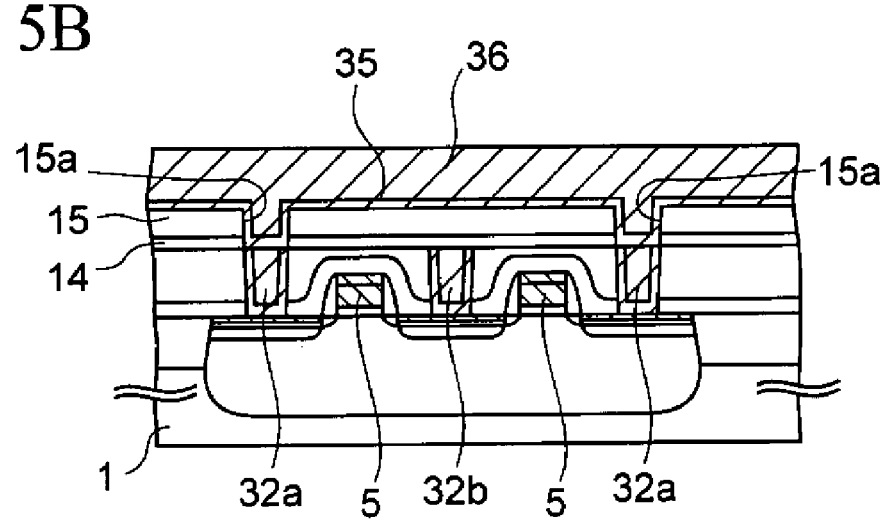
Figure 5C:
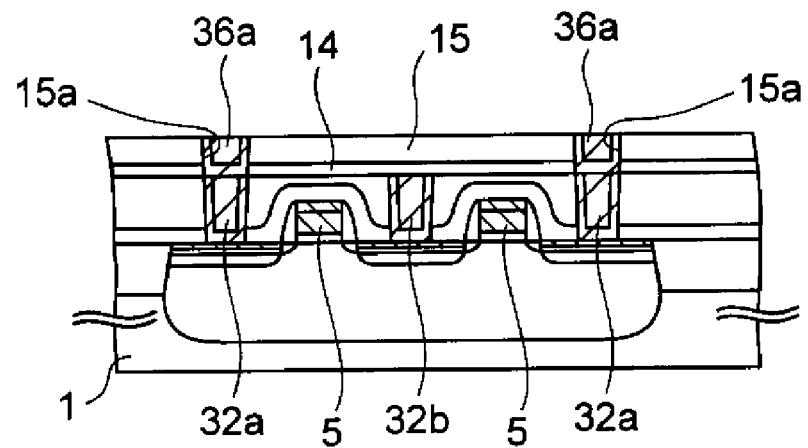
Figure 5D:
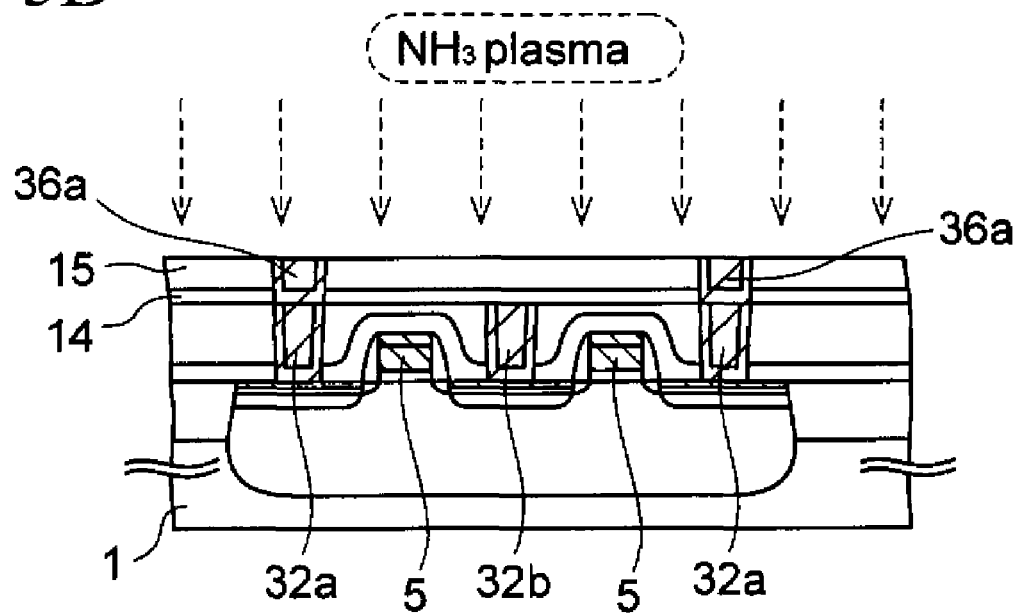
Figure 5E:
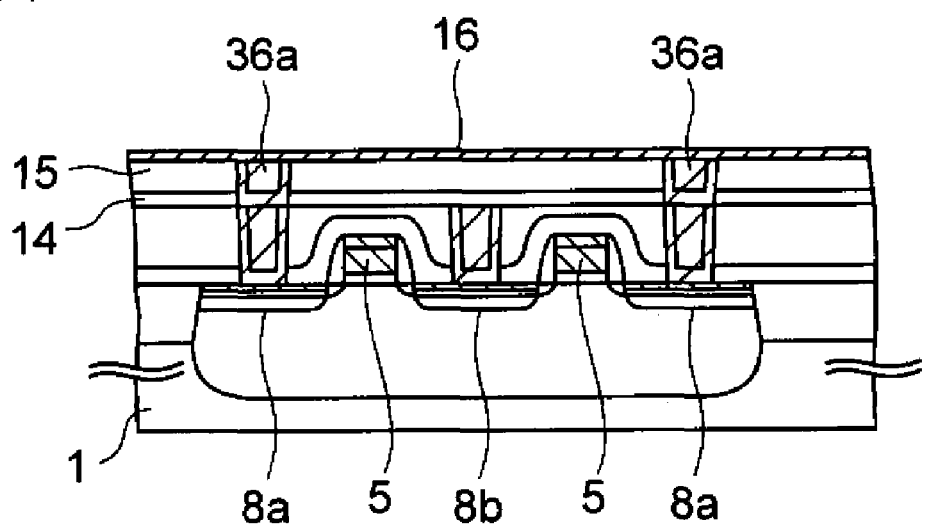
Figure 5F:
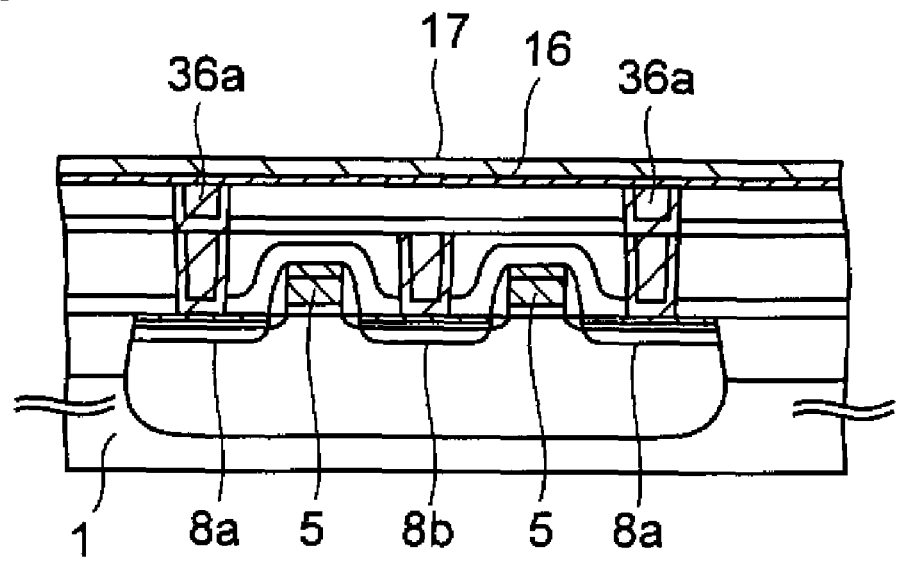
Figure 5G:
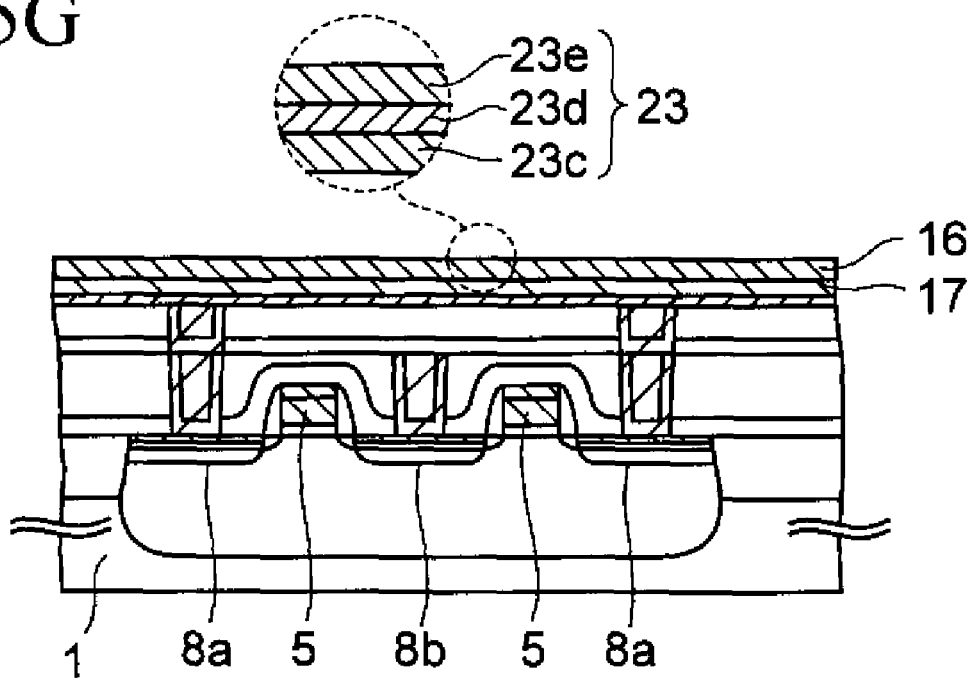
Figure 5H:
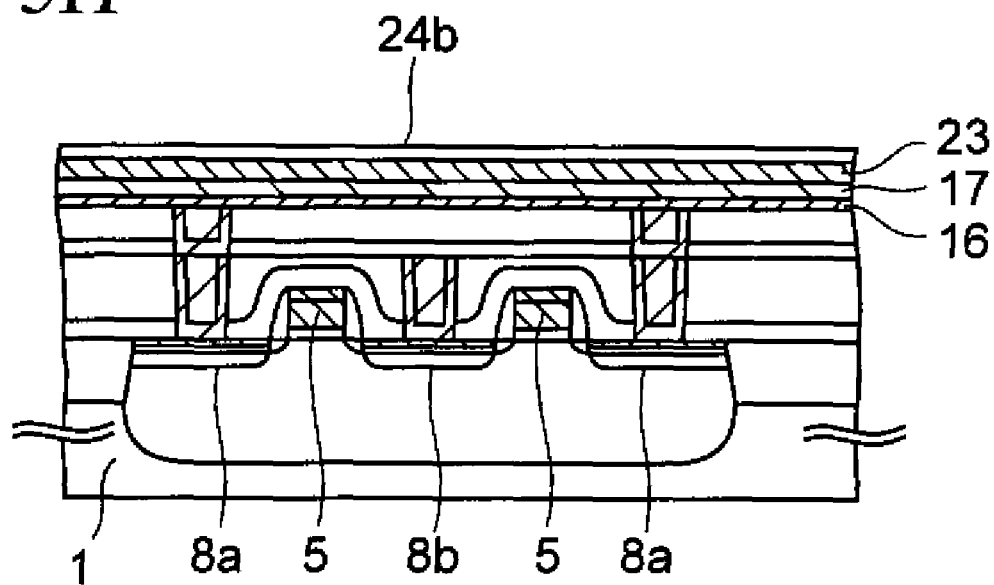
Figure 5I:
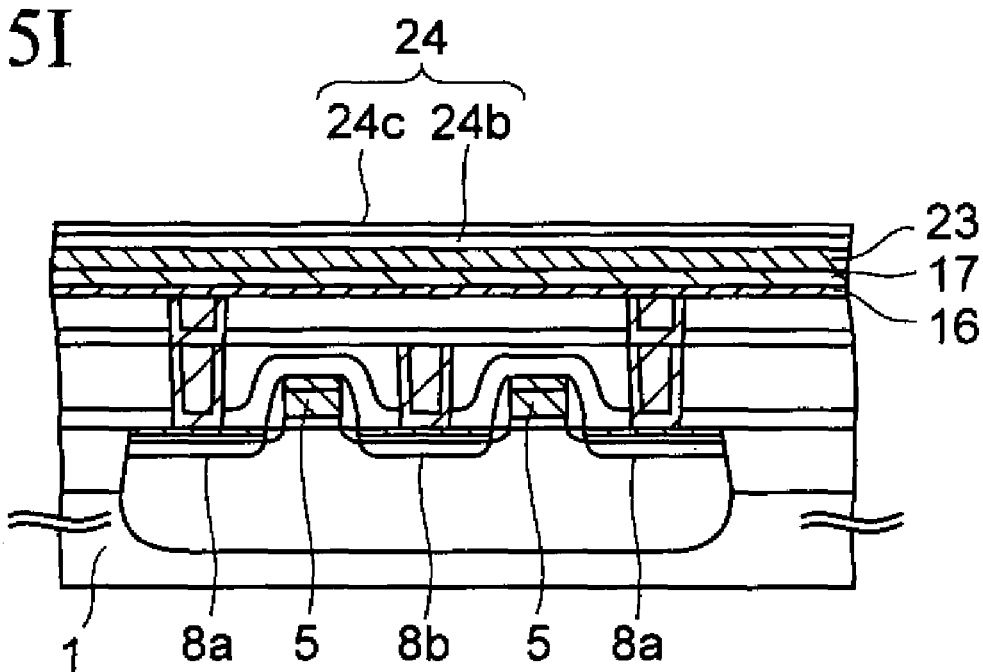
Figure 5J:
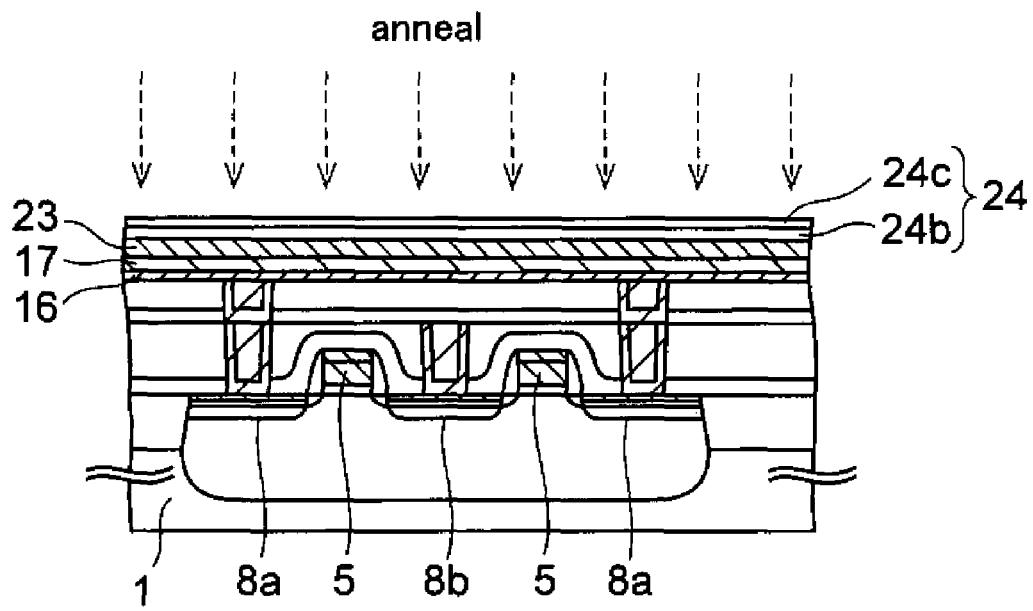
Figure 5K:
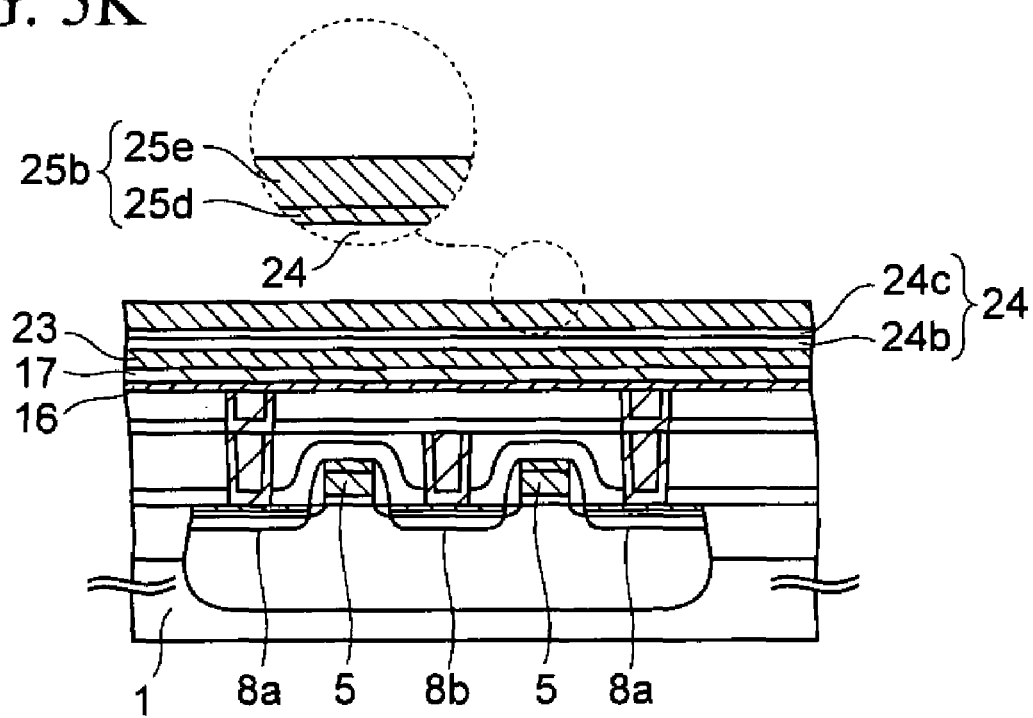
Figure 5L:
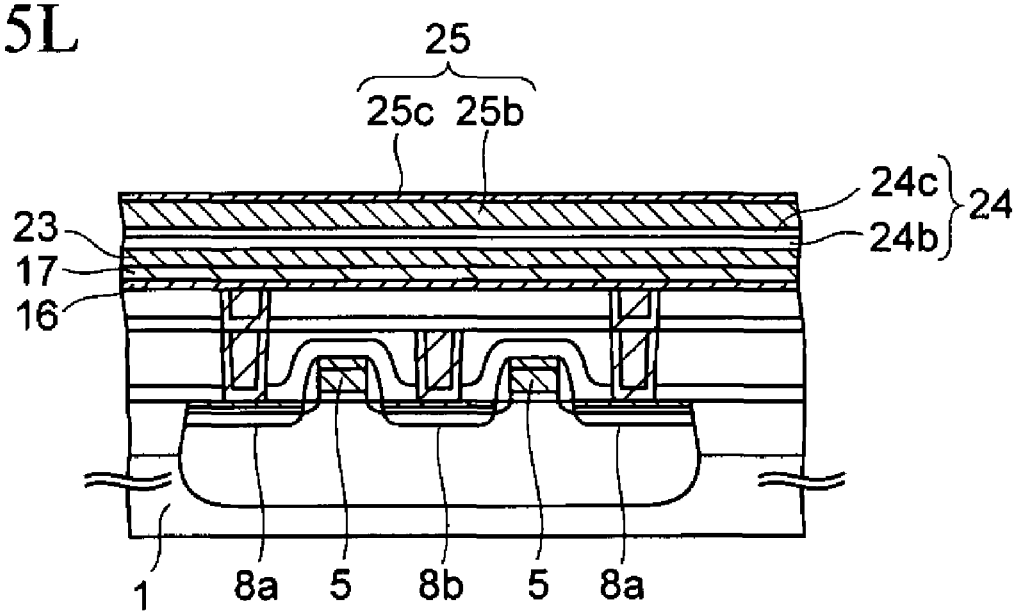
Figure 5M:
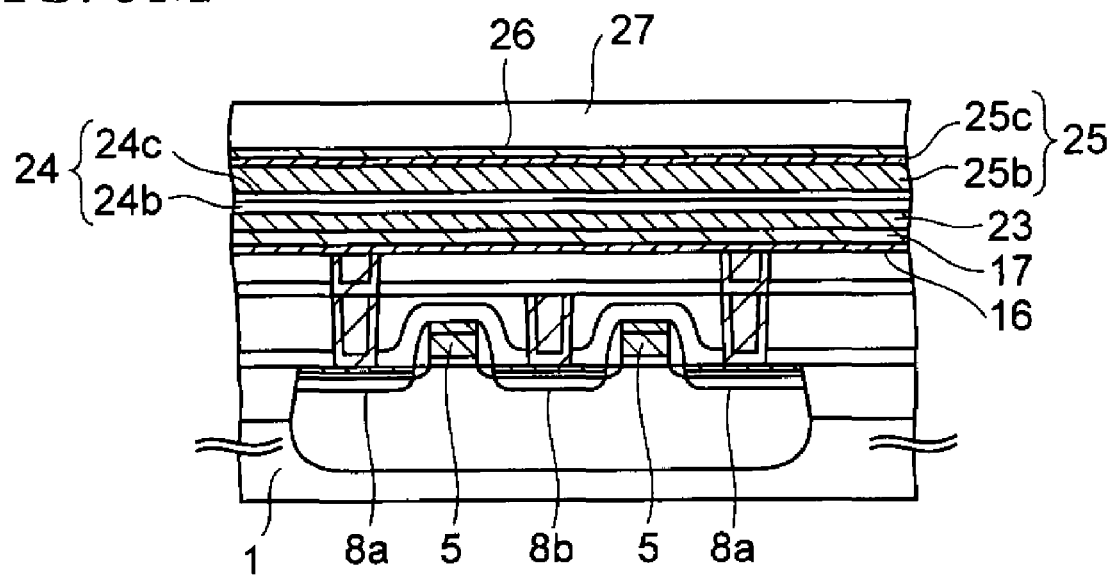
Figure 5N:
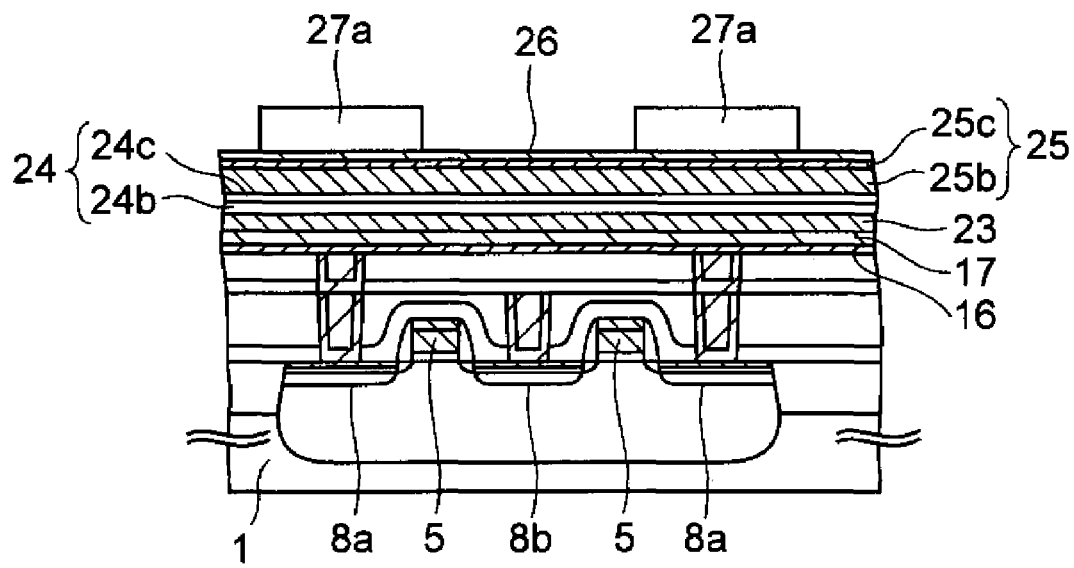
Figure 5O:
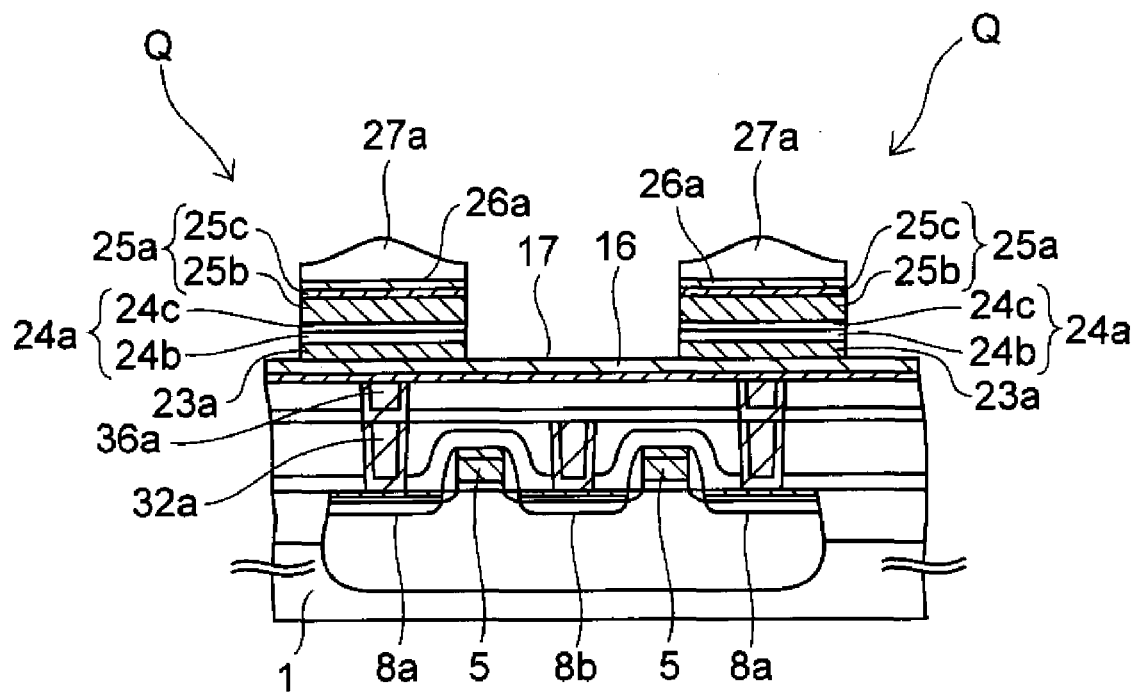
Figure 5P:
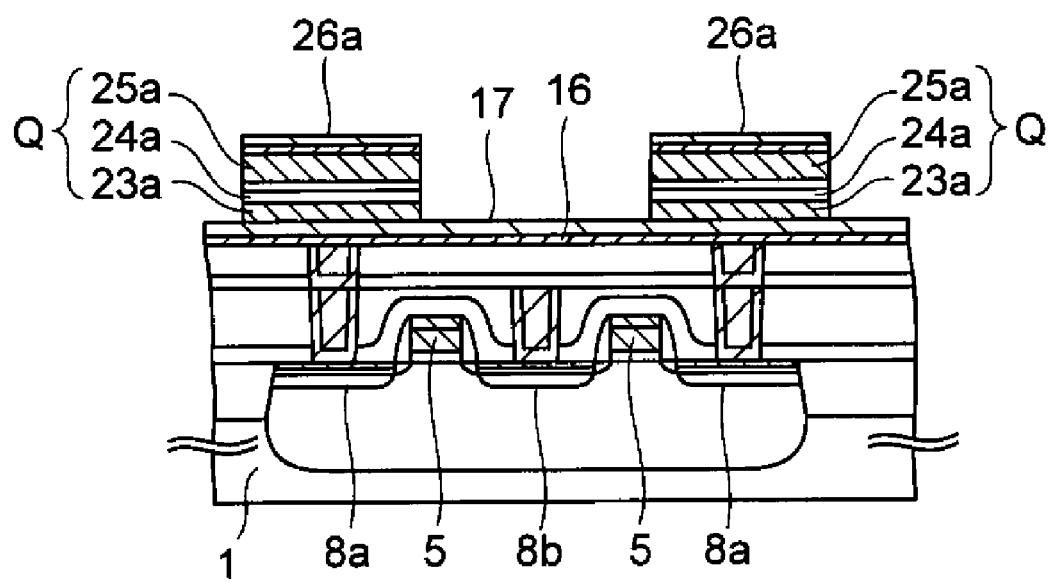
Figure 5Q:
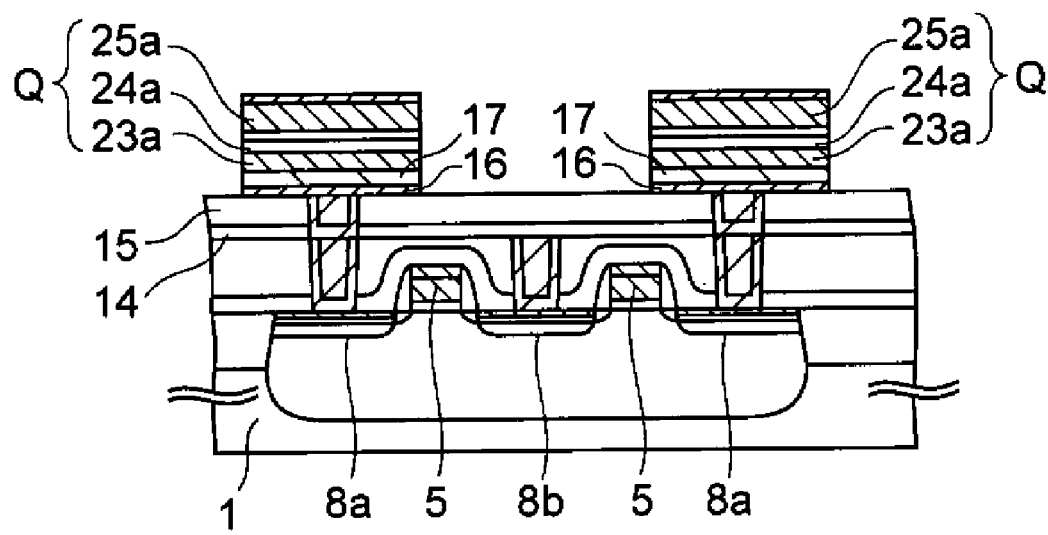
Figure 5R:
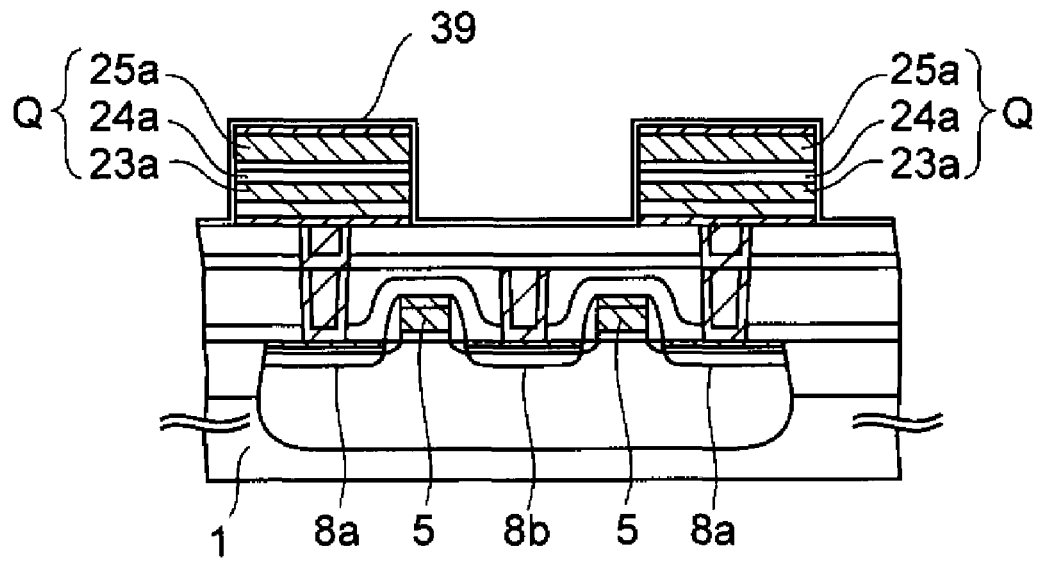
Figure 5S:
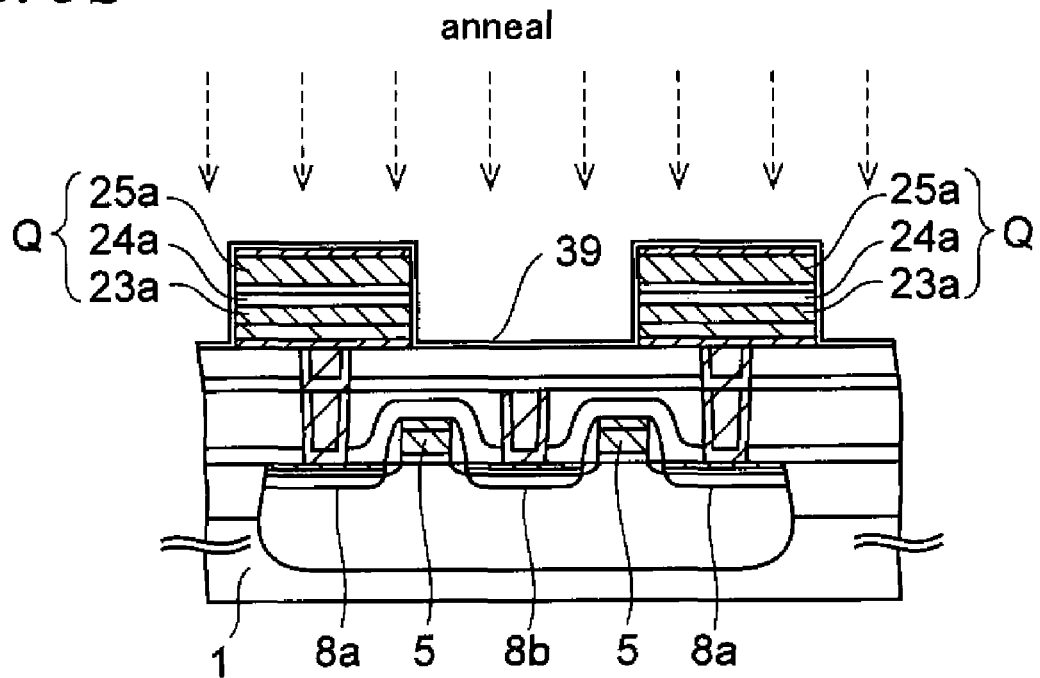
Figure 5T:
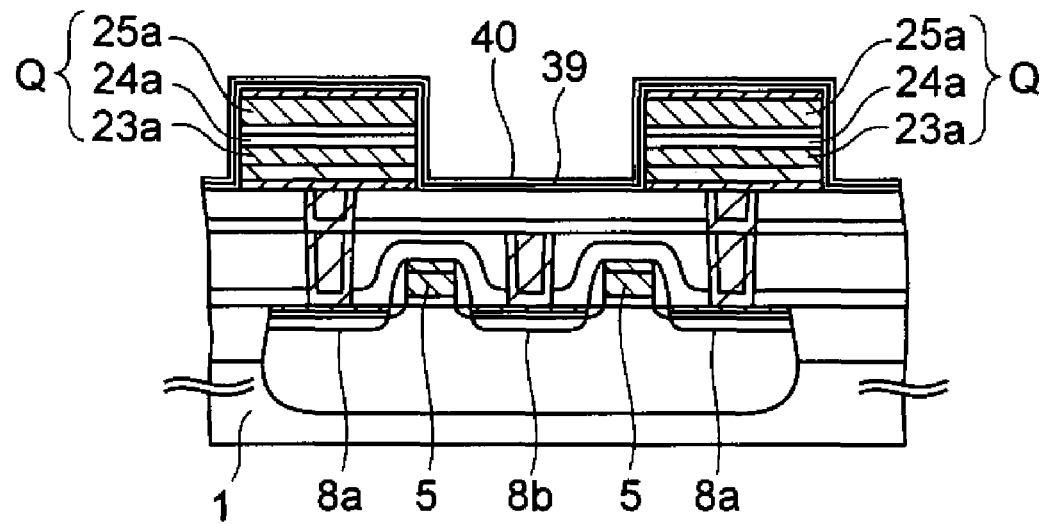
Figure 5U:
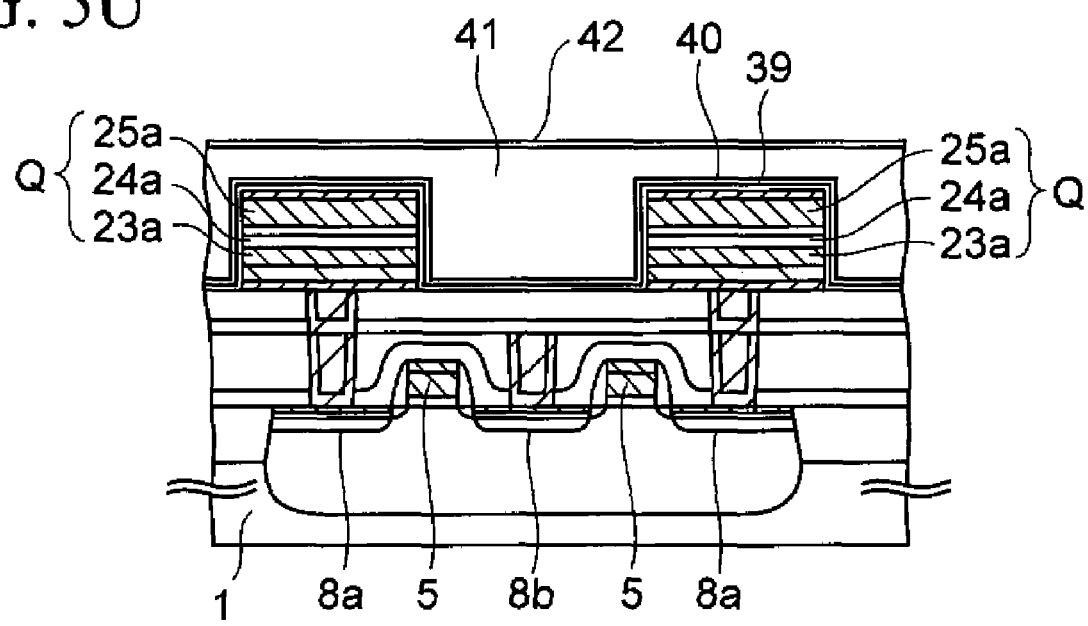
Figure 5V:
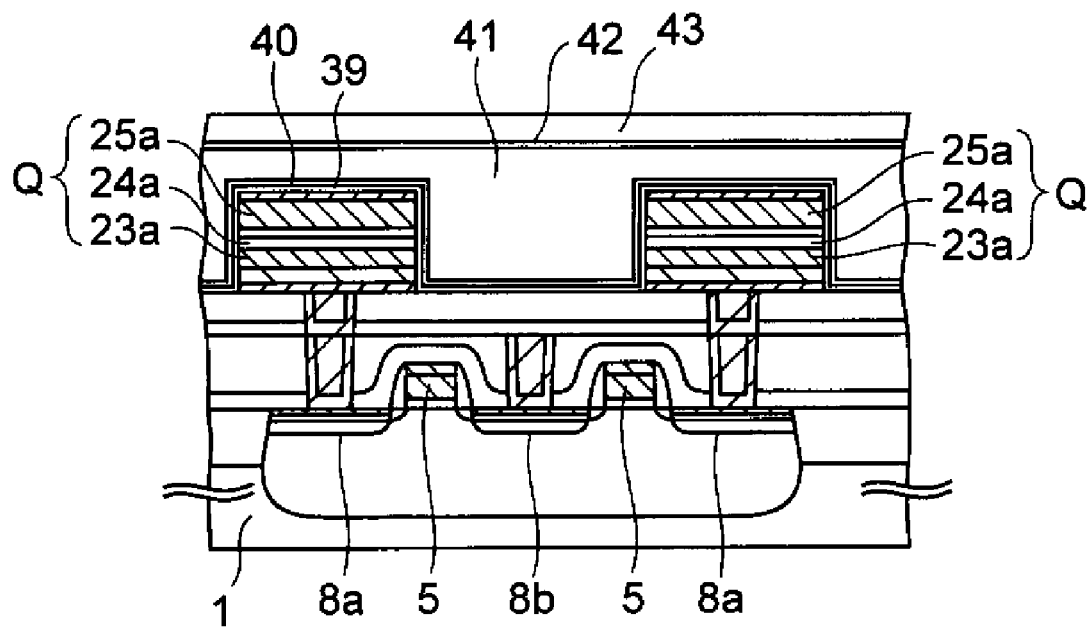
Figure 5W:
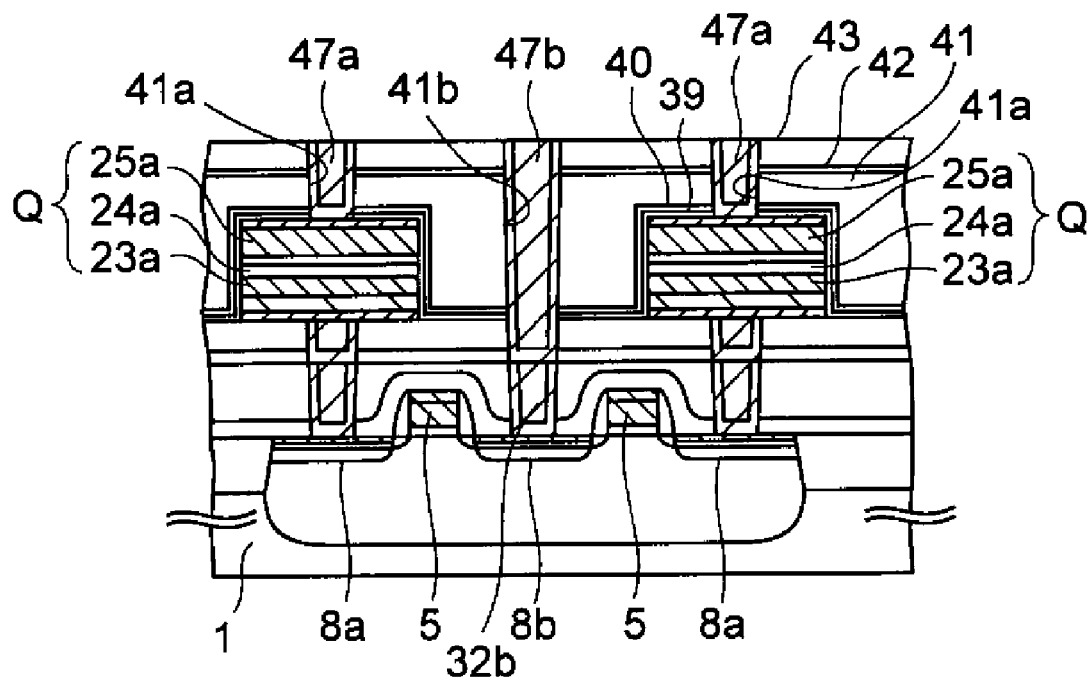
Figure 5X:
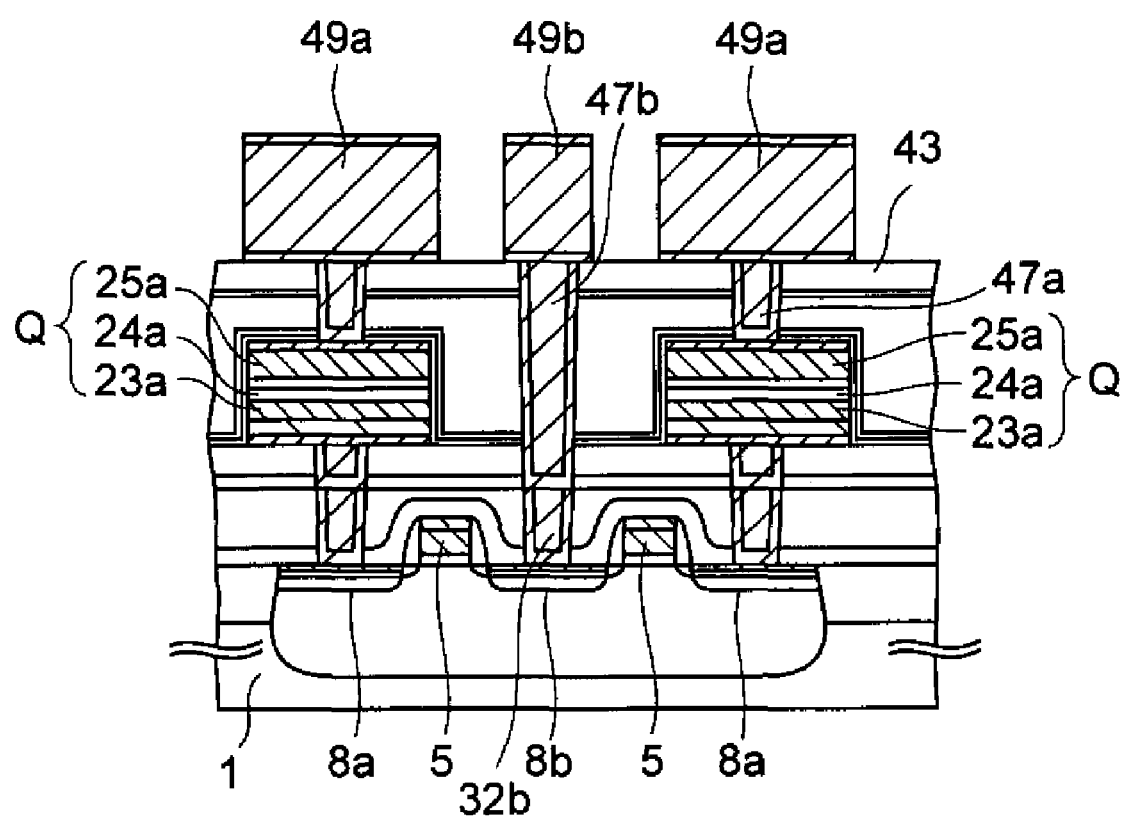

FIGS. 5A to 5X are cross-sectional views showing processes of manufacturing a semiconductor device according to the present embodiment.

This semiconductor device is a stacked-type FeRAM advantageous for miniaturization, and is formed as follows.

Firstly, steps for obtaining a cross-sectional structure shown in FIG. 5A will be described.

A groove for STI, which defines an active region of a transistor, is initially formed on a surface of an n-type or p-type silicon substrate 1. Then, an insulating film such as silicon oxide film is embedded therein. The resultant insulating film is used as a device isolation insulating film 2. Note that a device isolation structure is not limited to STI, and a device isolation insulating film 2 may be formed by a LOCOS method.

Next, by carrying out the same step as that of FIG. 1A of the first embodiment, first and second MOS transistors $TR_1$, and $TR_2$ formed of gate insulating films 4, gate electrodes 5, first and second source/drain regions 8a and 8b, and the like, are formed in the active region of the silicon substrate 1.

Subsequently, a silicon nitride (SiN) film is formed with a thickness of approximately 80 nm on an entire upper surface of the silicon substrate 1 by a plasma CVD method, and is used as a cover insulating film 10. Next, on this cover insulating film 10, a silicon oxide film is formed with a thickness of approximately 1000 nm, as a first interlayer insulating film 11 by a plasma CVD method using a TEOS gas.

Next, the upper surface of the first interlayer insulating film 11 is polished and planarized by a chemical mechanical polishing (CMP) method. As a result of this CMP, the thickness of the first interlayer insulating film 11 becomes approximately 700 nm on the flat surface of the silicon substrate 1.

Then, the cover insulating film 10 and the first interlayer insulating film 11 are patterned by photolithography to form contact holes each with a diameter of 0.25 µm respectively on the first and second source/drain regions 8a and 8b. Furthermore, a glue film and a tungsten film are sequentially formed inside each of the contact holes. After that, the excessive glue film and tungsten film on the first interlayer insulating film 11 are polished and removed by the CMP method, and these films are left only inside the contact holes as first and second conductive plugs 32a and 32b.

The first and second conductive plugs 32a and 32b are electrically connected to the first and second source/drain regions 8a and 8b, respectively.

Incidentally, the above-described glue film is configured by forming a titanium film with a thickness of approximately 30 nm and a titanium nitride film with a thickness of approximately 20 nm in this order. The tungsten film in a state before CMP has a thickness of approximately 300 nm on the first interlayer insulating film 11.

Here, since the first and second conductive plugs 32a and 32b are mainly formed of tungsten which is easily oxidized, contact defect may cause when the first and second conductive plugs 32a and 32b are oxidized during the manufacturing processes.

Consequently, as an antioxidant insulating film 14 for preventing the conductive plugs 32a and 32b from being oxidized, a silicon oxynitride film is formed with a thickness of approximately 130 nm on the conductive plugs 32a and 32b and on the first interlayer insulating film 11 by the plasma CVD method.

Note that a silicon nitride film or an alumina film, instead of the silicon oxynitride film, may be formed as the antioxidant insulating film 14.

After that, a silicon oxide film is formed with a thickness of approximately 300 nm on the antioxidant insulating film 14 by the plasma CVD method using a TEOS gas. This silicon oxide film is set to be a base insulating film 15.

Next, steps for obtaining a cross-sectional structure shown in FIG. 5B will be described.

Firstly, the base insulating film 15 and the antioxidant insulating film 14 are patterned, and thus first holes 15a are formed above the respective first conductive plugs 32a in these insulating films.

Next, a titanium nitride film is formed as a glue film 35 inside the first contact holes 15a and on the base insulating film 15 by the sputtering method.

Moreover, a tungsten film is formed on this glue film 35 as a plug conductive film 36 by the CVD method, and then the first holes 15a are completely embedded with the plug conductive film 35.

Subsequently, as shown in FIG. 5C, the excessive glue film 35 and plug conductive film 36 on the base insulating film 15 are polished and removed by the CMP method. With this process, the glue film 35 and the plug conductive film 36 are left inside the first holes 15a as third conductive plugs 36a electrically connected to the first conductive plugs 32a.

Slurry used in this CMP is such that a polishing speed for the glue film 35 and that for the plug conductive film 36, which are polishing targets, are faster than that for the base insulating film 15. For example, W2000 manufactured by Cabot Microelectronics Corporation is used. Moreover, in order not to leave polishing residuals on the base insulating film 15, a polishing amount in this CMP is set thicker than the total film thickness of the films 35 and 36, so that overpolishing is performed in this CMP.

Next, as shown in FIG. 5D, the base insulating film 15 formed of silicon oxide is exposed to plasma containing nitrogen, such as ammonia ($NH_3$) plasma, to bond an NH group with each oxygen atom on the surface of the base insulating film 15.

Equipment used for this ammonia plasma processing is, for example, a parallel plate-type plasma processing equipment having an opposing electrode in a position away from the silicon substrate by approximately 9 mm (350 mils). Then, this processing is carried out in the following manner. Specifically, while maintaining a substrate temperate at 400° C. under the pressure of 266 Pa (2 Torr), an ammonia gas is supplied to a chamber with a flow rate of 350 sccm, and high frequency power of 13.56 MHz and 350 kHz are respectively supplied, for 60 seconds, to the silicon substrate 1 with power of 100 W and to the above-described opposing electrode with power of 55 W.

Subsequently, as shown in FIG. 5E, a titanium film is formed with a thickness of approximately 20 nm on each of the base insulating film 15 and the third conductive plugs 36a. This titanium film is set to be a conductive adhesion film 16.

The film-forming conductions for the conductive adhesion film 16 are not particularly limited. In the present embodiment, the substrate temperature is set at 20° C. in the argon atmosphere of 0.15 Pa by using a sputtering chamber in which a distance between the silicon substrate 1 and a titanium target is set to be 60 nm. Then, DC power at 2. 6 kW is supplied to the chamber for 5 seconds to form the conductive adhesion film 16 made of titanium.

Here, the ammonia plasma processing (see FIG. 5D) is carried out in advance to bond the NH group with each oxygen atom on the surface of the base insulating film 15. Therefore, titanium atoms deposited on the base insulating film 15 are less likely to be captured by the oxygen atoms on the surface of the base insulating film 15. For this reason, the titanium atoms can freely move on the surface of the base insulating film 15, and thus it is made possible to form the conductive adhesion film 16 formed of titanium which is strongly self-oriented in a (002) direction.

After that, rapid thermal anneal (RTA) is carried out on the conductive adhesion film 16 in the nitrogen atmosphere with a substrate temperature of 650° C. and a processing time of 60 seconds. With this process, the conductive adhesion film 16 formed of titanium is nitrided, and the conductive adhesion film 16 of titanium nitride, which is oriented in a (111) direction, is formed.

Incidentally, a material of the conductive adhesion film 16 is not limited to titanium nitride. The conductive adhesion film 16 may be formed of any one of titanium, titanium nitride, platinum, iridium, rhenium, ruthenium, palladium, rhodium, and osmium, or an alloy thereof. In addition, the conductive adhesion film 16 may be formed of any one of platinum oxide, iridium oxide, ruthenium oxide and palladium oxide.

Next, as shown in FIG. 5F, a titanium aluminum nitride (TiAlN) film is formed, by a reactive sputtering method, with a thickness of 100 nm as a conductive oxygen barrier film 17 on the conductive adhesion film 16.

The conductive oxygen barrier film 17 formed of titanium aluminum nitride is superior in a function of preventing oxygen from being permeated, and plays a role of preventing occurrence of contact defect due to oxidation of the third conductive plugs 36a thereunder.

The film-forming conditions for the conductive oxygen barrier film 17 are not particularly limited. In the present embodiment, an alloy target of titanium and aluminum is used, and the mixed gas of an argon gas and a nitrogen gas is used as a sputtering gas. Then, the conductive oxygen barrier film 17 is formed under conditions with the flow rates of the argon gas and the oxygen gas at respectively 40 sccm and 100 sccm, pressure at 253.3 Pa, a substrate temperature at 400° C., and sputtering power at 1.0 kW.

Moreover, the material of the conductive oxygen barrier film 17 is not limited to titanium aluminum nitride. The conductive oxygen barrier film 17 may be formed of any one of titanium aluminum nitride, titanium aluminum oxynitride (TiAlON), tantalum aluminum nitride (TaAlN), and tantalum aluminum oxynitride (TaAlON).

The adhesion strength of the conductive oxygen barrier film 17 with the base is increased with the conductive adhesion film 16. If adhesion strength is not considered to be a problem, the conductive adhesion film 16 may be omitted. In this case, the conductive oxygen barrier film 17 is directly formed on each of the upper surfaces of the third conductive plugs 36a and the base insulating film 15.

Next, as shown in FIG. 5G, stacked film is formed by the sputtering method in the order of an iridium film 23c with a thickness of 50 to 100 nm, an iridium oxide film 23d with a thickness of approximately 30 nm, and a platinum film 23e with a thickness of approximately 50 nm. The stacked film formed of these films is used as a first conductive film 23.

The iridium film 23c constituting the first conductive film 23 is superior in barrier function against oxygen. Therefore, the first conductive film 23c functions as an oxygen barrier film against the third conductive plugs 36a, and is formed with a substrate temperature of 400° C., for example.

Meanwhile, the iridium oxide film 23d is formed at a low substrate temperature of 50° C., and is in an amorphous state without being crystallized. Thus, the crystalline orientation of the platinum film 23e, which is a self-oriented conductive film, is not disturbed by the amorphous iridium oxide film 23d, and is preferably oriented in the (111) direction.

An alloy film including platinum may be formed instead of the platinum film 23e on the uppermost layer.

Furthermore, a single-layer film of any one of an iridium film, a ruthenium film, an iridium oxide film, a ruthenium oxide film, a $SrRuO_3$ film, and a $LaSrCoO_3$ film may be formed as the first conductive film 23.

Thereafter, RTA with a substrate temperature of 650° C. or more is carried out on the first conductive film 23 in the argon atmosphere for 60 seconds. With this RTA, the adhesion among the films 23b to 23d constituting the first conductive film 23, and the adhesion between the first conductive film 23 and the conductive oxygen barrier film 17 are improved. In addition, the crystallinity of the first conductive film 23 is also improved. This RTA may be carried out in the nitrogen atmosphere, instead of in the argon atmosphere.

Next, as shown in FIG. 5H, a PZT film is formed with a thickness of approximately 80 nm on the first conductive film 23 by the metal organic CVD (MOCVD) method. This PZT film is set to be a first ferroelectric film 24b.

The MOCVD method is carried out as follows.

Firstly, the silicon substrate 1 is mounted on a susceptor inside an unillustrated reaction chamber.

Next, oxygen is introduced into the reaction chamber, and a temperature of the silicon substrate 1 is increased to be stabilized at about 620° C.

Then, a vaporized THF solvent is introduced into the reaction chamber. Thereby, the first conductive film 23 is exposed to the atmosphere of a solvent gas.

By supplying the solvent gas before a source gas in this manner, the source gas is prevented from being solidified in a vaporizer or in a pipe. Thus, problems, such as clogging of the pipe, can be avoided. Instead of TFT, vaporized butyl acetate may be used as the solvent gas.

Moreover, each of liquid sources of Pb, Zr, and Ti is vaporized in the vaporizer to form a source gas, and the forming of the PZT film is started by introducing each source gas into the reaction chamber.

Here, each liquid source may be made, for example, by dissolving each of $Pb(DPM)_2$ (chemical formula: $Pb(C_{11}H_{19}O_2)_2$), $Zr(dmhd)_4$ (chemical formula: $Zr(C_9H_{15}O_2)_4$), and $Ti(O\text{-}iOr)_2(DPM)_2$ (chemical formula: $Ti(C_3H_7O)_2(C_{11}H_{19}O_2)_2$) into a THF (Tetra Hydro Furan: $C_4H\,O$) solvent with a concentration of 0.3 mol/l. In addition, a flow rate of the vaporized source gas is not particularly limited. In the present embodiment, the source gases of Pb, Zr, and Ti are obtained by supplying the above-described liquid sources to the vaporizer respectively with the flow rates of 0.32 ml per minute, 0.200 ml per minute, and 0.200 ml per minute, and then by vaporizing thereof.

Then, such a state is maintained under the pressure of 665 Pa (5 Torr) for approximately 620 seconds. Thereby, the above-described PZT film is formed with a thickness of 80 nm.

The first ferroelectric film 24b formed by the MOCVD method in this manner is already crystallized at the time of film forming, and the crystalline orientation of the first ferroelectric film 24b is aligned in (111) direction. Accordingly, crystallization annealing for crystallizing the first ferroelectric film 24b is not necessary.

In addition, the use of the MOCVD method prevents ferroelectric characteristics of the first ferroelectric film 24b from being deteriorated even when the first ferroelectric film 24b is made thinner, which is advantageous in fabricating highly-integrated semiconductor devices. Such an advantage is easily obtained particularly in the stacked-type FeRAM of the present embodiment, which is advantageous for higher integration of capacitors.

Incidentally, when the first dielectric film 24b is crystallized in this manner, unevenness due to the crystal grains thereof are formed on the upper surface of the first ferroelectric film 24b. When the unevenness remains formed, such a problem arises that a voltage cannot be uniformly applied from an upper electrode to be described later, to the first ferroelectric film 24b.

To deal with this problem, in the present embodiment, as shown in FIG. 5I, a second ferroelectric film 24c is formed by the sol-gel method with a thickness of 20 to 30 nm on the first ferroelectric film 24b, and thus the unevenness on the upper surface of the first ferroelectric film 24b is embedded with the second ferroelectric film 24c.

The first ferroelectric film 24b is formed by the sol-gel method under the same conditions as those of the first embodiment, and a solution obtained by dissolving each of precursors of Pb, La, Zr, and Ti into a butanol solvent, with a concentration of 10 weight %, is used. Then, this solution is applied onto the first ferroelectric film 24b by the spin coating method to form one layer of a PLZT-coating film. After that, bake is carried out on the PLZT-coating film for approximately 5 minutes in the oxygen atmosphere having atmospheric pressure, at a substrate temperature of 200 to 450° C., for example 240° C. Thus, the above-described second ferroelectric film 24c is obtained.

By these steps, a ferroelectric film 24 constructed from the first and second ferroelectric films 24b and 24c is formed on the first conductive film 23.

Of these two films 24b and 24c, the second ferroelectric film 24c formed by the sol-gel method is formed for the purpose of embedding the unevenness of the upper surface of the first ferroelectric film 24b. Therefore, it is preferable that the second ferroelectric film 24c have a thickness thinner than that of the first conductive ferroelectric film 24b, and that the ferroelectric film 24 be mainly formed of the first ferroelectric film 24b.

Note that the second ferroelectric film 24c formed by the sol-gel method is not limited to the PLZT film.

The second ferroelectric film 24c may be formed of a ferroelectric material having an $ABO_3$-type perovskite structure (A represents any one of Bi, Pb, Ba, Sr, Ca, Na, K, and rare-earth elements, and B represents any one of Ti, Zr, Nb, Ta, W, Mn, Fe, Co, and Cr) similar to PLZT.

Furthermore, Bi layer structure compounds such as $(Bi_{1-x}R_x)Ti_3O_{12}$ (R is a rare-earth element with 0<x<1), $SrBi_2Ta_2O_9$ (SBT) and $SrBi_4Ti_4O_{15}$ may be used as a material constituting the second ferroelectric film 24c.

Here, the second ferroelectric film 24c formed by the sol-gel method is not crystallized at the time of film forming. Therefore, the second ferroelectric film 24c has poor ferroelectric characteristics in this state.

To deal with this problem, in the next step, as shown in FIG. 5J, crystallization annealing is carried out on the second ferroelectric film 24c in the atmosphere containing oxygen to crystallize the second ferroelectric film 24c.

The crystallization annealing is carried out by atmospheric-pressure RTA. Then, oxygen and argon, both of which have a flow rate of 1000 sccm, are supplied to the annealing atmosphere to carry out crystallization annealing for a processing time of 30 to 120 seconds, for example, 90 seconds.

In addition, a speed of raising a temperature for the crystallization annealing is also not particularly limited. In the present embodiment, the speed of raising a temperature is set at 40 to 150° C. per minute. To improve crystallinity of the second ferroelectric film 24c, it is preferable that the speed of raising a temperature thereof be set to be as fast as possible, for example, 125° C. per minute.

In contrast, when the maximum substrate temperature in this crystallization annealing is too high, the surface layer described in the first embodiment is formed on the second ferroelectric film 24c. As a result, the crystal grains of the second ferroelectric film 24c and the crystal grains of the first ferroelectric film 24b may possibly not be bonded with each other.

Accordingly, to suppress the formation of the surface layer, it is preferable that the lower limit of the maximum substrate temperature for the above-described annealing be set at a crystallization temperature (520° C.) of the second ferroelectric film 24b, and that the upper limit thereof be set to be a temperature 60° C. higher than the crystallization temperature. In the present embodiment, the maximum substrate temperature is set at 520 to 560° C., for example 550° C.

Since the lower limit of the maximum substrate temperature is set relatively low as described above, the crystallization develops from the lower surface of the second ferroelectric film 24c. Thus, the crystal grains of the second ferroelectric film 23c take over the crystal grains of the first ferroelectric film 24b. Accordingly, an interface is not easily formed between the ferroelectric films 24b and 24c, and unevenness of the second ferroelectric film 24c is suppressed.

Subsequently, as shown in FIG. 5K, an iridium oxide film is formed with a thickness of approximately 25 nm as a first conductive metal oxide film 25d on the ferroelectric film 24 by the sputtering method, while heating the silicon substrate 1. As described in the first embodiment, the iridium oxide film formed by the sputtering method in which the silicon substrate 1 is heated is already crystallized at the time of forming thereof without carrying out a process for crystallization of the iridium oxide film.

The film-forming conditions of the first conductive metal oxide film 25d are not particularly limited. In the present embodiment, the conditions are as follows. Specifically, while maintaining the substrate temperature at 300° C., the iridium target is used, and the mixed gas of an oxygen gas at the flow rate of 140 sccm and the argon gas at the flow rate of 60 sccm is used as a sputtering gas. In addition, the sputtering power is set at 1 to 2 kW.

Here, the ferroelectric film 24 may have been damaged by the sputtering gas at the time of forming the first conductive metal oxide film 25d with the sputtering method, and have insufficient oxygen concentration in the film. Therefore, ferroelectric characteristics of the ferroelectric film 24 may possibly be deteriorated.

To deal with the problem, by carrying out RTA in the mixed atmosphere of argon and oxygen after the above-described first conductive metal oxide film 25d is formed, the damages received in the ferroelectric film 24 due to sputtering are recovered, and the oxygen loss in the ferroelectric film 24 is compensated.

The conditions for this RTA are not particularly limited. In the present embodiment, a substrate temperature is set at 725°

C., and a processing time is set to be 60 seconds. In addition, flow rates of argon and oxygen are respectively set at 2000 sccm and 20 sccm. As in the case of the first embodiment, the example of the oxidizing gas in this RTA includes an ozone gas or a nitrogen dioxide gas, in addition to an oxygen gas.

Here, the first conductive metal oxide film 25d is crystallized at the time of film forming. Therefore, unevenness is formed on an interface between the first conductive metal oxide film 25d and the ferroelectric film 24, due to the crystal grains of the film 25d. This RTA can also provide an advantage that such unevenness is planarized.

Next, while maintaining the substrate temperature at room temperature, an iridium oxide film is formed by the sputtering method with a thickness of approximately 100 to 300 nm, for example, 200 nm, as a second conductive metal oxide film 25e on the first conductive metal oxide film 25d. The second conductive metal oxide film 25e is formed in the argon atmosphere having pressure of 0.8 Pa with the sputtering power set at 1.0 kW and a film-forming time for 79 seconds.

Here, unlike the first conductive metal oxide film 25d crystallized at a high film-forming temperature, the second conductive metal oxide film 25e formed by the sputtering method with a substrate temperature of room temperature is made to be in an amorphous state.

This second conductive metal oxide film 25e is formed in order to prevent the ferroelectric film 24 from being deteriorated. Therefore, it is preferable that an oxidation number of iridium oxide constituting the second conductive metal oxide film 25e be set as large as possible so as to suppress the reducing action of the second conductive metal oxide film 25e to water. To increase the oxidation number in this manner, it suffices that a flow rate ratio of oxygen in the sputtering gas be increased in comparison with that in the case of forming the first conductive metal oxide film 25d. With this process, iridium grains flying from the iridium target are sufficiently oxidized in the sputtering atmosphere. Thus, it is made possible to form an iridium oxide film with an oxidation number close to that of stoichiometry composition ($IrO_2$).

As shown in FIG. 5K, a conductive metal oxide film 25b is constructed from the second conductive metal oxide film 25e and the first conductive metal oxide film 25d.

Incidentally, the material constituting the first and second conductive metal oxide films 25d and 25e is not limited to iridium oxide. The first and second conductive metal oxide films 25d and 25e may be formed of an oxide of any one of iridium, ruthenium, rhodium, rhenium, and osmium. Furthermore, these oxides may be stacked as the conductive metal oxide film 25b.

Next, as shown in FIG. 5L, an iridium film is formed with a thickness of 50 to 100 nm on the conductive metal oxide film 25b as a conductivity enhancing film 25c by the sputtering method. The sputtering method is carried out in the argon atmosphere with the pressure of 1 Pa, and the sputtering power of 1.0 kW is applied to the sputtering atmosphere.

The conductivity enhancing film 25c constitutes a second conductive film 25 together with the conductive metal oxide film 25b thereunder to play a role of providing compensation to conductivity of the second conductive film 25 that tends to be insufficient only with the conductive metal oxide film 25b.

The conductivity enhancing film 25c is not limited to the iridium film. The conductivity enhancing film 25c may be formed of any one of iridium, platinum, ruthenium, rhodium, rhenium, osmium, and palladium, or an oxide thereof.

After that, the back surface of the silicon substrate 1 is cleaned.

Next, as shown in FIG. 5M, a titanium nitride film is formed on the second conductive film 25 by the sputtering method, and the titanium nitride film is set to be a first mask material layer 26.

Furthermore, a silicon oxide film is formed as a second mask material layer 27 on the first mask material layer 26 by using the plasma CVD method using a TEOS gas.

Subsequently, as shown in FIG. 5N, the second mask material layer 27 is patterned to form second hard masks 27a each in an island-shape.

Next, steps for obtaining a cross-sectional structure shown in FIG. 5O will be described.

Firstly, a first hard mask 26a is formed by etching the first mask material layer 26 with the second hard mask 27a used as masks.

Subsequently, portions of the films 23 to 25 not covered with the first and second hard masks 26a and 27a are patterned by dry etching.

By these steps, the first conductive film 23, the ferroelectric film 24, and the second conductive film 25 are respectively made to be a lower electrode 23a, a capacitor dielectric film 24a, and an upper electrode 25a, which form ferroelectric capacitor Q.

A gas for the dry etching is not particularly limited, and the mixed gas of HBr and oxygen is used as the etching gas for the first and second conductive films 23 and 25. On the other hand, the mixed gas of chlorine and argon is used as the etching gas for the ferroelectric film 24. Note that a $C_4F_8$ gas may be added to these gases.

The conductive oxygen barrier film 17 has etching tolerance against the etching gas for the first conductive film 23. Therefore, the conductive oxygen barrier film 17 is left on the entire surface of the conductive adhesion film 16 even after the capacitors Q are formed.

Each of the capacitors Q formed in this manner is electrically connected to the corresponding first conductive plug 32a via the conductive oxygen barrier film 17, the conductive adhesion film 16, and the third conductive plug 36a.

Subsequently, as shown in FIG. 5P, by using the mixed solution of hydrogen peroxide ($H_2O_2$), ammonia, and water as an etching solution, the second hard mask 27a formed of silicon oxide is removed by wet etching. Note that the second hard mask 27a may be removed by dry etching.

Next, steps for obtaining a cross-sectional structure shown in FIG. 5Q will be described.

Firstly, while using the first hard masks 26a as masks, the conductive adhesion film 16 and the conductive oxygen barrier film 17 are etched, and these films are left only under each capacitor Q. This etching is carried out with dry etching, and the mixed gas of argon and chlorine, for example, is used as an etching gas.

In addition, the first hard masks 26a are also etched by the etching gas. As a result, the first hard masks 26a are removed when the etching is completed, and an upper surface of the upper electrode 25a is exposed.

Next, as shown in FIG. 5R, an alumina film covering each capacitor Q is formed with a thickness of approximately 20 nm, and the alumina film is set to be a first capacitor protective insulating film 39. Alumina constituting the first capacitor protective insulating film 39 is has an excellent capability of preventing hydrogen from permeated. Thus, hydrogen on the outside is blocked by this first capacitor protective insulating film 39, and thereby deterioration of the capacitor dielectric film 24a due to hydrogen can be prevented.

Here, the capacitor dielectric films 24a have received damages due to dry etching at the time of forming the capacitors Q (see FIG. 5O) and by the sputtering method at the time of forming the first capacitor protective insulating film 39.

In order to recover the damages in the capacitor dielectric films 24a, as shown in FIG. 5S, recovery annealing is carried out on the capacitor dielectric film 24a in the atmosphere containing oxygen. The conditions for this recovery annealing are not particularly limited. In the present embodiment, a substrate temperature is set at 550 to 700° C., for example, 650° C. in a furnace, and a processing time is set to be approximately 60 minutes.

Subsequently, as shown in FIG. 5T, an alumina film is formed with a thickness of approximately 20 nm on the first capacitor protective insulating film 39 by the CVD method. This alumina film is set to be a second capacitor protective insulating film 40.

Next, steps for obtaining a cross-sectional structure shown in FIG. 5U will be described.

Firstly, a silicon oxide film is formed as a second interlayer insulating film 41 on the second capacitor protective insulating film 40 by plasma CVD using a TEOS gas as a reactant gas. The reactant gas includes an oxygen gas and a helium gas. In addition, the thickness of the second interlayer insulating film 41 is not particularly limited but, in the present embodiment, the thickness on the planarized surface of the silicon substrate 1 is set to be 1500 nm.

Instead of the silicon oxide film, an insulating inorganic film may be formed as the second interlayer insulating film 41.

After that, the surface of the second interlayer insulating film 41 is polished and planarized by the CMP method.

Furthermore, the surface of the second interlayer insulating film 41 is exposed to $N_2O$ plasma as dehydration processing to the second interlayer insulating film 41. With this $N_2O$ plasma, moisture remaining inside the second interlayer insulating film 41 is removed, and moisture is prevented from again absorbed into the second interlayer insulating film 41.

Note that $N_2$ plasma processing may be carried out as the dehydration processing.

Next, a flat alumina film is formed with a thickness of approximately 20 to 100 nm on the second interlayer insulating film 41 by the sputtering method. This alumina film is set to be a third capacitor protective insulating film 42. The third capacitor protective insulating film 42 is formed on the planarized second interlayer insulating film 41. Hence, the third capacitor protective insulating film 42 does not need to have excellent coverage characteristics, and is formed by the low-cost sputtering method as described above. However, a method for forming the third capacitor protective insulating film 42 is not limited to the sputtering method, and the CVD method may be used.

Thereafter, as shown in FIG. 5V, a silicon oxide film is formed with a thickness of 300 to 500 nm as a cap insulating film 43 on the third capacitor protective insulating film 42, by using the plasma CVD method using a TEOS gas. Note that a silicon oxynitride film or a silicon nitride film may be formed as the cap insulating film 43.

Next, steps for obtaining a cross-sectional structure shown in FIG. 5W will be described.

Firstly, the first to third capacitor protective insulating films 39, 40, and 42, the second interlayer insulating film 41, and the cap insulating film 43 are patterned to form second holes 41a on the respective upper electrodes 25a in these films.

Subsequently, to recover damages received in the capacitor dielectric film 24a during the above steps, the silicon substrate 1 is placed in an unillustrated furnace, and recovery annealing is carried out in the oxygen atmosphere with a substrate temperature of 550° C. for approximately 40 minutes.

Next, the first to third capacitor protective insulating films 39, 40, and 42, the second interlayer insulating film 41, the cap insulating film 43, the base insulating film 15, and the antioxidant insulating film 14 on the second conductive plug 32b are patterned to form a third hole 41b in these films.

Note that the second holes 41a are covered with a resist pattern at the time of patterning. Therefore, the second holes 41a are protected from the etching atmosphere by the resist pattern.

Here, if these holes 41a and 41b are formed simultaneously, the following problem occurs. Specifically, the capacitor dielectric films 24a are deteriorated since the upper electrodes 25a in the second holes 41a are exposed to the etching atmosphere for a long time until the deep third hole 41b is opened.

In the present embodiment, since the second and third holes 41a and 41b with different depths are formed separately from each other as described above, such a problem can be avoided.

Furthermore, the second conductive plug 32b on the second source/drain region 8b is covered with the antioxidant insulating film 14 until the present step is completed. Therefore, contact defect caused by oxidation of tungsten constituting the second conductive plug 32b is prevented.

Next, by the sputtering method, a titanium film and a titanium nitride film are formed in this order as a glue film on the cap insulating film 43 and inside the second and third holes 41a and 41b.

Incidentally, the titanium nitride film may be also formed by the MOCVD method. In this case, it is preferable that annealing be carried out on the titanium nitride film in an atmosphere containing plasma of nitrogen and hydrogen to remove carbon from the titanium nitride film. Even when the annealing is carried out in the atmosphere containing hydrogen in this manner, the conductivity enhancing film 25c (see FIG. 5L) made of iridium formed on the uppermost layer of the upper electrode 25a blocks hydrogen. Accordingly, the conductive metal oxide film 25b is not reduced by hydrogen.

Furthermore, a tungsten film is formed on the glue film by the CVD method, and the second and third holes 41a and 41b are completely embedded by this tungsten film.

Then, the excessive glue film and tungsten film on the cap insulating film 43 are polished and removed by the CMP method, and these films are left as fourth and fifth conductive plugs 47a and 47b only inside the second and third holes 41a and 41b.

Of these conductive plugs 47a and 47b, the fourth conductive plugs 47a are electrically connected to the respective upper electrodes 25a of the capacitors Q. On the other hand, the fifth conductive plug 47b is electrically connected to the second conductive plug 32b to construct one portion of a bit line together with the second conductive plug 32b.

After that, as shown in FIG. 5X, a metal laminated film is formed on each of the cap insulating film 43 and the conductive plugs 47a and 47b by the sputtering method. The metal laminated film is patterned to form metal wirings 49a and a conductive pad 49b for the bit line.

As the metal laminated film, films are formed in the order of a titanium film with a thickness of 60 nm, a titanium nitride film with a thickness of 30 nm, a copper-containing aluminum film with a thickness of 360 nm, a titanium film with a thickness of 5 nm, and a titanium nitride film with a thickness of 70 nm.

Thereby, a basic structure of the semiconductor device according to the present invention is completed.

In the above-described embodiment, as shown in FIG. 5I, the second ferroelectric film 24c is formed by the sol-gel method on the first ferroelectric film 24b formed by the MOCVD method.

With this process, the unevenness formed on the upper surface of the first ferroelectric film 24b due to the crystal grains of the PZT are embedded by the second ferroelectric film 24c. Thus, the interface between the capacitor dielectric film 24a and the upper electrode 25a is made flat, and thus the voltage can be uniformly applied from the upper electrodes 25a to the capacitor dielectric film 24a.

Furthermore, as in the case of the first embodiment, in the present embodiment, the first conductive metal oxide film 25d made of iridium oxide is formed on the second ferroelectric film 24c formed by the sol-gel method. Thus, in the step of forming the first conductive metal oxide film 25d, by utilizing the fact that the switching charge of the capacitor dielectric film 24a increases as the flow rate ratio of oxygen in the sputtering gas increases, the switching charge Qsw can be adjusted by the above flow rate ratio of oxygen.

Incidentally, in the present embodiment, as shown in FIG. 5J, crystallization annealing is carried out to crystallize the second ferroelectric film 24c.

The inventors studied the impacts of a substrate temperature on the capacitor dielectric films 24a at the time of performing crystallization annealing on the capacitor dielectric film 24a.

Figure 6:
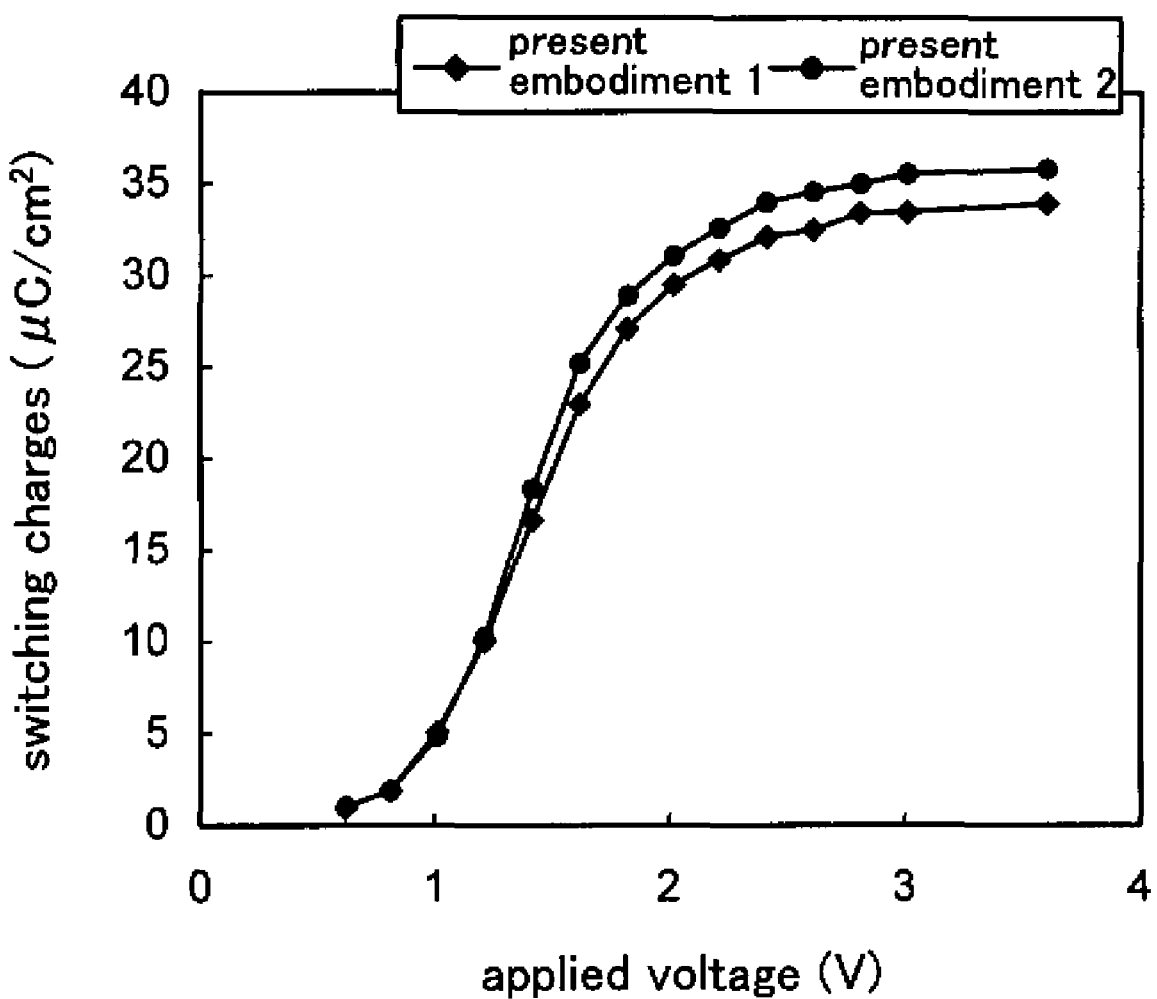
FIG. 6 is a graph obtained by studying a relationship between an applied voltage to a capacitor and the switching charge in a case where the capacitor is separately formed on a silicon substrate.
Figure 7:
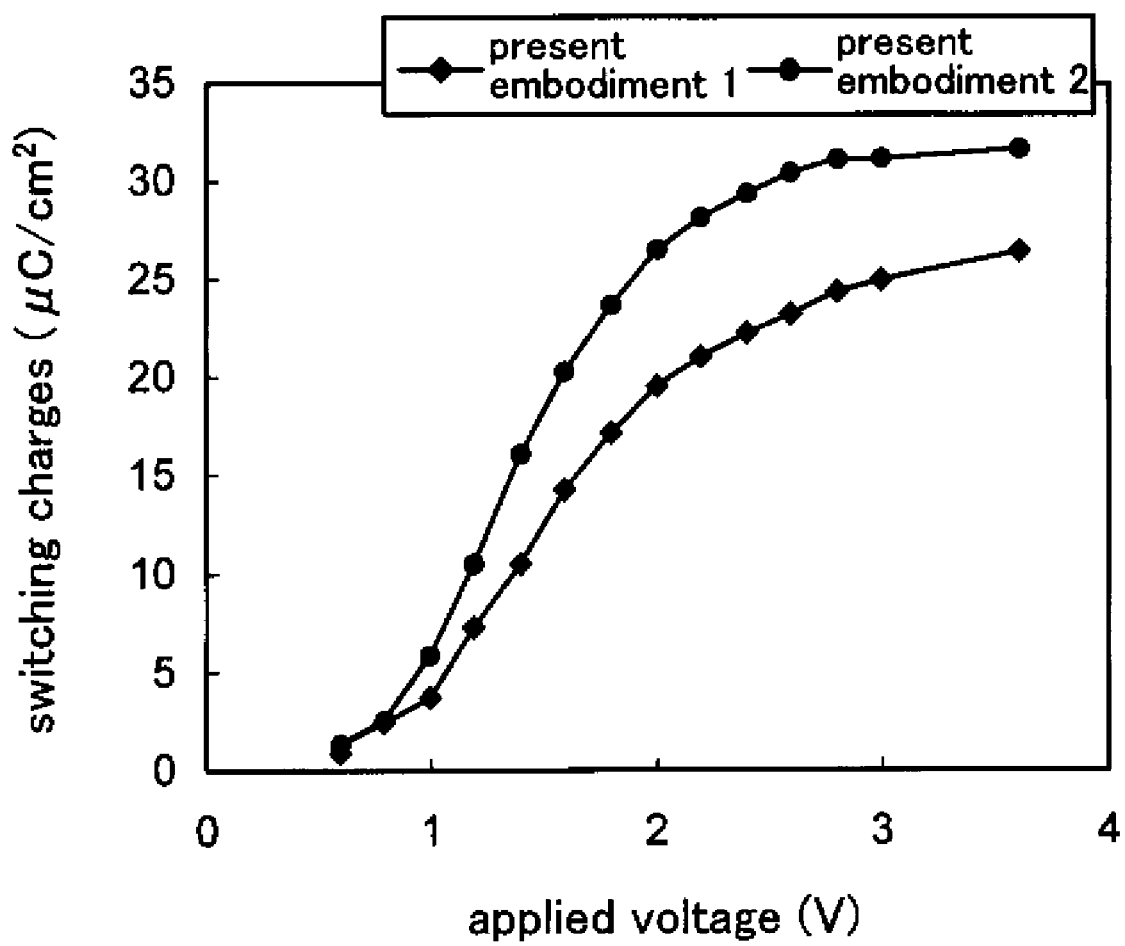
FIG. 7 is a graph obtained by studying a relationship between an applied voltage to a capacitor and the switching charge in a case where a plurality of capacitors are integrally formed on a silicon substrate.

Results of the study are shown in FIGS. 6 and 7.

The study shown in FIG. 6 was carried out on a separated capacitor formed on a silicon substrate. The capacitor had a square planar shape with a length of one side thereof being 50 µm.

On the other hand, the study shown in FIG. 7 was carried out on 5152 capacitors integrally formed on a silicon substrate. Each of the capacitors had a square planar shape with a length of one side thereof being 50 µm.

Note that in each of FIGS. 6 and 7, the graph shown by the present embodiment 1 was obtained by carrying out the above-described crystallization annealing at a substrate temperature of 550° C. On the other hand, the graph shown by the present embodiment 2 was obtained by carrying out crystallization annealing at a substrate temperature of 500° C.

According to the results of the studies, in both of the cases where the separated capacitors were formed (FIG. 6), and where the capacitors were integrally formed (FIG. 7), the switching charge Qsw of the capacitor was larger in the present embodiment 1 in which crystallization annealing was carried out at a low temperature.

The reason why the switching charge Qsw becomes low when crystallization annealing is carried out at a high temperature is considered as follows. That is, when the substrate temperature at the time of the crystallization annealing is high, crystallization of the second ferroelectric film 24c progresses rapidly. Therefore, unevenness reflecting the PLZT crystal grains is formed on the upper surface of the second ferroelectric film 24c, so that a voltage cannot be effectively applied to the capacitor dielectric film 24a from the upper electrode 25a.

On the other hand, when crystallization annealing is carried out at a low temperature, the second ferroelectric film 24c is crystallized slowly. Therefore, the crystal grains of the second ferroelectric film 24c take over the crystal grains of the first ferroelectric film 24b, and thereby sizes of the unevenness on the upper surface of the second ferroelectric film 24c are made small. Accordingly, the interface between the second ferroelectric film 24c and the upper electrode 25a is made substantially flat, so that the bulk of the voltage applied from the upper electrodes 25a is applied to the capacitor dielectric films 24a. Thus, the switching charge is considered to increases as described above.

The results of the studies has made it clear that crystallization annealing on the second ferroelectric film 24c is preferably carried out at a substrate temperature of less than 550° C.

(3) Third Embodiment

FIGS. 8A to 8L are cross-sectional views showing processes for manufacturing a semiconductor device according to a third embodiment of the present invention. Note that, in FIGS. 8A to 8L, the same reference numerals as those of the second embodiment denote elements described in the second embodiment, and descriptions thereof will be omitted below.

In the step of FIG. 5C of the second embodiment, the third conductive plugs 36a are formed by polishing the glue film 35 and the plug conductive film 36 by the CMP method.

However, the polishing speeds of the slurry used in this CMP for the glue film 35 and the plug conductive film 36 are faster than that of the base insulating film 15. Therefore, it is difficult to align heights of the respective upper surfaces of the third conductive plugs 36a and the base insulating film 15 at the time when the CMP is finished.

Figure 8A:
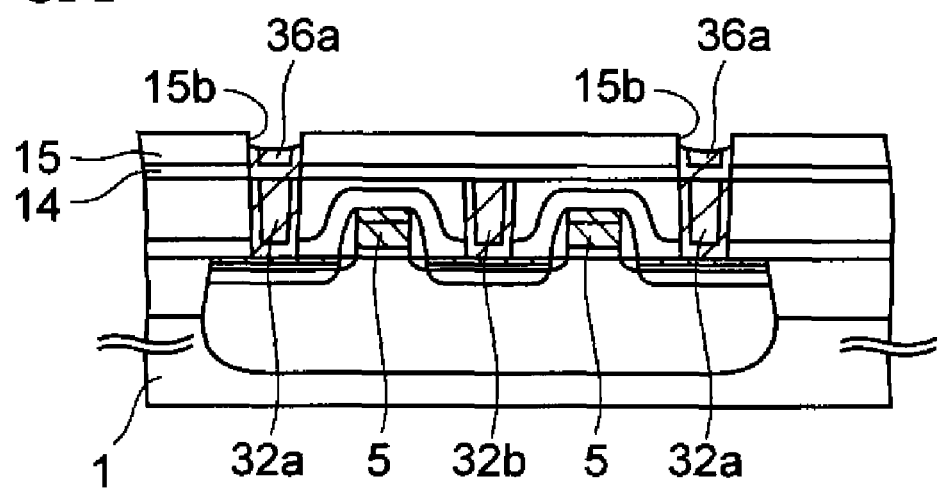
FIGS. 8A to 8L are cross-sectional views showing processes of manufacturing a semiconductor device according to a third embodiment of the present invention.

Consequently, as shown in FIG. 8A, recesses 15b are actually formed in the base insulating film 15 after the above-described CMP, and the height of each upper surface of the third conductive plug 36a is made lower than that of the base insulating film 15. The depth of each recess 15b is 20 to 50 nm, and is typically about 50 nm.

However, when such recesses 15b are present, the crystalline orientation of the lower electrodes 23a and the capacitor dielectric films 24a is disturbed, and this causes a problem that ferroelectric characteristics of the capacitor dielectric films 24a are deteriorated.

To solve this problem, following steps are carried out in the present embodiment.

Figure 8B:
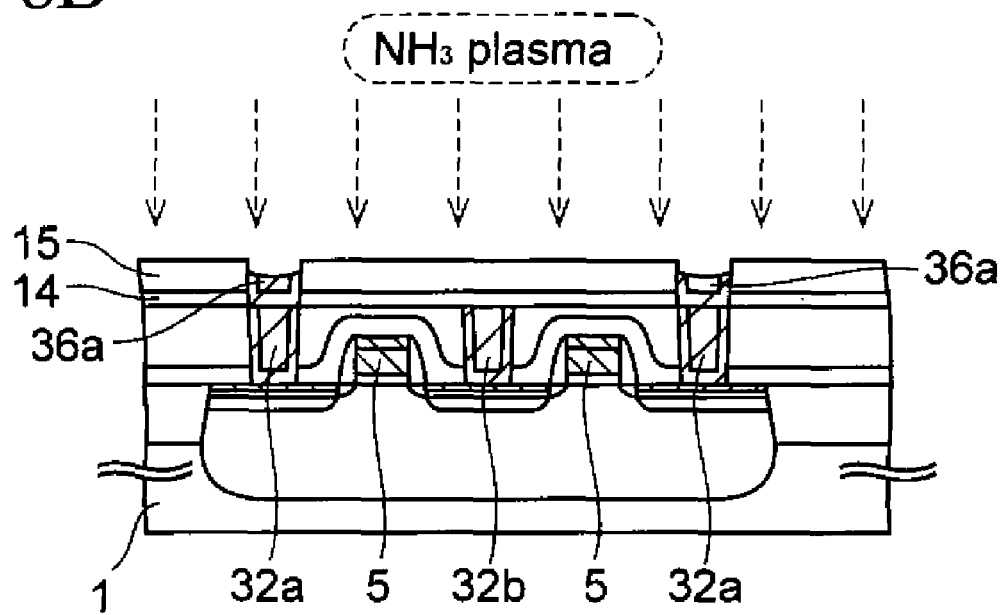

Firstly, as shown in FIG. 8B, ammonia plasma processing is carried out on the base insulating film 15 to bond an NH group with each oxygen atom on the surface of the base insulating film 15.

Equipment used for this ammonia plasma processing is, for example, a parallel plate-type plasma processing equipment having an opposing electrode in a position away from the silicon substrate 1 by approximately 9 mm (350 mils). Then, this processing is carried out in the following manner. Specifically, while maintaining the substrate temperate at 400° C. under the pressure of 266 Pa (2 Torr), an ammonia gas is supplied to the inside of a chamber with a flow rate of 350 sccm, and high frequency power of 13.56 MHz and 350 kHz are respectively supplied, for 60 seconds, to the silicon substrate 1 with power of 100 W and to the above-described opposing electrode with power of 55 W.

Figure 8C:
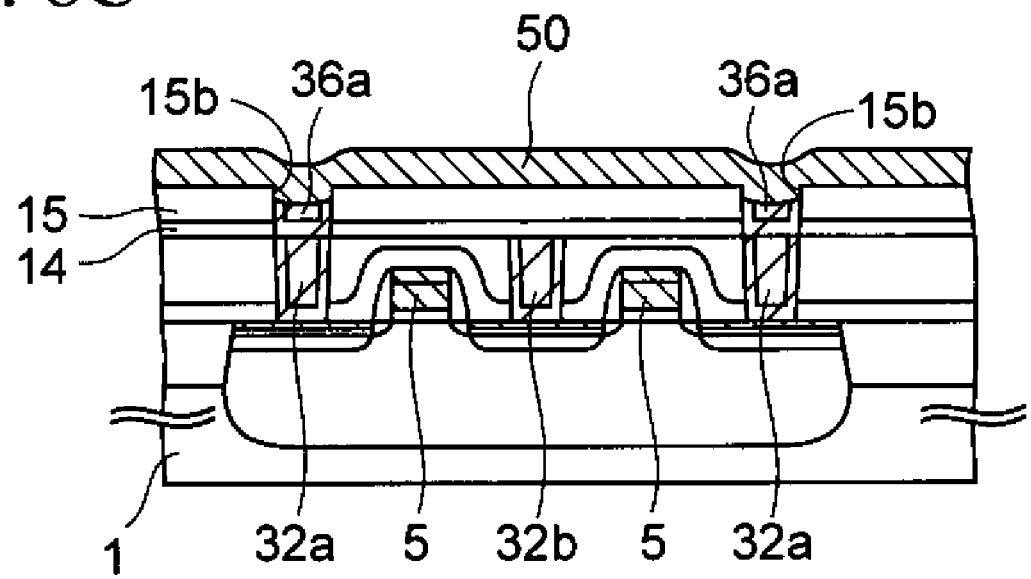

Subsequently, as shown in FIG. 8C, a titanium film is formed with a thickness of 100 to 300 nm, for example approximately 100 nm as a planarization conductive film 50 on the base insulating film 15 and the third conductive plugs 36a, and the recesses 15b are completely embedded with this planarization conductive film 50.

The film-forming conditions for the planarization conductive film 50 are not particularly limited. In the present embodiment, by using a sputtering equipment in which a distance between a silicon substrate 1 and a titanium target is set to be 60 mm, the planarization conductive film 50 is formed under the following conditions. Specifically, in the argon atmosphere of the pressure of 0.15 Pa, sputtering DC power at 2.6 kW is applied for 35 seconds, and the substrate temperature is room temperature (20° C.).

In addition, since the ammonia plasma processing (see FIG. 8B) is carried out in advance to bond the NH group with each oxygen atom on the surface of the base insulating film 15 before the planarization conductive film 50 is formed, titanium atoms deposited on the base insulating film 15 are not easily captured by the oxygen atoms on the surface of the base insulating film 15. As a result, the titanium atoms can freely move on the surface of the base insulating film 15. Thus, it is made possible to form the planarization conductive film 50 formed of titanium, which is strongly self-oriented in a (002) direction.

Note that the planarization conductive film 50 is not limited to the titanium film, and any one of a tungsten film, a silicon film, and a copper film may be formed as the planarization conductive film 50.

After that, RTA with a substrate temperature of 650° C. is carried out on the planarization conductive film 50 in the nitrogen atmosphere to nitride the planarization conductive film 50 formed of titanium, and thereby the planarization conductive film 50 is formed of titanium nitride, and is oriented in a (111) direction.

Here, due to the recesses 15b formed in the base insulating film 15 in the circumference of the third conductive plugs 36a, a concave portion is formed in the upper surface of the above-described planarization conductive film 50. However, when such a concave portion is formed, crystallinity of a ferroelectric film to be formed later above the planarization conductive film 50 may possibly be deteriorated.

Figure 8D:
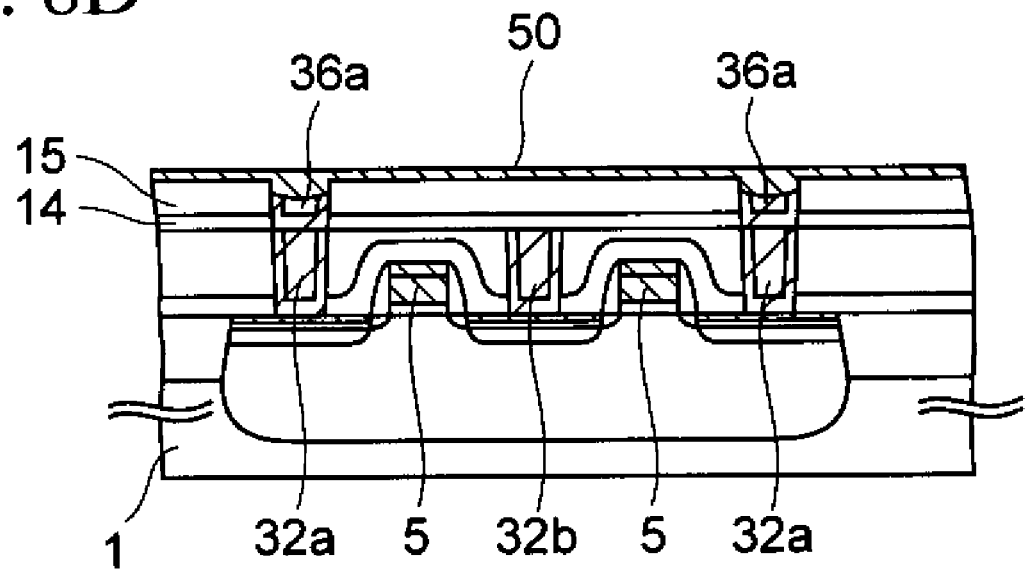

To deal with this problem, in the present embodiment, as shown in FIG. 8D, the upper surface of the planarization conductive film 50 is polished and planarized by the CMP method, and the above-described concave portion is removed. The slurry used in this CMP is not particularly limited. In the present embodiment, SSW2000 manufactured by Cabot Microelectronics Corporation is used as the slurry.

Incidentally, due to polishing error, the thickness of the planarization conductive film 50 after CMP varies within the surfaces of the single silicon substrate or among a plurality of silicon substrates. Considering such variations, in the present embodiment, a target value of the thickness of the planarization conductive film 50 after CMP is set to be 50 to 100 nm, and more preferably 50 nm, by controlling a polishing time.

Note that CMP is carried out on the planarization conductive film 50 in this manner, the crystals in a vicinity of the upper surface of the planarization conductive film 50 are in a deformed state due to polishing. However, when the lower electrode of each capacitor is formed over the planarization conductive film 50 of which crystals are deformed in this manner, the lower electrode is affected by the deformation, and crystallinity of the lower electrode is deteriorated. This leads to deterioration of the ferroelectric characteristics of the ferroelectric film thereon.

Figure 8E:
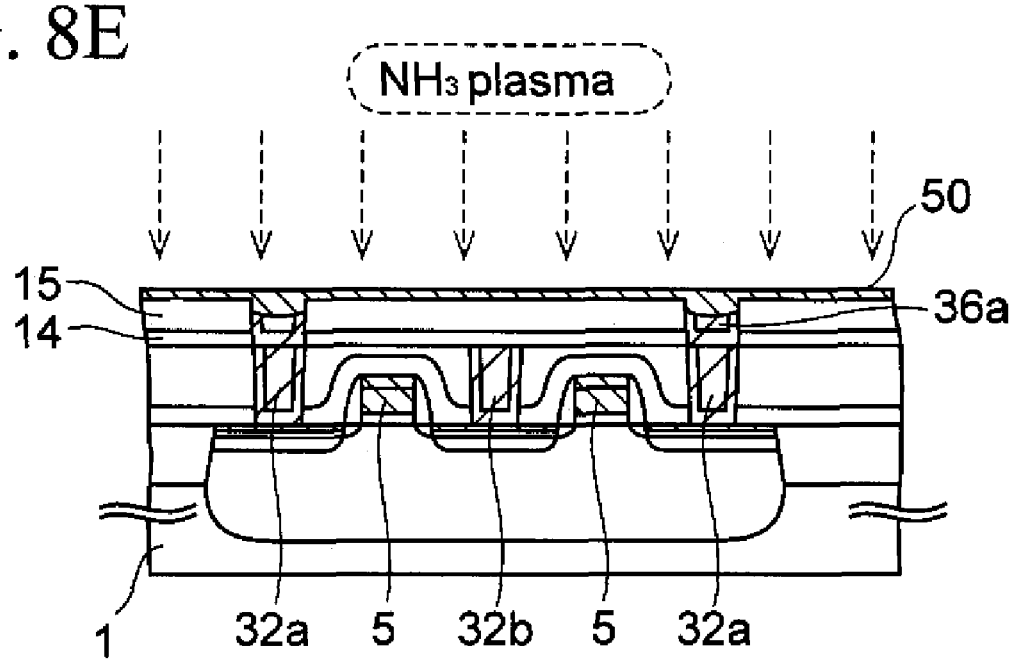

To avoid such an inconvenience, in the next step, as shown in FIG. 8E, the upper surface of the planarization conductive film 50 is exposed to ammonia plasma so that the deformation of the crystals of the planarization conductive film 50 would not affect the film thereon.

Figure 8F:
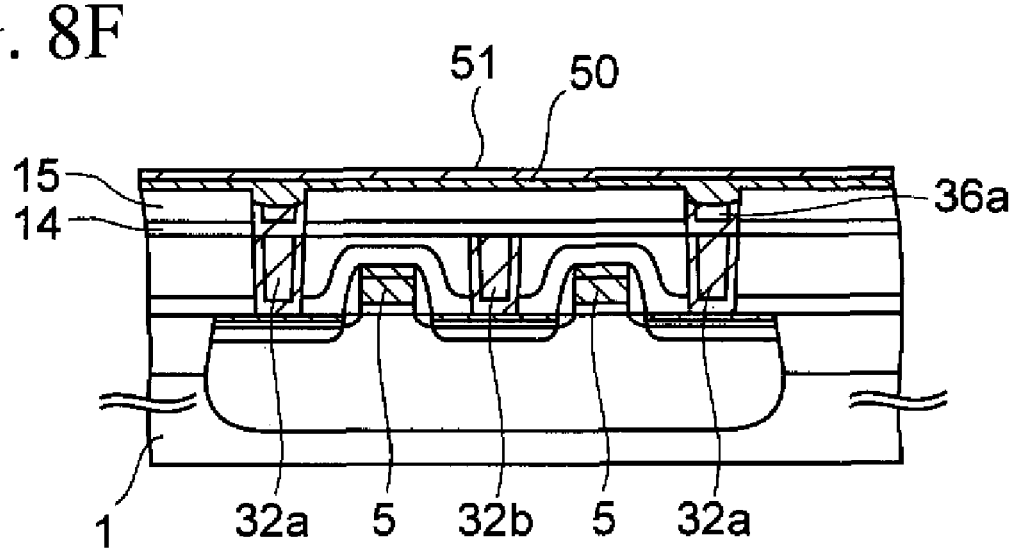

Next, as shown in FIG. 8F, an iridium film is formed as a conductive adhesion film 51 by the sputtering method on the planarization conductive film 50 in which the deformation of the crystals is resolved by the above-described ammonia plasma processing. The conductive adhesion film 51 functions as a film which enhances adhesion strength between upper and lower films. It is desirable that a thickness of the conductive adhesion film 51 be formed as thin as possible, for example, 20 nm or less, and more preferably 5 to 10 nm.

Figure 8G:
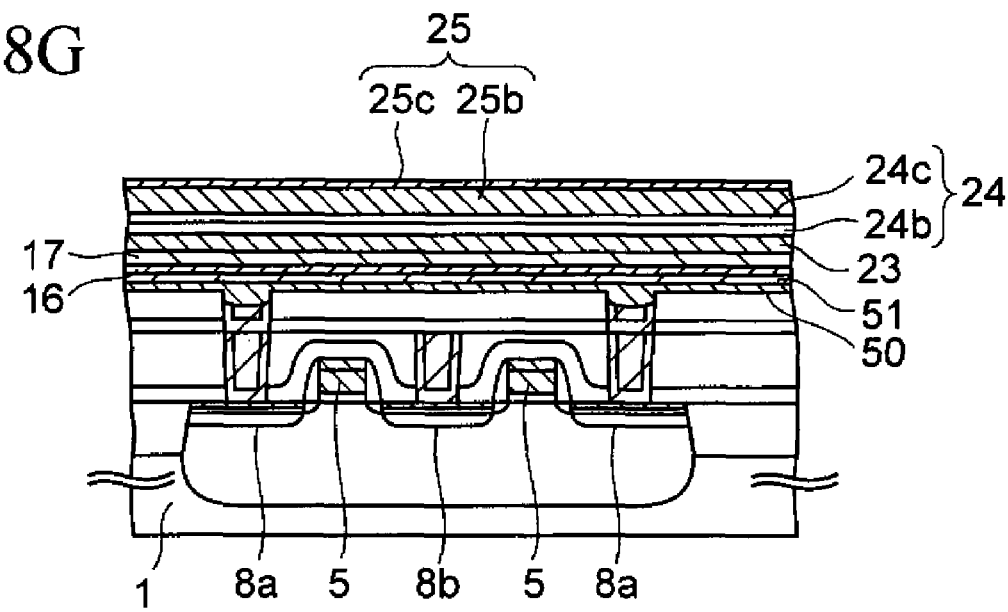

Next, films 16, 17, and 23 to 25 are stacked as shown in FIG. 8G by carrying out the steps of FIGS. 5E to 5L described in the second embodiment.

Note that in this step, as in the case of the second embodiment, after the first ferroelectric film 24b is formed by the MOCVD method, the second ferroelectric film 24c is formed thereon by the sol-gel method so that unevenness in the upper surface of the first ferroelectric film 24b is embedded by the second ferroelectric film 24c.

Then, as the conductive metal oxide film 25b, a laminated film constructed from the first and second conductive metal oxide films 25d and 25e (see FIG. 5K) each made of iridium oxide is formed by the sputtering method. Of these films 25d and 25e, the first conductive metal oxide film 25d is already crystallized at the time of film forming, and the oxygen loss in the ferroelectric film 24c is compensated by carrying out RTA in the atmosphere containing an oxidizing gas after forming the first conductive metal oxide film 25d, by using the same conditions as those of the second embodiment.

Figure 8H:
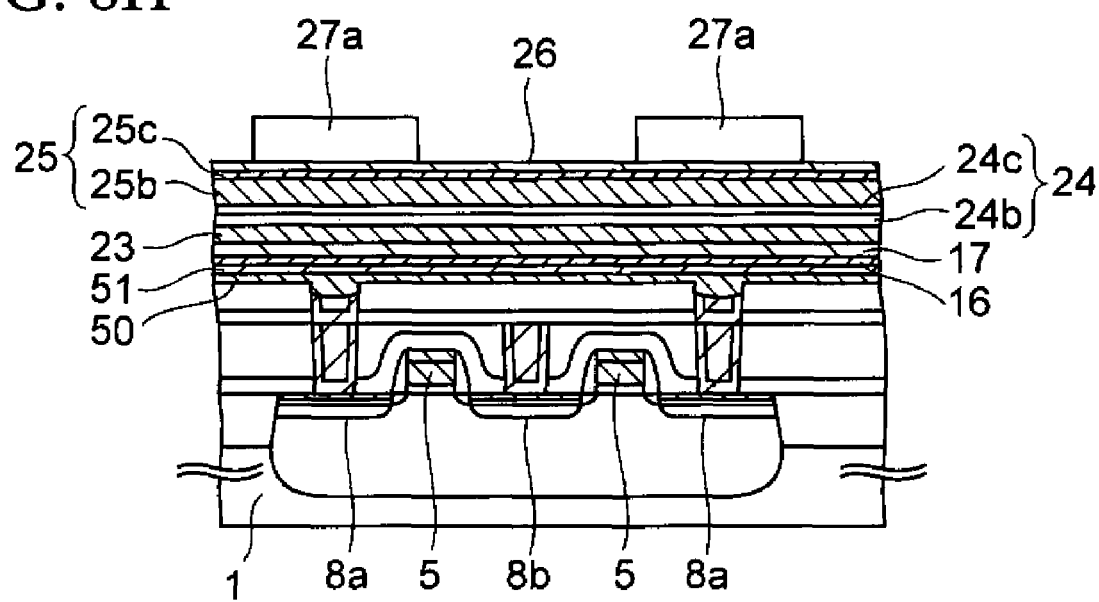

Subsequently, by carrying out the steps described in FIGS. 5M and 5N, as shown in FIG. 8H, a first mask material layer 26 and second hard masks 27a are formed on the second conductive film 25.

Figure 8I:
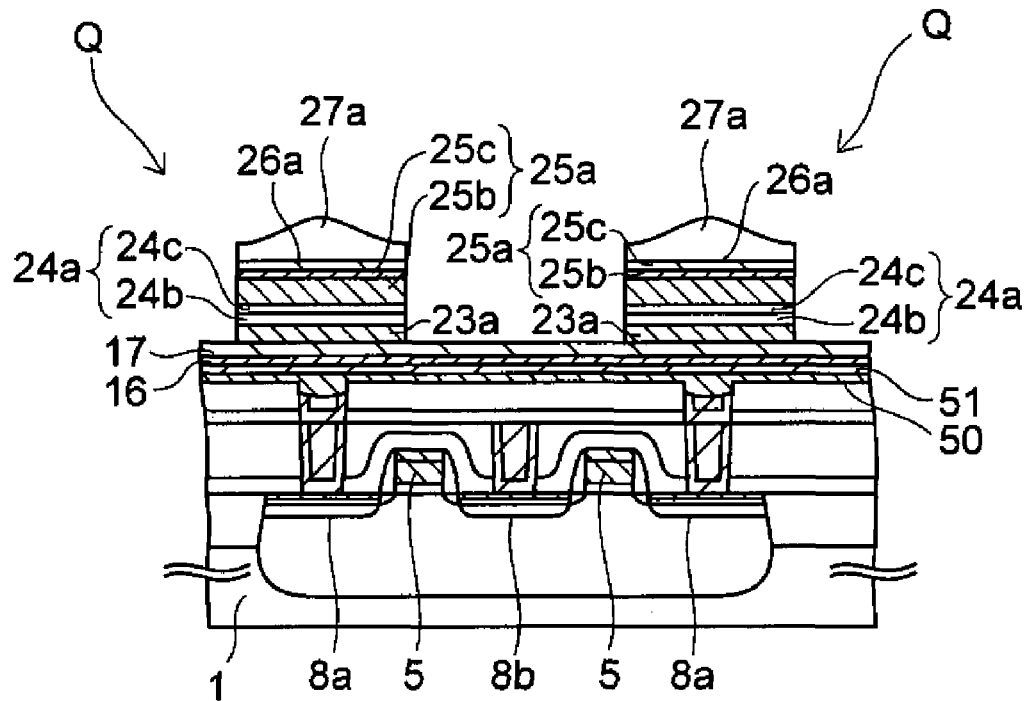

Next, as shown in FIG. 8I, the first mask material layer 26 is etched by using the second hard masks 27a as masks to form first hard masks 26a.

After that, portions of the second conductive film 25, the ferroelectric film 24, and the first conductive film 23 which are not covered with the first and second hard masks 26a and 27a are dry-etched. Accordingly, capacitors Q each provided with a lower electrode 23a, a capacitor dielectric film 24a, and an upper electrode 25a are formed.

In this etching, as in the case of the first embodiment, the mixed gas of HBr and oxygen is used as an etching gas for the first and second conductive films 23 and 25, while the mixed gas of chlorine and argon is used as an etching gas for the ferroelectric film 24.

Figure 8J:
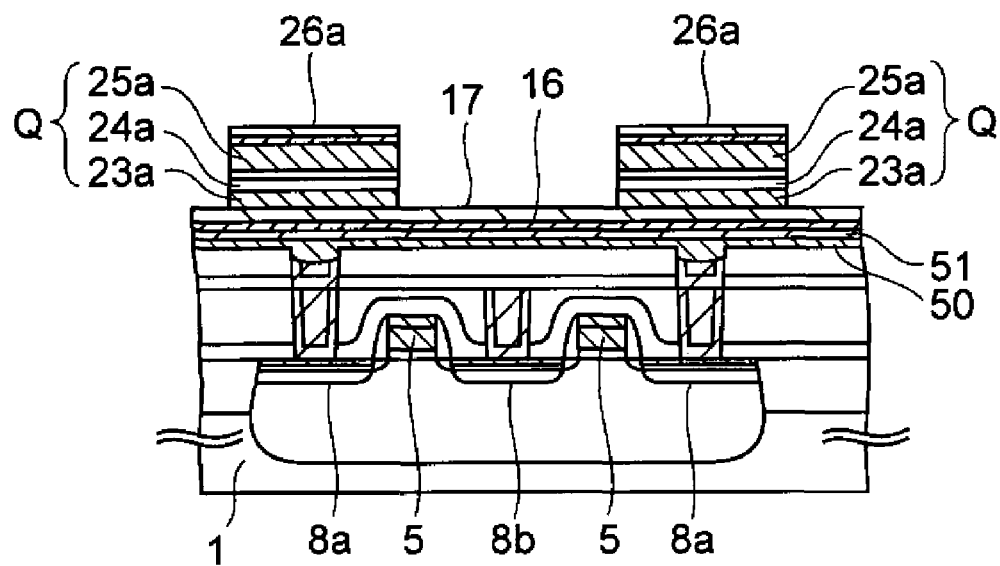

Subsequently, as shown in FIG. 8J, the second hard mask 27a made of silicon oxide is removed by wet etching using the mixed solution of hydrogen peroxide, ammonia, and water as an etching solution. Incidentally, the second hard masks 27a may be removed by dry etching.

Figure 8K:
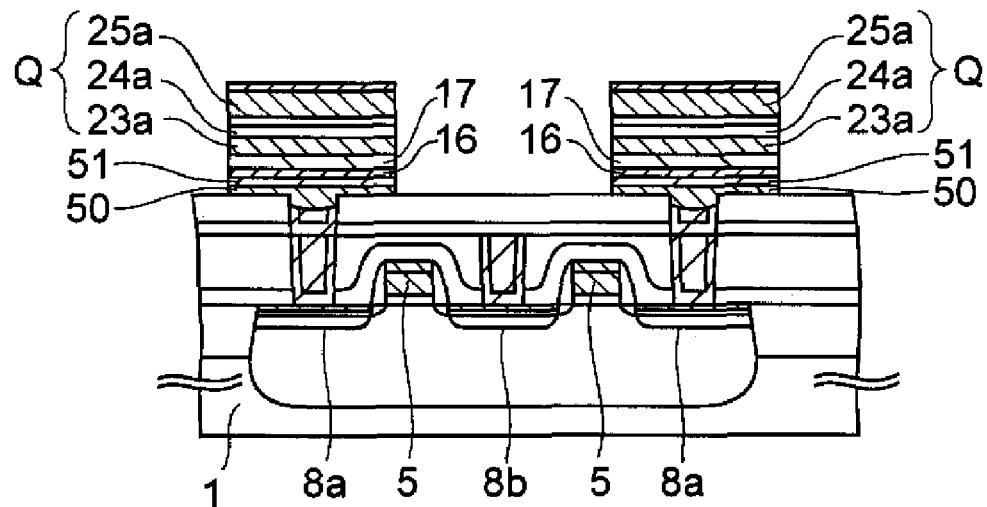

Next, steps for obtaining a cross-sectional structure shown in FIG. 8K will be described.

Firstly, by using the first hard masks 26a as masks, the conductive oxygen barrier film 17, the base conductive film 16, the conductive adhesion film 51, and the planarization conductive film 50 are etched, and these films are left only under each capacitor Q. This etching is carried out by dry etching, and the mixed gas of argon and chlorine, for example, is used as an etching gas therefor.

In addition, the first hard masks 26a are also etched by the etching gas. Therefore, the first hard masks 26a are removed at the time when the etching is finished, and the upper surfaces of the respective upper electrodes 25a are exposed.

Figure 8L:
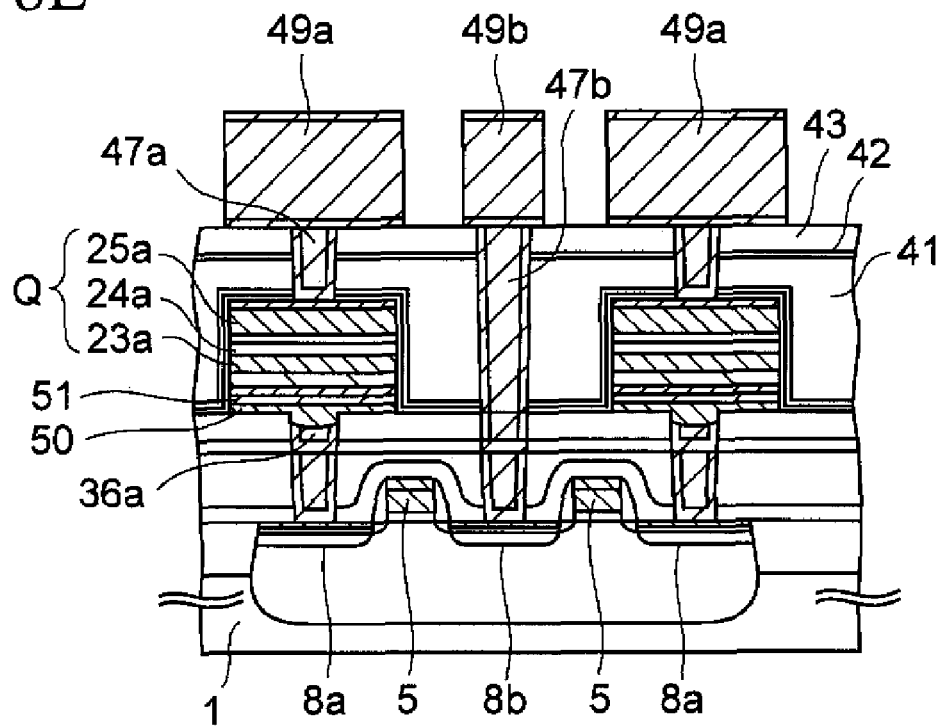

Thereafter, a basic structure of the semiconductor device according to the present embodiment as shown in FIG. 8L is completed by carrying out the steps of FIGS. 5R to 5X described in the first embodiment.

According to the above-described present embodiment, as described with reference to FIG. 8C, the recesses 15b, which are formed in the circumference of the third conductive plugs 36a by CMP, are embedded with the planarization conductive film 50, and the planarization conductive film 50 is further planarized by carrying out CMP.

With this process, the lower electrode (see FIG. 8L) formed over the planarization conductive film 50 is made preferably flat, and thus the crystalline orientation of the lower electrodes 23a is made preferable. Moreover, the crystalline orientation of the capacitor dielectric films 24a is improved by an effect of the crystalline orientation of the lower electrodes 23a, and thus ferroelectric characteristics of the capacitor dielectric films 24a, such as switching charge, are improved.

(4) Fourth Embodiment

Figure 9:
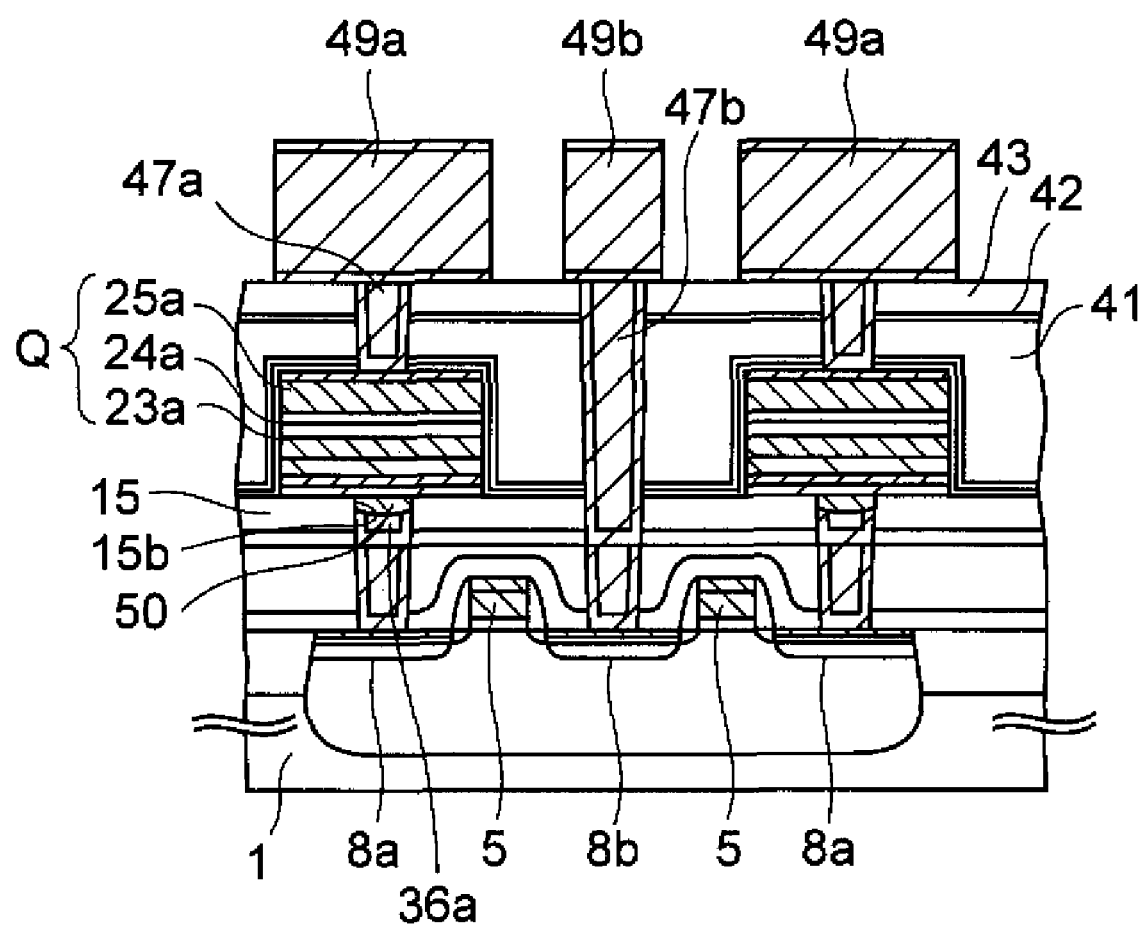
FIG. 9 is a cross-sectional view of a semiconductor device according to a fourth embodiment of the present invention.

FIG. 9 is a cross-sectional view of a semiconductor device according to the present embodiment.

The present embodiment is different from the second embodiment in that, in the present embodiment, a planarization conductive film 50 is removed from an upper surface of the base insulating film 15 in the CMP step of FIG. 8D, and that the planarization conductive film 50 is left only on each third conductive plug 36a inside a corresponding recess 15b. Except for this point, the present embodiment is the same as the second embodiment.

Even when the planarization conductive film 50 is completely removed from the upper surface of the base insulating film 15 by CMP in this manner, the thin film thickness of the planarization conductive film 50 allows the amount of over polishing at the time of CMP to be less. Thus, a concave portion is hardly formed on the upper surface of the planarization conductive film 50 left inside each recess 15b. Accordingly, the upper surfaces of the planarization conductive film 50 and of the base insulating film 15 are made into a continuous flat surface, so that the crystallinity of lower electrodes 23a and that of capacitor dielectric films 24a is made favorable.

(5) Fifth Embodiment

Figure 10A:
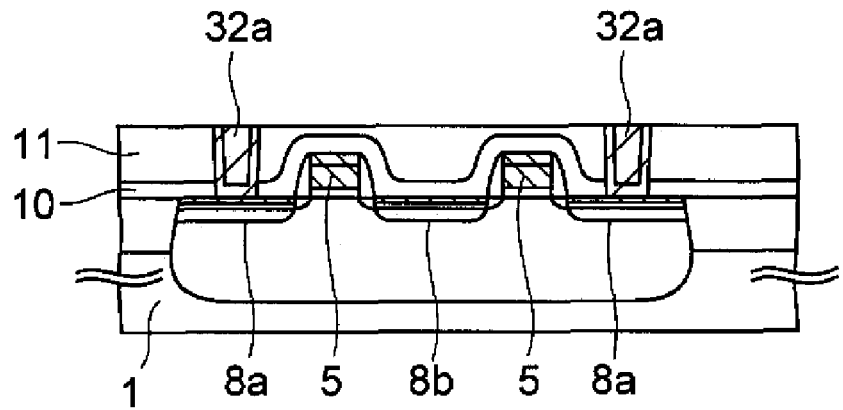
Figure 10B:
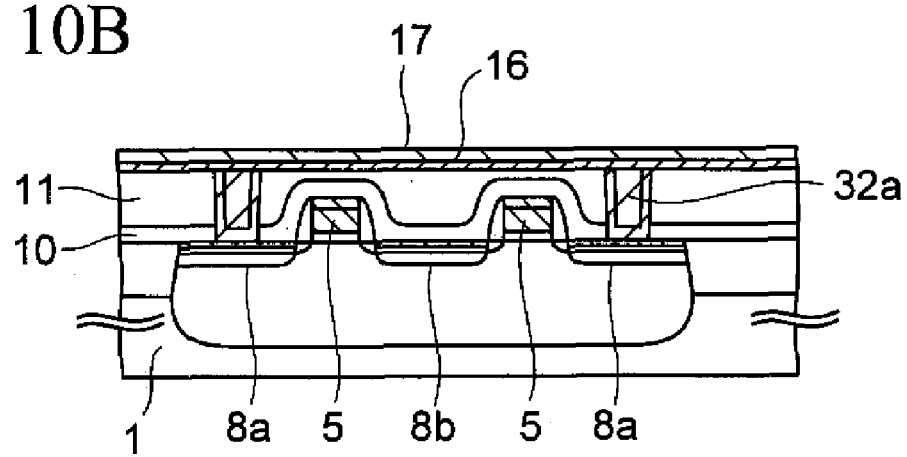
Figure 10C:
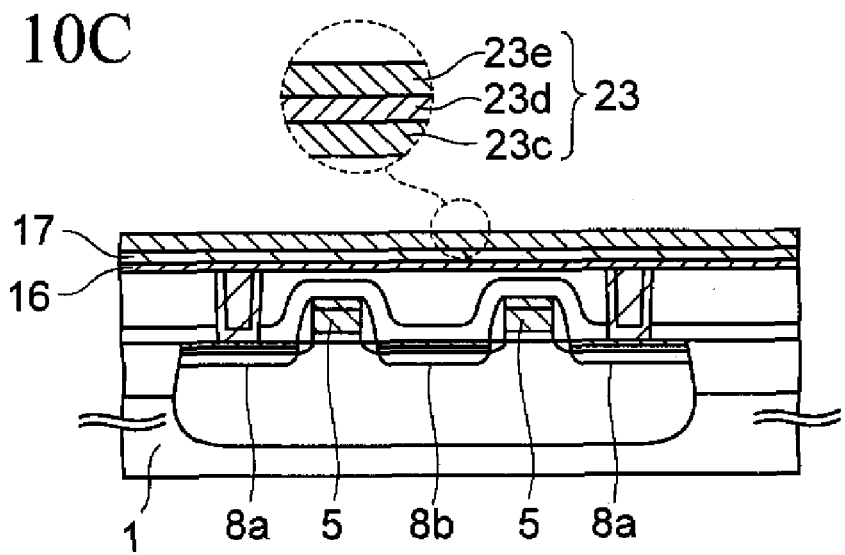
Figure 10D:
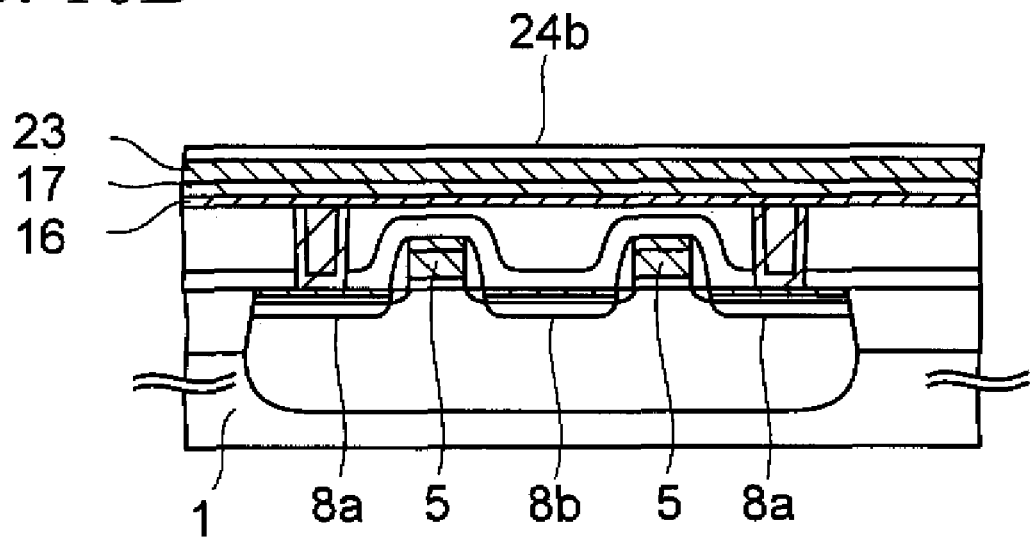
Figure 10E:
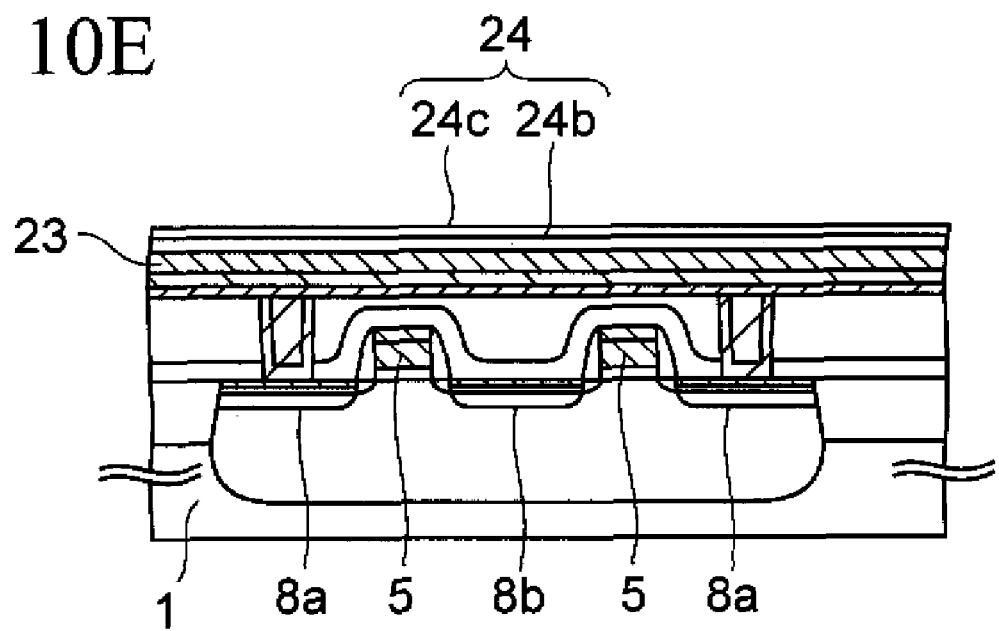
Figure 10F:
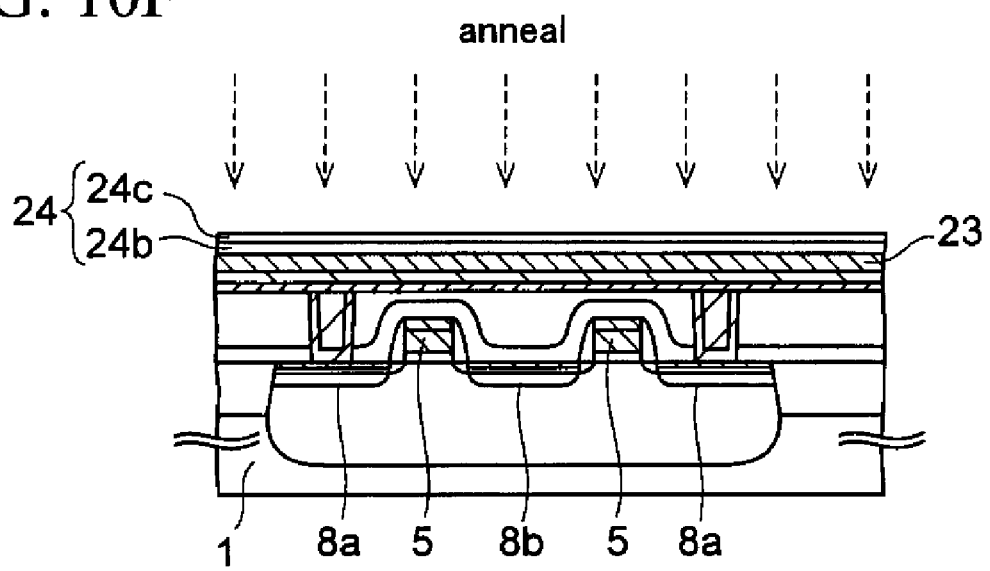
Figure 10G:
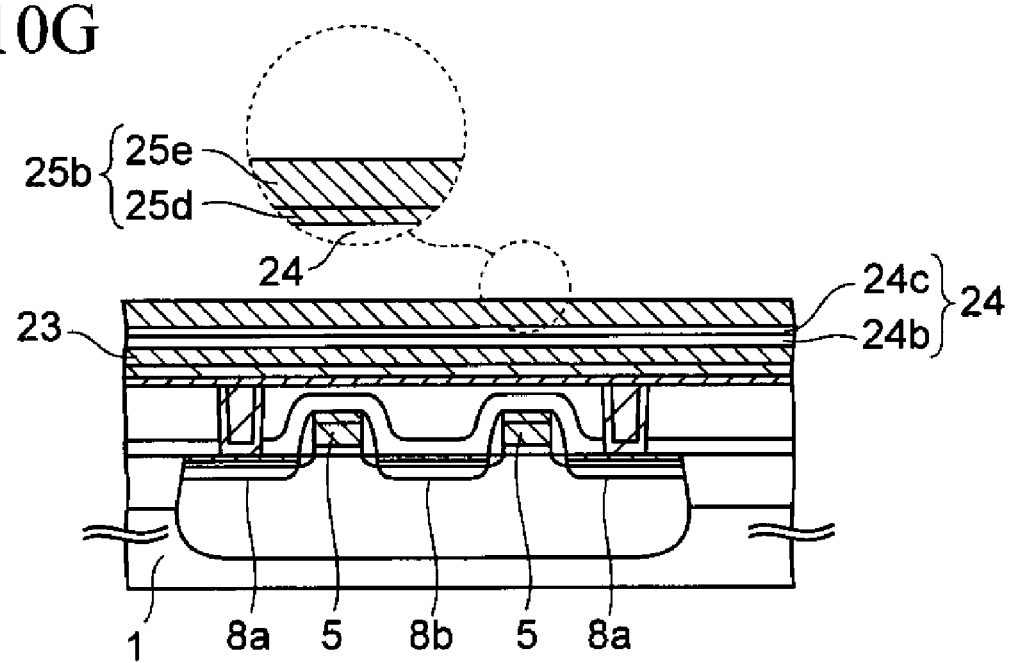
Figure 10H:
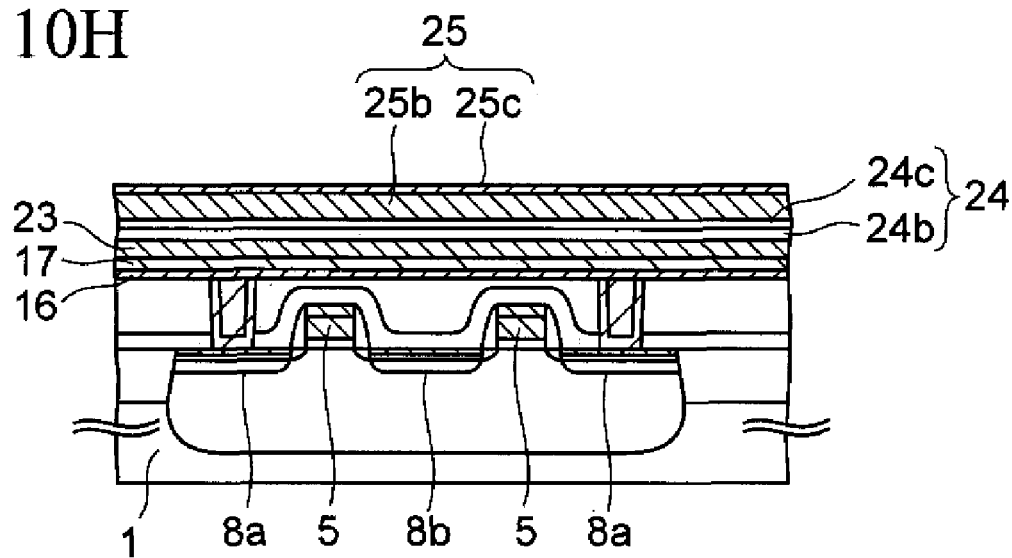
Figure 10I:
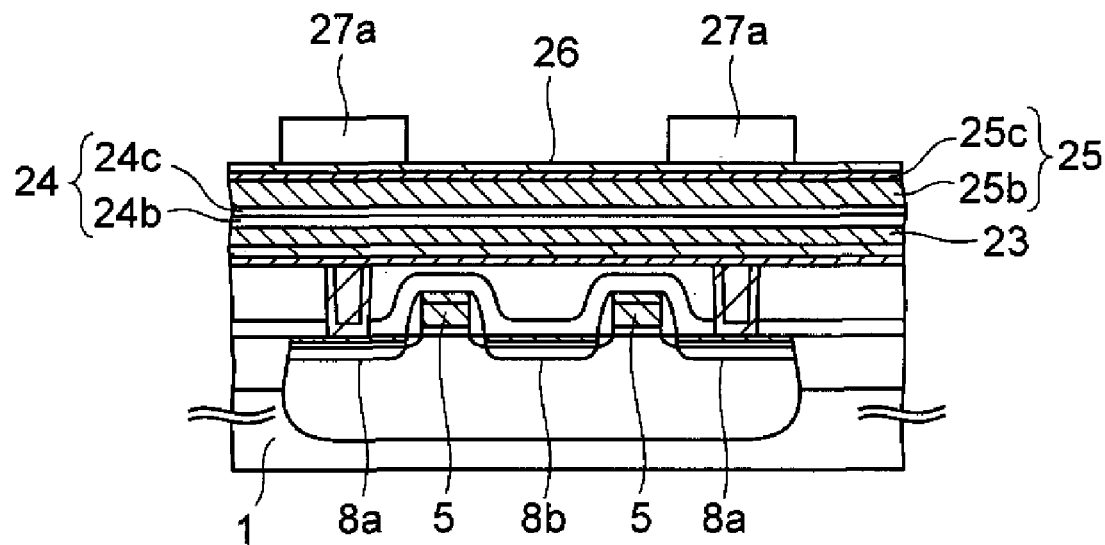
Figure 10J:
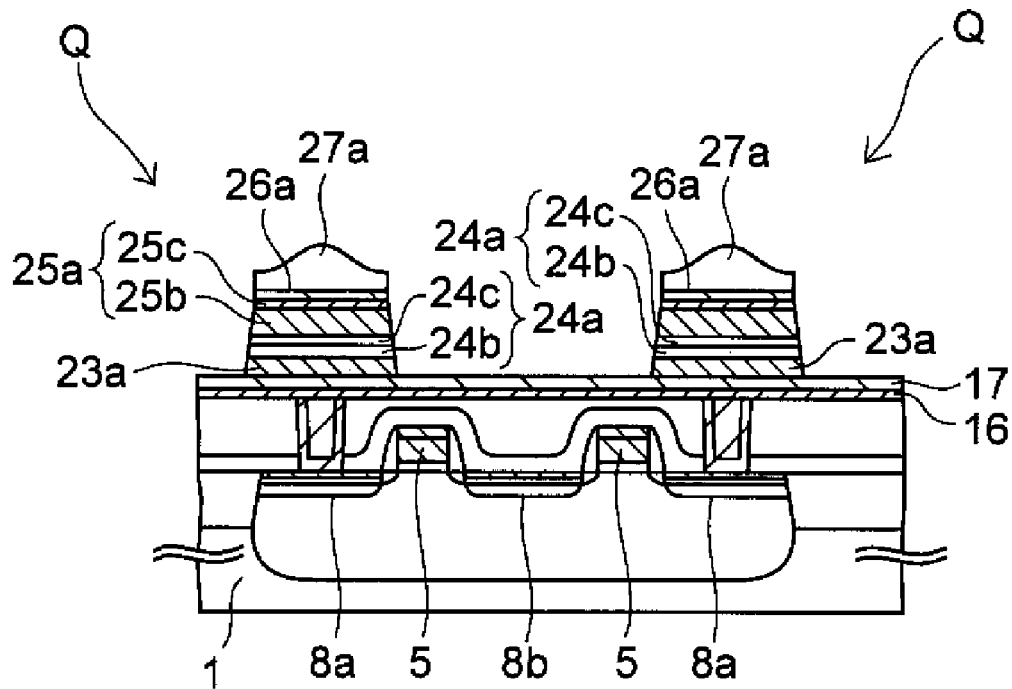
Figure 10K:
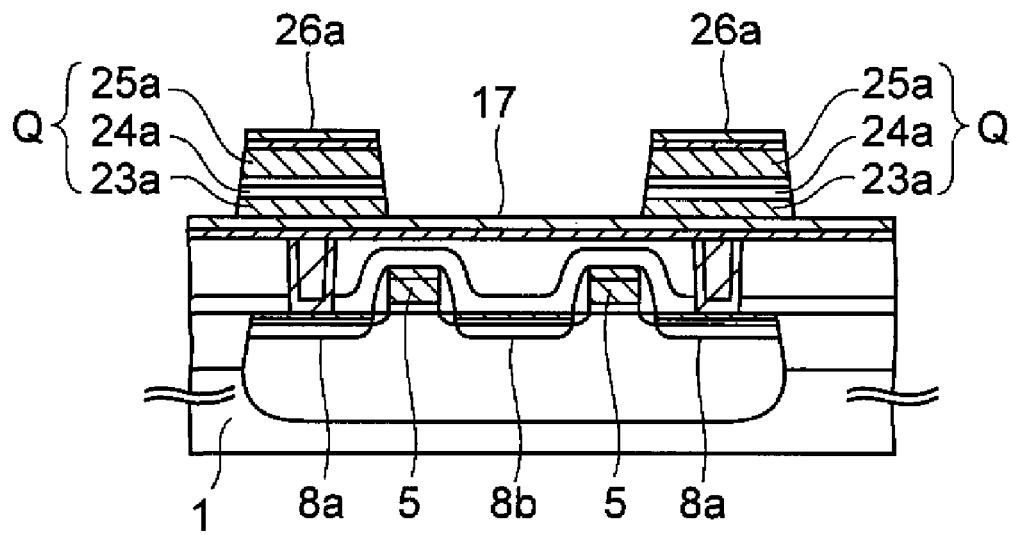
Figure 10L:
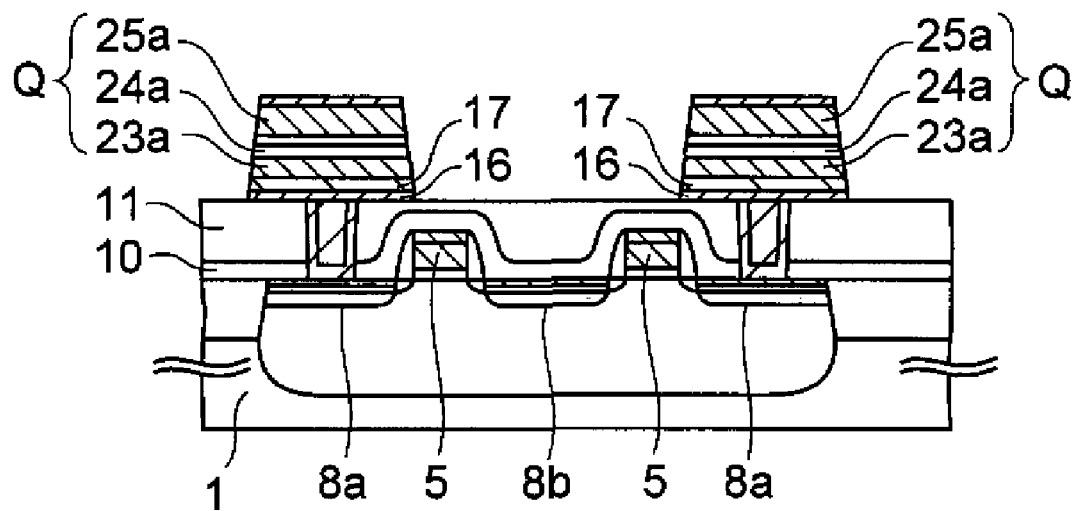
Figure 10M:
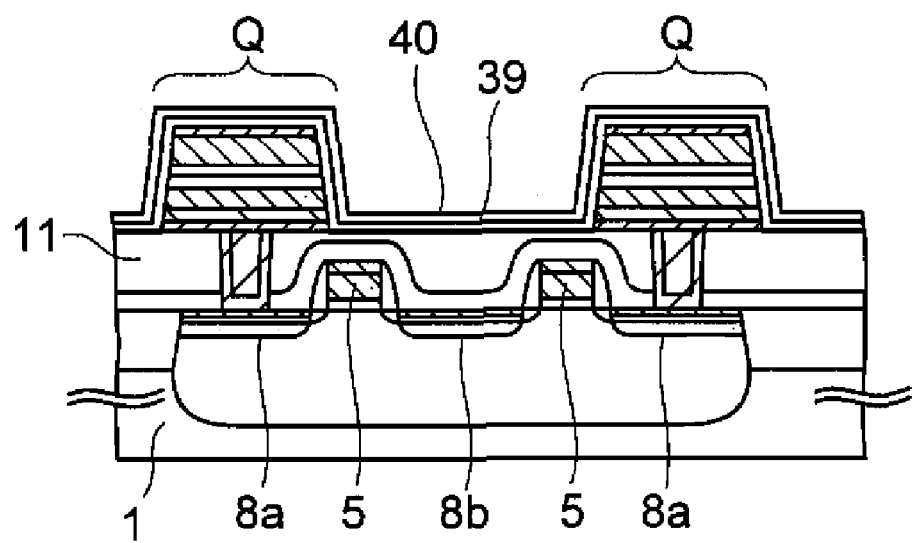
Figure 10N:
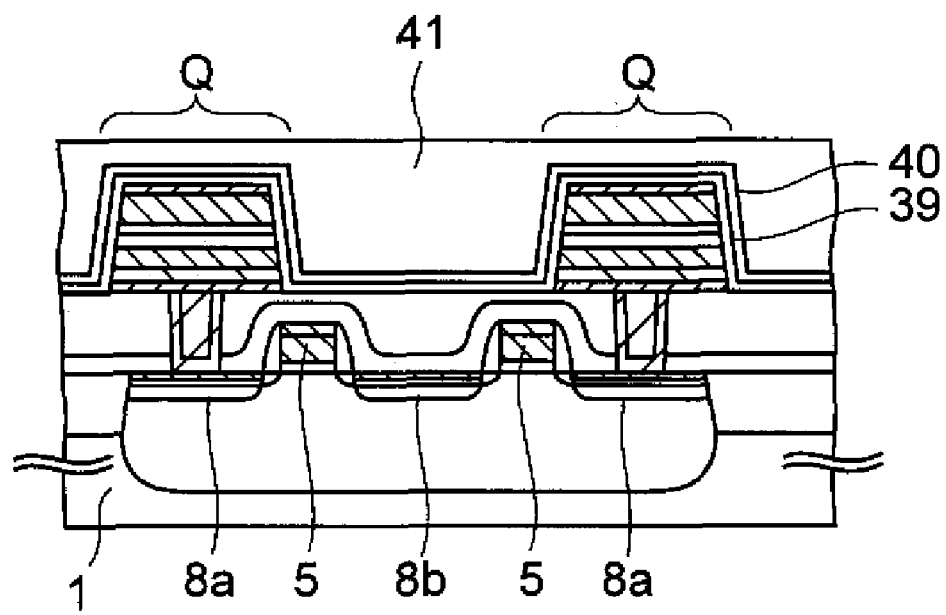
Figure 10O:
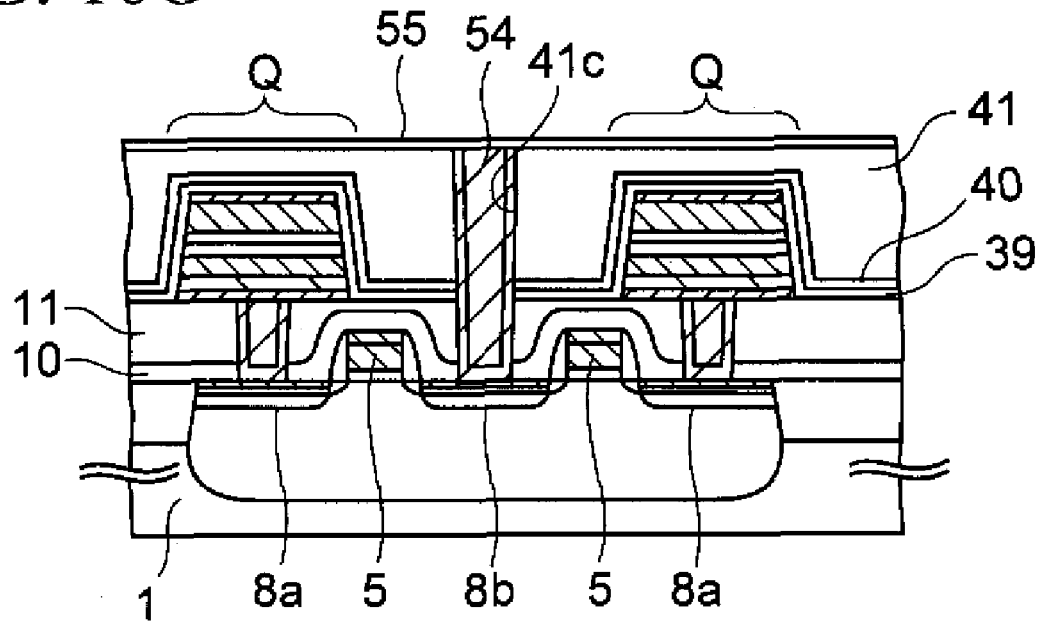
Figure 10P:
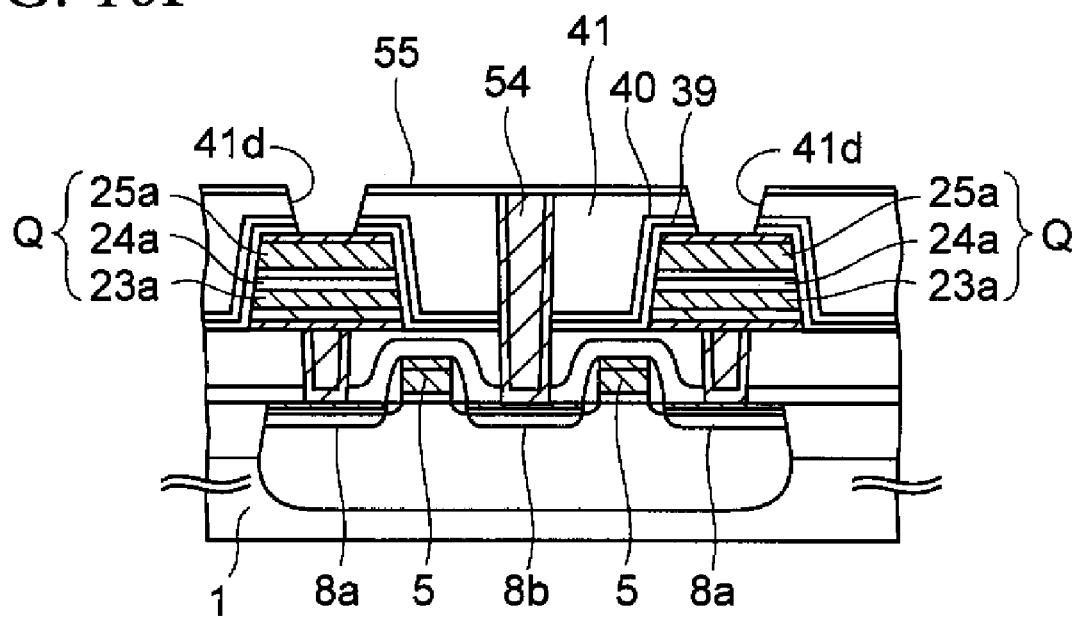
Figure 10Q:
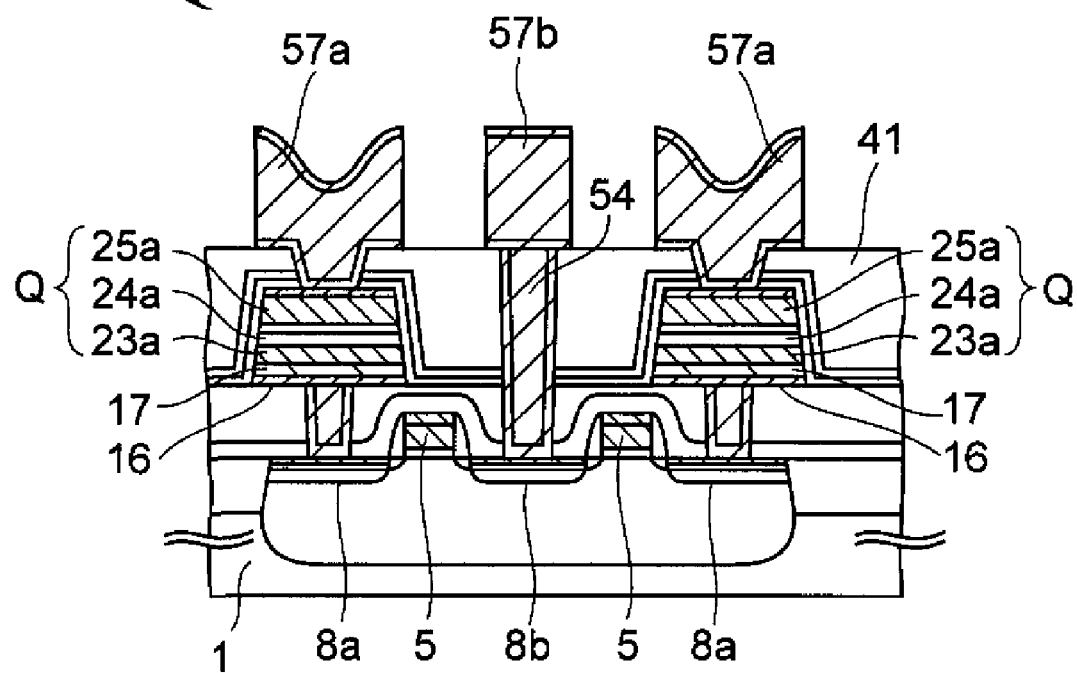

FIGS. 10A to 10Q are cross-sectional views showing processes for manufacturing a semiconductor device according to the present embodiment. Note that, in FIGS. 10A to 10Q, the same reference numerals as those of the second embodiment denote elements described in the second embodiment, and descriptions thereof will be omitted below.

Firstly, steps for obtaining a cross-sectional structure shown in FIG. 10A will be described.

According to the steps described in FIG. 5A in the second embodiment, a cover insulating film 10 and a first interlayer insulating film 11 are formed on a silicon substrate 1. Then, these insulating films are patterned to form a contact hole in each first source/drain region 8a.

Furthermore, after a glue film and a tungsten film are sequentially formed inside each contact hole, the excessive glue film and tungsten film on the first interlayer insulating film 11 are polished and removed by the CMP method, and theses films are left only inside the contact holes as first conductive plugs 32a.

Next, as shown in FIG. 10B, a titanium film is formed with a thickness of approximately 20 nm on each of the first interlayer insulating film 11 and the first conductive plugs 32a, and this titanium film is set to be a base conductive film 16.

Note that ammonia plasma processing may be carried out on each of the upper surfaces of the first interlayer insulating film 11 and the first conductive plugs 32a before the base conductive film 16 is formed. By carrying out this ammonia plasma processing, titanium atoms deposited on the first interlayer insulating film 11 are not easily captured by oxygen atoms on the surface of the insulating film 11. For this reason, the titanium atoms can freely move on the surface of the first interlayer insulating film 11, and thus the base conductive film 16 formed of titanium, which is strongly self-oriented in a (002) direction, can be formed.

After that, RTA is carried out on the base conductive film 16 in the nitrogen atmosphere with a substrate temperature of 650° C. and a processing time of 60 seconds. With this process, the base conductive film 16 formed of titanium is nitrided, and thus the base conductive film 16 is formed of titanium nitride, and is oriented in a (111) direction.

Furthermore, a titanium aluminum nitride film is formed with a thickness of 100 nm as a conductive oxygen barrier film 17 on the base conductive film 16 by a reactive sputtering method.

Next, as shown in FIG. 10C, a first conductive film 23 is formed on the conductive oxygen barrier film 17 by the sputtering method. As in the case of the second embodiment, the first conductive film 23 is made by forming films in the order of an iridium film 23c with a thickness of 50 to 100 nm, an iridium oxide film 23d with a thickness of approximately 30 nm, and a platinum film 23e with a thickness of approximately 50 nm.

Subsequently, as shown in FIG. 10D, by using the same film-forming conditions as those of the second embodiment, a PZT film is formed with a thickness of approximately 80 nm by the MOCVD method, and this PZT film is set to be a first ferroelectric film 24b.

Next, as shown in FIG. 10E, a PLZT film is formed with a thickness of 20 to 30 nm as a second ferroelectric film 24c on the first ferroelectric film 24b by the sol-gel method. The film-forming conditions of the second ferroelectric film 24c are the same as those of the second embodiment, and the description thereof will be omitted.

With the above steps, a ferroelectric film 24 formed of the first and second ferroelectric films 24c and 24d is formed on the first conductive film 23.

Subsequently, as shown in FIG. 10F, as crystallization annealing on the second ferroelectric film 24d, RTA with a speed of raising a temperature at 125° C. per minute and with the maximum substrate temperature of 550° C., is carried out for 90 seconds. In this RTA, oxygen and argon, both of which have a flow rate of 1000 sccm, are supplied to the annealing atmosphere.

Next, as shown in FIG. 10G, by carrying out the same steps as those of FIG. 5K of the second embodiment, a conductive metal oxide film 25b is formed on the ferroelectric film 24. As described in the second embodiment, the conductive metal oxide film 25b is formed of a first conductive metal oxide film 25d which has been crystallized at the time of forming thereof, and an amorphous second conductive metal oxide film 25e. After the first conductive metal oxide film 25d is formed, RTA is carried out on the first conductive metal oxide film 25d in the atmosphere containing an oxidizing gas, so that the oxygen loss in the ferroelectric film 24 is compensated, and that the first conductive metal oxide film 25d is completely crystallized. The conditions for this RTA are described in the second embodiment, and the description thereof will be omitted.

Next, as shown in FIG. 10H, an iridium film is formed with a thickness of 50 to 100 nm as a conductivity enhancing film 25c on the conductive metal oxide film 25b by the sputtering method, and this conductivity enhancing film 25c and the conductive metal oxide film 25d are together set to be a second conductive film 25.

Next, as shown in FIG. 10I, a first mask material layer 26 formed of titanium nitride is formed on the second conductive film 25 by the sputtering method.

In addition, a silicon oxide film is formed on the first mask material layer 26 by the plasma CVD method using a TEOS gas, and the silicon oxide film is patterned to form second hard masks 27a.

Subsequently, as shown in FIG. 10J, the first mask material layer 26 is etched by using the second hard masks 27a as masks, and thereby first hard masks 26a are formed.

Next, portions of the second conductive film 25, the ferroelectric film 24, and the first conductive film 23 which are not covered with the first and second hard masks 26a and 27a are dry-etched. Accordingly, capacitors Q each provided with a lower electrode 23a, a capacitor dielectric film 24a, and an upper electrode 25a are formed.

Incidentally, the conditions for this dry etching are described in the second embodiment with reference to FIG. 5O, and the description thereof will be omitted.

In addition, even when the above-described dry etching is carried out, the conductive oxygen barrier film 17 is left on the entire surface of the base conductive film 16 without being etched.

Next, as shown in FIG. 10K, the second hard masks 27a are removed by wet etching or dry etching. In a case of wet etching, the mixed solution of hydrogen peroxide, ammonia and water is used as an etching solution.

Subsequently, steps for obtaining a cross-sectional structure shown in FIG. 10L will be described.

Firstly, by using the first hard masks 26a as masks, the base conductive film 16 and the conductive oxygen barrier film 17 are dry-etched by using the mixed gas of argon and chlorine as an etching gas, and these films are left only under each capacitor Q.

Since the first hard masks 26a are also etched by the etching gas, the first hard masks 26a are removed at the time when the etching is finished, and the upper surface of each upper electrode 25a is exposed.

Next, as shown in FIG. 10M, to protect each capacitor Q from reductants such as hydrogen, an alumina film is formed with a thickness of approximately 20 nm as a first capacitor protective insulating film 39 on the entire upper surface of the silicon substrate 1.

Then, to recover damages received in the capacitor dielectric film 24a due to dry etching at the time of forming each capacitor Q (see FIG. 10J) or at the time of forming the first capacitor protective insulating film 39 by the sputtering method, recovery annealing is carried out on the capacitor dielectric films 24a in the atmosphere containing oxygen. This recovery annealing is carried out for approximately 60 minutes under the condition with a substrate temperature of 550 to 700° C., for example 650° C., in a furnace.

After that, an alumina film is formed with a thickness of approximately 20 nm on the first capacitor protective insulating film 39 by the CVD method, and this alumina film is set to be a second capacitor protective insulating film 40.

Next, as shown in FIG. 10N, a silicon oxide film is formed as a second interlayer insulating film 41 on the second capacitor protective insulating film 40 by the plasma CVD using the TEOS gas as a reactant gas. The reactant gas may be an oxygen gas and a helium gas. In addition, the second interlayer insulating film 41 has a thickness of 1500 nm on the planarized surface of the silicon substrate 1.

Instead of the silicon oxide film, an insulating inorganic film may be formed as the second interlayer insulating film 41.

Thereafter, the surface of the second interlayer insulating film 41 is polished and planarized by the CMP method.

Next, steps for obtaining a cross-sectional structure shown in FIG. 10O will be described.

Firstly, the surface of the second interlayer insulating film 41 is exposed to $N_2O$ plasma. Thereby, moisture remaining inside the second interlayer insulating film 41 is removed, and moisture is prevented from again absorbed into the second interlayer insulating film 41.

Incidentally, $N_2$ plasma processing may be carried out as this dehydration processing.

Next, the cover insulating film 10, the first and second interlayer insulating films 11 and 41, and the first and second capacitor protective insulating films 39 and 40 are patterned. Thereby, a first hole 41c is formed on the second source/drain region 8b through these insulating films.

Then, after a glue film and a tungsten film are sequentially formed inside the first hole 41c, the excessive glue film and tungsten film on the second interlayer insulating film 41 are polished and removed by the CMP method. These films are left as a second conductive plug 54 only inside the first hole 41c.

The second conductive plug 54 constructs one part of a bit line, and is electrically connected to the second source/drain region 8b.

Incidentally, the second conductive plug 54 is mainly formed of tungsten which is easily oxidized. For this reason, contact defect is easily caused when the second conductive plug 54 is oxidized during the manufacturing processes.

Consequently, to prevent the second conductive plug 54 from being oxidized, a silicon oxynitride film is formed with a thickness of approximately 100 nm on each of the upper surfaces respectively of the second interlayer insulating film 41 and the second conductive plug 54. This silicon oxynitride film is set to be an antioxidant insulating film 55.

Next, as shown in FIG. 10P, the first and second capacitor protective insulating films 39 and 40, the second interlayer insulating film 41, and the antioxidant insulating film 55 are patterned. Thereby, second holes 41d are formed on the respective upper electrode 25a through these insulating films.

After the second hole 41a is formed, to recover damages received in the capacitor dielectric film 24a during the above steps, annealing may be carried out in the atmosphere containing oxygen. Even when such annealing is carried out, the oxidation of the second conductive plug 54 is prevented with the antioxidant insulating film 55.

After that, the antioxidant insulating film 55 is etched back and removed.

Next, as shown in FIG. 10Q, a metal laminated film is formed on each of the upper surfaces of the respective second interlayer insulating film 41 and the second conductive plug 54 by the sputtering method. This metal laminated film is then pattered to form a metal wiring 57a and a conductive pad 57b used for a bit line.

The metal laminated film is configured by forming films in the order of, for example, a titanium film with a thickness of 60 nm, a titanium nitride film with a thickness of 30 nm, a copper-containing aluminum film with a thickness of 400 nm, and a titanium film with a thickness of 5 nm, and a titanium nitride film with a thickness of 70 nm.

Accordingly, a basic structure of the semiconductor device according to the present embodiment is completed.

In the above-described embodiment, the third conductive plugs 36a and the base insulating film 15 formed in the second embodiment are not formed. Thus, the steps can be made simpler than those of the second embodiment.

Furthermore, the second conductive plug 54 constituting one part of the bit line has only one stage on the second source/drain region 8b. Hence, the present embodiment is made simpler than the second embodiment in which the conductive plugs 32b and 47b are formed in two stages.

As described above, according to the present invention, in the case where a ferroelectric film is formed by the sol-gel method, the switching charge of the ferroelectric film can be adjusted by increasing the flow rate ratio of oxygen at the time of forming a first conductive metal oxide film forming a lower layer of an upper electrode by a sputtering method.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A method for manufacturing a semiconductor device, comprising:
    forming a first interlayer insulating film over a semiconductor substrate;
    forming a first conductive film on the first interlayer insulating film;
    increasing a temperature of the semiconductor substrate, and exposing the first conductive film to an atmosphere of an organic solvent gas;
    after exposing the first conductive film to the atmosphere of the organic solvent gas, forming a ferroelectric film by forming a first ferroelectric film on the first conductive film by a MOCVD method, and forming a second ferroelectric film on the first ferroelectric film by the sol-gel method;
    forming a first conductive metal oxide film on the ferroelectric film by a sputtering method, while heating the semiconductor substrate, using a sputtering gas containing oxygen, the flow rate ratio of the oxygen is set to be equal to or greater than 20% and smaller than 50%, where the first conductive metal oxide film being crystallized while being formed;
    carrying out a first annealing on the first conductive metal oxide film in an atmosphere containing an oxidizing gas;
    forming a second conductive metal oxide film on the first conductive metal oxide film, so that the second conductive metal oxide film and the first conductive metal oxide film are used, in combination, as a second conductive film; and
    forming a capacitor including a lower electrode, a capacitor dielectric film and an upper electrode by patterning the first conductive film, the ferroelectric film and the second conductive film.

2. The method for manufacturing a semiconductor device according to claim 1, wherein, upon forming the second ferroelectric film, the second ferroelectric film is formed thinner than the first ferroelectric film.

3. The method for manufacturing a semiconductor device according to claim 2, wherein the formation of the second ferroelectric film is carried out by forming only one layer of a coating film of a ferroelectric solution, on the first ferroelectric film, and then by annealing the coating film to make the coating film into the second ferroelectric film.

4. The method for manufacturing a semiconductor device according to claim 1, wherein the formation of the first conductive metal oxide film is carried out with a substrate temperature of 300° C. or more.

5. The method for manufacturing a semiconductor device according to claim 1, wherein, upon forming the first conductive metal oxide film, the first conductive metal oxide film is formed with a thickness between 10 to 50 nm inclusive.

6. The method for manufacturing a semiconductor device according to claim 1, wherein, upon forming the first conductive metal oxide film, a ferroelectric characteristic of the capacitor dielectric film is adjusted with the flow rate ratio of oxygen in the sputtering gas by utilizing the fact that the ferroelectric characteristic improve as the flow rate ratio of oxygen increases.

7. The method for manufacturing a semiconductor device according to claim 6, wherein a switching charge is employed as the ferroelectric characteristic.

8. The method for manufacturing a semiconductor device according to claim 1, wherein the first annealing is carried out on the first conductive metal oxide film with a substrate temperature between 650° C. and 800° C. inclusive.

9. The method for manufacturing a semiconductor device according to claim 1, wherein any one of an oxygen gas, an ozone gas, and a nitrogen dioxide gas is used as the oxidizing gas upon carrying out the first annealing.

10. The method for manufacturing a semiconductor device according to claim 1, further comprising: crystallizing the ferroelectric film by carrying out a second annealing on the ferroelectric film before forming the first conductive metal oxide film,
    wherein
    the second annealing is carried out by atmospheric-pressure RTA,
    a lower limit of a substrate temperature during the atmospheric-pressure RTA is a crystallization temperature of the ferroelectric film, and
    an upper limit of the substrate temperature is a temperature higher than the crystallization temperature by 60° C.

11. The method for manufacturing a semiconductor device according to claim 1, wherein at least one of the first and second conductive metal oxide films is formed of an oxide of any one of iridium, ruthenium, rhodium, rhenium, and osmium.

12. The method for manufacturing a semiconductor device according to claim 1, further comprising: forming a conductivity enhancing film on the second conductive metal oxide film.

13. The method for manufacturing a semiconductor device according to claim 12, wherein the conductivity enhancing film is formed of any one of iridium, platinum, ruthenium, rhodium, rhenium, osmium and palladium, or an oxide of any of the above metal.

14. The method for manufacturing a semiconductor device according to claim 1, wherein a conductive oxygen barrier film, an amorphous conductive film and a self-oriented conductive film are formed in this order as the first conductive film.

15. The method for manufacturing a semiconductor device according to claim 1, further comprising:
    forming a first impurity diffusion region in the semiconductor substrate;
    forming a first hole in the first interlayer insulating film; and
    forming a first conductive plug, which is electrically connected to the first impurity diffusion region, inside the first hole, wherein,
    upon forming the first conductive film, the first conductive film is formed on the first conductive plug, and
    upon forming the capacitor, the capacitor is formed on the first conductive plug.

16. The method for manufacturing a semiconductor device according to claim 15, further comprising:
    forming a base insulating film on the first interlayer insulating film and on the first conductive plug;

forming a second hole in the base insulating film on the first conductive plug;

forming a second conductive plug, which is electrically connected to the first conductive plug, in the second hole;

forming a planarization conductive film on both of the second conductive plug and the base insulating film; and planarizing the planarization conductive film, wherein, upon forming the first conductive film, the first conductive film is formed on the planarized planarization conductive film.

17. The method for manufacturing a semiconductor device according to claim 16, wherein, upon planarizing the planarization conductive film, the planarization conductive film is left only on the second conductive plug by polishing the planarization conductive film.

18. The method for manufacturing a semiconductor device according to claim 15, further comprising:

forming a second impurity diffusion region in the semiconductor substrate;

forming a second interlayer insulating film covering the capacitor;

forming a third hole in the first and second interlayer insulating films above the second impurity diffusion region; and forming, inside the third hole, a third conductive plug, which is electrically connected to the second impurity diffusion region.

* * * * *